(12) United States Patent
Moriwaka et al.

(10) Patent No.: US 7,935,584 B2
(45) Date of Patent: May 3, 2011

(54) METHOD FOR MANUFACTURING CRYSTALLINE SEMICONDUCTOR DEVICE

(75) Inventors: Tomoaki Moriwaka, Kanagawa (JP); Koichiro Tanaka, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 669 days.

(21) Appl. No.: 11/892,939

(22) Filed: Aug. 28, 2007

(65) Prior Publication Data
US 2008/0171410 A1      Jul. 17, 2008

(30) Foreign Application Priority Data

Aug. 31, 2006   (JP) ................................. 2006-236078

(51) Int. Cl.
     *H01L 21/84* (2006.01)
(52) U.S. Cl. .................. 438/166; 257/70; 257/E21.413
(58) Field of Classification Search .................... 257/70; 438/166
     See application file for complete search history.

(56) References Cited

U.S. PATENT DOCUMENTS

| | | | |
|---|---|---|---|
| 5,313,076 A | 5/1994 | Yamazaki et al. |
| 5,643,826 A | 7/1997 | Ohtani et al. |
| 5,670,793 A | 9/1997 | Miura et al. |
| 5,753,542 A | 5/1998 | Yamazaki et al. |
| 5,899,547 A | 5/1999 | Yamazaki et al. |
| 5,962,869 A | 10/1999 | Yamazaki et al. |
| 6,172,380 B1 | 1/2001 | Noguchi et al. |
| 6,322,625 B2 | 11/2001 | Im |
| 6,358,766 B1 | 3/2002 | Kasahara |
| 6,423,586 B1 | 7/2002 | Yamazaki et al. |
| 6,489,222 B2 | 12/2002 | Yoshimoto |
| 6,535,535 B1 | 3/2003 | Yamazaki et al. |
| 6,545,320 B2 | 4/2003 | Ohtani et al. |
| 6,548,370 B1 | 4/2003 | Kasahara et al. |
| 6,787,807 B2 | 9/2004 | Yamazaki et al. |

(Continued)

FOREIGN PATENT DOCUMENTS

EP      0 651 431 A2     5/1995

(Continued)

OTHER PUBLICATIONS

Ohashi, et al., TFTp5-4:, "Crystalline Orientation of Large-Grain Poly-Si Thin Films Observed by Raman Spectroscopy", AM-LCD '04:, International Workshop Active-Matrix Liquid-Crystal Displays, Issued Aug. 25, 2004, pp. 269-272.

(Continued)

*Primary Examiner* — Steven J Fulk
(74) *Attorney, Agent, or Firm* — Nixon Peabody LLP; Jeffrey L. Costellia

(57) ABSTRACT

There is provided a method for manufacturing a crystalline semiconductor film. An insulating film is formed over a substrate; an amorphous semiconductor film is formed over the insulating film; a cap film is formed over the amorphous semiconductor film; the amorphous semiconductor film is scanned and irradiated with a continuous wave laser beam or a laser beam with a repetition rate of greater than or equal to 10 MHz, through the cap film; and the amorphous semiconductor film is melted and crystallized At this time, an energy distribution in a length direction and a width direction in a laser beam spot is a Gaussian distribution, and the amorphous semiconductor film is scanned with the laser beam so as to be irradiated with the laser beam for a period of greater than or equal to 5 microseconds and less than or equal to 100 microseconds per region.

10 Claims, 23 Drawing Sheets

U.S. PATENT DOCUMENTS

| | | | |
|---|---|---|---|
| 6,797,550 | B2 | 9/2004 | Kokubo et al. |
| 6,808,969 | B2 | 10/2004 | Yamazaki et al. |
| 6,881,615 | B2 | 4/2005 | Yamazaki et al. |
| 6,908,797 | B2 | 6/2005 | Takano |
| 7,022,183 | B2 | 4/2006 | Takeda et al. |
| 7,078,321 | B2 | 7/2006 | Yoshimoto |
| 7,112,517 | B2 | 9/2006 | Tanaka et al. |
| 7,113,527 | B2 | 9/2006 | Tanaka |
| 7,125,761 | B2 | 10/2006 | Tanaka |
| 7,217,605 | B2 | 5/2007 | Kawasaki et al. |
| 7,220,627 | B2 | 5/2007 | Yamazaki et al. |
| 7,319,055 | B2 | 1/2008 | Kokubo et al. |
| 7,384,810 | B2 | 6/2008 | Tai et al. |
| 7,397,831 | B2 | 7/2008 | Hongo et al. |
| 2002/0052069 | A1* | 5/2002 | Jiroku et al. ............... 438/166 |
| 2003/0085720 | A1 | 5/2003 | Yamazaki et al. |
| 2003/0100169 | A1 | 5/2003 | Tanaka et al. |
| 2004/0038438 | A1* | 2/2004 | Shih et al. .................. 438/30 |
| 2004/0069751 | A1 | 4/2004 | Yamazaki et al. |
| 2004/0119955 | A1 | 6/2004 | Tanaka |
| 2004/0136416 | A1 | 7/2004 | Tanaka |
| 2004/0169023 | A1 | 9/2004 | Tanaka |
| 2004/0195222 | A1 | 10/2004 | Tanaka et al. |
| 2004/0209410 | A1 | 10/2004 | Tanaka |
| 2004/0253838 | A1 | 12/2004 | Yamazaki et al. |
| 2005/0003591 | A1 | 1/2005 | Takaoka et al. |
| 2005/0036190 | A1 | 2/2005 | Tanaka |
| 2005/0037552 | A1 | 2/2005 | Yamazaki et al. |
| 2005/0037553 | A1 | 2/2005 | Tanaka |
| 2005/0115930 | A1 | 6/2005 | Tanaka et al. |
| 2005/0139786 | A1 | 6/2005 | Tanaka et al. |
| 2005/0202602 | A1 | 9/2005 | Asami et al. |
| 2006/0003478 | A1 | 1/2006 | Hongo et al. |
| 2006/0118036 | A1 | 6/2006 | Takeda et al. |
| 2006/0246693 | A1 | 11/2006 | Tanaka et al. |
| 2007/0070319 | A1 | 3/2007 | Nakamura et al. |
| 2007/0087488 | A1 | 4/2007 | Moriwaka |
| 2007/0148936 | A1 | 6/2007 | Ohnuma |
| 2007/0222038 | A1 | 9/2007 | Moriwaka |
| 2007/0264836 | A1 | 11/2007 | Chen et al. |
| 2008/0210945 | A1 | 9/2008 | Miyairi |
| 2008/0318398 | A1 | 12/2008 | Moriwaka et al. |

FOREIGN PATENT DOCUMENTS

| | | |
|---|---|---|
| JP | 05-299339 | 11/1993 |
| JP | 07-135174 | 5/1995 |
| JP | 11-145056 | 5/1999 |
| JP | 2004-179195 | 6/2004 |
| JP | 2004-327677 | 11/2004 |
| JP | 2005-191546 | 7/2005 |
| JP | 2006-310445 | 11/2006 |

OTHER PUBLICATIONS

Sotani et al., "Crystallization of Amorphous Si Films Using Indirect Heating by High Power CW-YAG Laser-Zone Melting for Film (III)", Extended Abstracts from the 50$^{th}$ Meeting of the Japan Society of Applied Physics and Related Societies, Issued Mar. 27, 2003, No. 2, pp. 925. (Full Translation).

* cited by examiner

FIG. 4A Observation Surface A
FIG. 4B Observation Surface B
FIG. 4C Observation Surface C
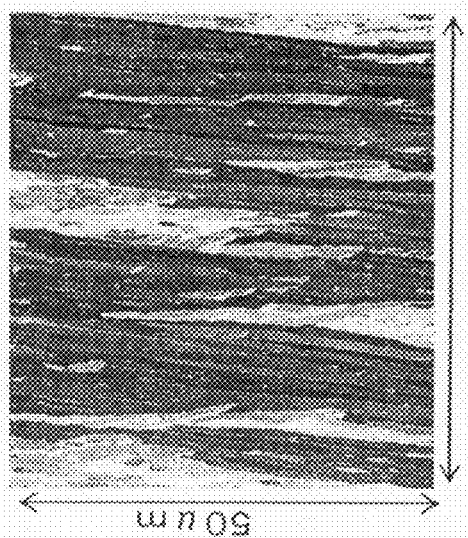
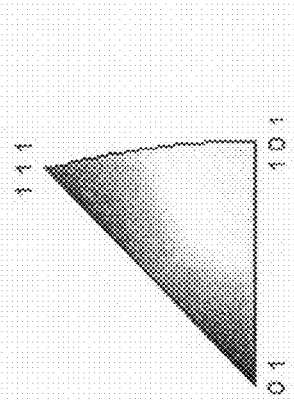
FIG. 4D Silicon

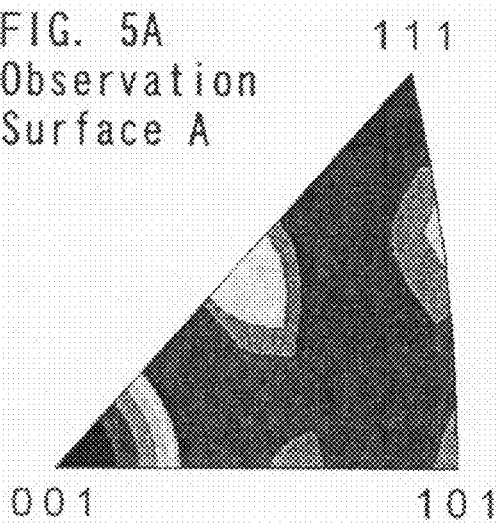
FIG. 5A Observation Surface A
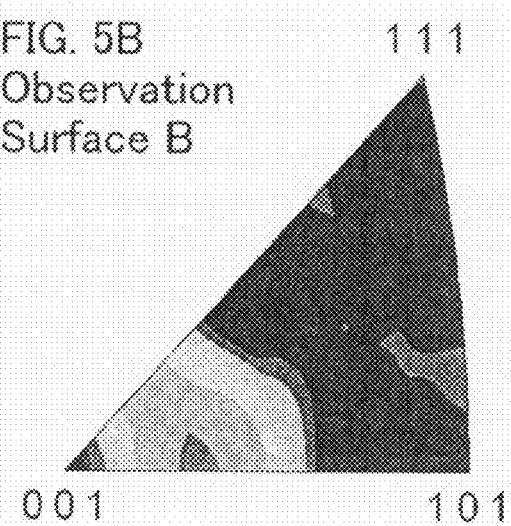
FIG. 5B Observation Surface B
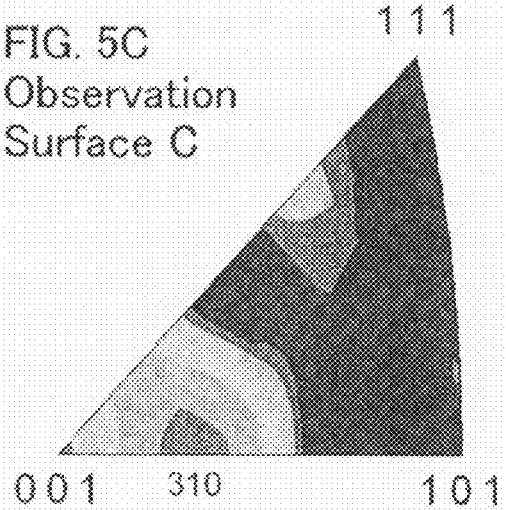
FIG. 5C Observation Surface C
FIG. 5D
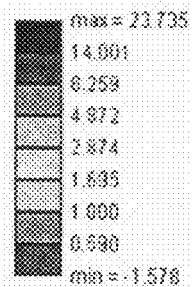

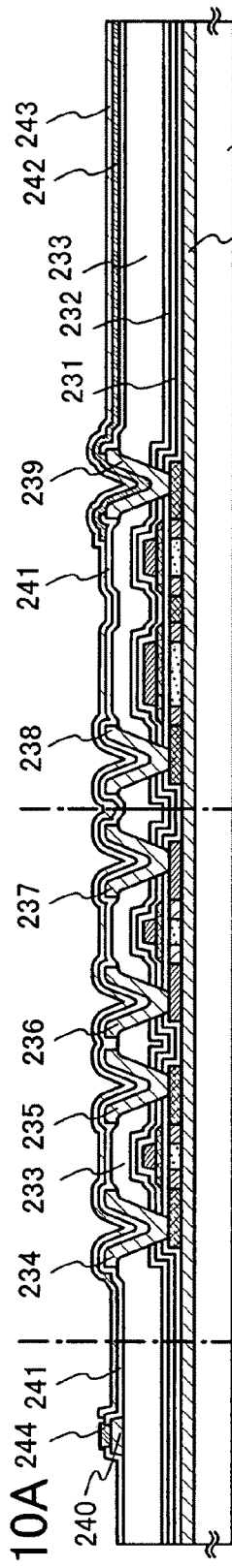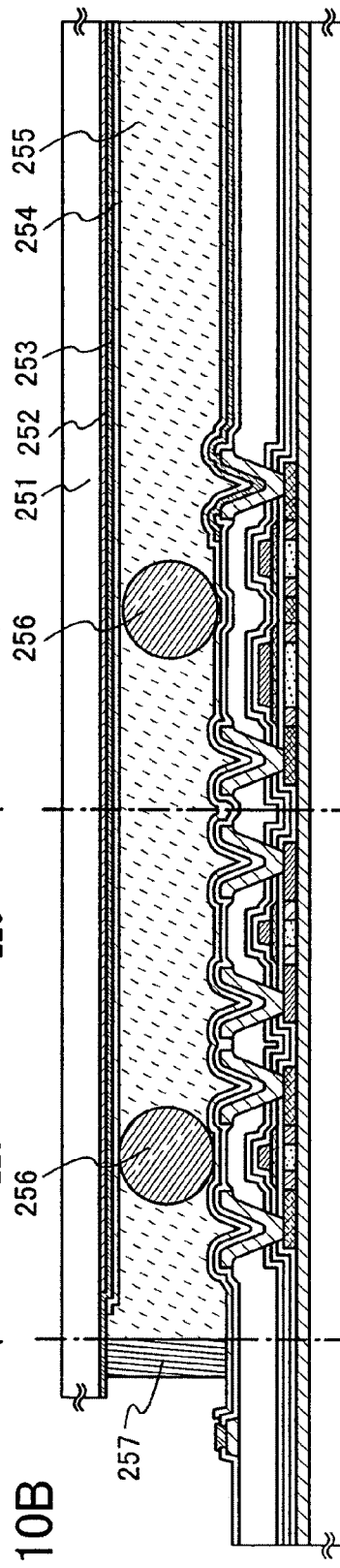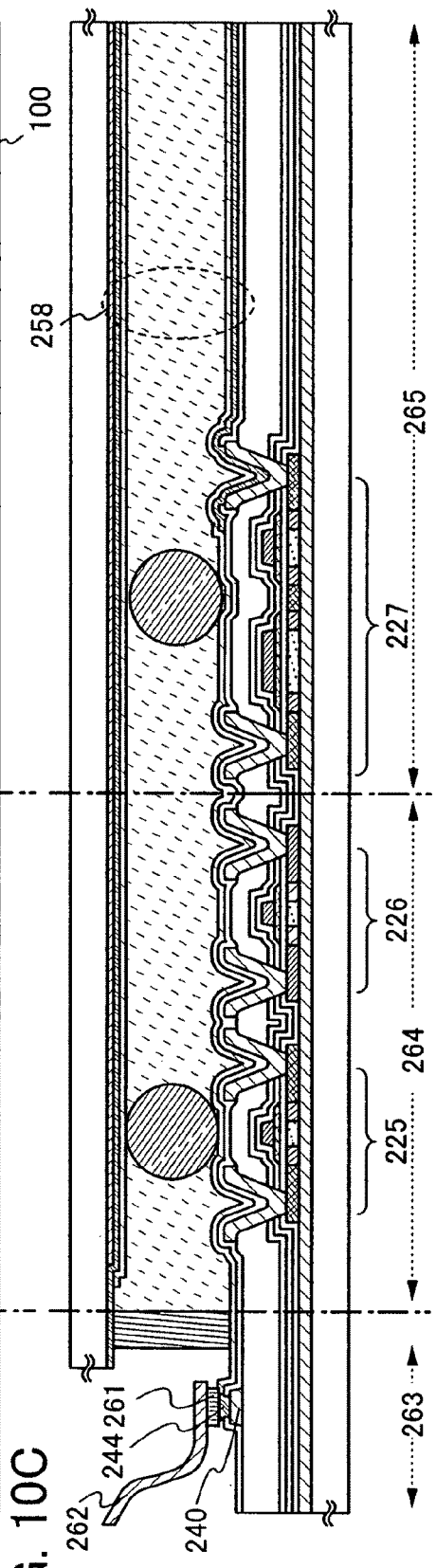

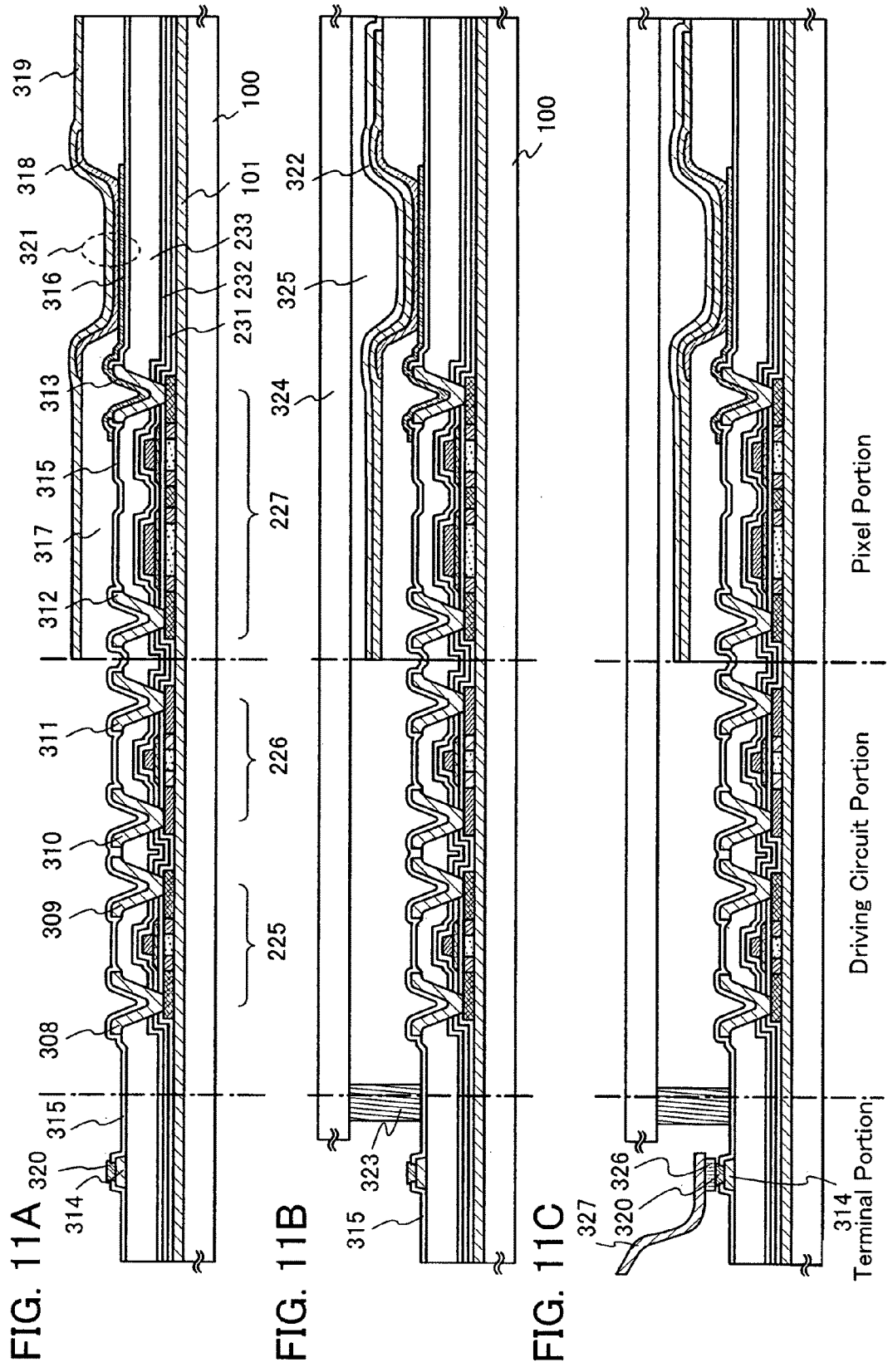

US 7,935,584 B2

METHOD FOR MANUFACTURING CRYSTALLINE SEMICONDUCTOR DEVICE

BACKGROUND OF THE INVENTION

1. Field of the Invention

The present invention relates to a method for manufacturing a semiconductor film having a crystal structure by using a laser crystallization technique and a semiconductor device such as a thin film transistor (hereinafter, TFT) including the semiconductor film. More specifically, the present invention relates to a method for manufacturing a crystalline semiconductor film having a crystal grain whose width is controlled, and a semiconductor device including the crystalline semiconductor film.

2. Description of the Related Art

In recent years, a laser crystallization technique of irradiating an amorphous semiconductor film formed over a glass substrate with a laser beam to form a semiconductor film having a crystal structure (hereinafter referred to as a crystalline semiconductor film) has been widely researched, and a large number of suggestions are given.

Since a crystalline semiconductor film has higher mobility than an amorphous semiconductor film, the crystalline semiconductor film is utilized for TFTs. Consequently, TFTs using the crystalline semiconductor film are used for an active matrix type liquid crystal display device, organic EL display device, and the like in which, over a glass substrate, TFTs are formed for a pixel portion or for a pixel portion and a driver circuit.

As a crystallization method, other than laser crystallization, there are a thermal annealing method using an annealing furnace and a rapid thermal annealing (RTA) method. However, when the laser crystallization is used, heat is absorbed only by the semiconductor film and crystallization can be performed without increasing temperature of the substrate too much. Therefore, a substance such as glass, plastic, or the like that has a low melting point can be used as the substrate. As a result, a glass substrate which is inexpensive and is easily processed even in a large area can be used; thus, production efficiency can be drastically improved by the laser crystallization.

Attention has been focused on excellent characteristics of such a crystallization method and a semiconductor film has been tried to be manufactured by laser crystallization. Consequently, the development of many techniques has succeeded. Among the successful techniques, there is a technique of obtaining a crystalline semiconductor film having excellent semiconductor characteristics, particularly high mobility, by the steps of irradiating an amorphous semiconductor film in which the concentration of oxygen, nitrogen, and carbon is reduced with a laser beam and subjecting the amorphous semiconductor film to a melting step and a recrystallization step (Patent Document 1: Japanese Published Patent Application No. H5-299339). In this technique, it is suggested that in laser beam irradiation, a protective film is preferably formed over the amorphous semiconductor film, and by the placement of the protective film, an impurity can be prevented from mixing into the semiconductor film.

SUMMARY OF THE INVENTION

It is an object of the present invention to provide a method for manufacturing a crystalline semiconductor film having a crystal grain whose width can be controlled, and further, a method for manufacturing a crystalline semiconductor film which has a specific crystal structure and a crystal grain whose width can be controlled. In addition, it is another object of the present invention to provide a method for manufacturing a semiconductor device having excellent electric characteristics and fewer variations in electric characteristics among semiconductor elements.

As described above, the present invention provides a method for manufacturing a crystalline semiconductor film and a semiconductor device. In the method for manufacturing a crystallize semiconductor film, an insulating film is formed over a substrate; an amorphous semiconductor film is formed over the insulating film; a cap film is formed over the amorphous semiconductor film; the amorphous semiconductor film is scanned and irradiated with a continuous wave laser beam or a laser beam with a repetition rate of greater than or equal to 10 MHz, which is transmitted through the cap film; and the amorphous semiconductor film is melted and crystallized. At this time, an energy distribution in a length direction and a width direction in a laser beam spot of the laser beam is a Gaussian distribution, and the amorphous semiconductor film is scanned with the laser beam so as to be irradiated with the laser beam for a period of greater than or equal to 5 microseconds and less than or equal to 100 microseconds per region.

A part of the energy of the laser beam is higher than energy that melts the amorphous semiconductor film. The thickness of the amorphous semiconductor film is greater than or equal to 30 nm and less than or equal to 200 nm. The interval between crystal boundaries in the crystalline semiconductor film is greater than or equal to 0.5 µm and less than or equal to 10 µm, preferably greater than or equal to 1 µm and less than or equal to 5 µm. The cap film may be a silicon nitride film containing oxygen at 0.1 atomic % to 10 atomic % and having a composition ratio of nitrogen to silicon of greater than or equal to 1.3 and less than or equal to 1.5. Further, the amorphous semiconductor film may be an amorphous silicon film.

With the above structure, a crystalline semiconductor film having a crystal grain with a width of greater than or equal to 0.5 µm and less than or equal to 10 µm, preferably greater than or equal to 1 µm and less than or equal to 5 µm can be manufactured. Further, a crystalline semiconductor film can be manufactured, in which crystal surface orientations at three surfaces perpendicular to one another are aligned with a certain ratio or more and which has a crystal grain with a width of greater than or equal to 0.5 µm and less than or equal to 10 µm, preferably greater than or equal to 1 µm and less than or equal to 5 µm.

Note that when a silicon nitride film containing oxygen at 0.1 atomic % to 10 atomic % and having a composition ratio of nitrogen to silicon of greater than or equal to 1.3 and less than or equal to 1.5 is used as the cap film, the surface orientation of the crystal grain of the crystalline semiconductor film is as follows: at a first surface of the semiconductor film, as to a crystal surface orientation, an orientation of <001> is greater than or equal to 60% and less than or equal to 90% within an angular deviation range of ±10°. At a second surface of the semiconductor film, an orientation of any one of <301>, <401>, <501>, and <601> is greater than or equal to 60% and less than or equal to 90% within an angular deviation range of ±10°. At a third surface of the semiconductor film, an orientation of any one of <301>, <401>, <501>, and <601> is greater than or equal to 60% and less than or equal to 90% within an angular deviation range of ±10°. At the first surface of the semiconductor film, a first direction is a direction perpendicular to the substrate surface, and the first direction serves as a normal vector. At the second surface of the semiconductor film, a second direction is a direction parallel to the substrate surface and the crystal growth direction of crystal grains, and the second direction serves as a normal vector. At the third surface of the semiconductor film, a third direction is a direction parallel to the substrate surface and perpendicular to the crystal growth direction of crystal grains, and the third direction serves as a normal vector.

Here, the laser beam is moved in a width direction of the laser beam spot. The width of a crystal grain is in a direction which crosses a scanning direction of the laser beam at 90°, that is, the length of a crystal grain in the same direction as the length of the laser beam spot. In other words, it is the length of a crystal grain in a direction crossing a crystal grain boundary at about 90°.

In accordance with the present invention, a crystalline semiconductor film can be formed, which has a large crystal grain whose width is greater than or equal to 0.5 μm and less than or equal to 10 μm, preferably greater than or equal to 1 μm and less than or equal to 5 μm, by crystal growth of a semiconductor film in a predetermined direction through laser beam irradiation. Further, crystal surface orientations at three surfaces perpendicular to one another are aligned with a certain ratio, whereby excellent semiconductor characteristics can be obtained.

Specifically, a crystalline semiconductor film having a crystal grain with a width of greater than or equal to 0.5 μm and less than or equal to 10 μm, preferably greater than or equal to 1 μm and less than or equal to 5 μm can be manufactured. At a first surface of the crystalline semiconductor film, as to a crystal surface orientation, an orientation of <001> is greater than or equal to 60% and less than or equal to 90%, preferably greater than or equal to 70% and less than or equal to 80% within an angular deviation range of ±10°; at a second surface of the crystalline semiconductor film, an orientation of any one of <301>, <401>, <501>, and <601> is greater than or equal to 60% and less than or equal to 90%, preferably greater than or equal to 70% and less than or equal to 80% within an angular deviation range of ±10°; at a third surface of the crystalline semiconductor film, an orientation of any one of <301>, <401>, <501>, and <601> is greater than or equal to 60% and less than or equal to 90%, preferably greater than or equal to 70% and less than or equal to 80% within an angular deviation range of ±10°.

When a semiconductor element is formed using the crystalline semiconductor film, a semiconductor device with excellent characteristics, such as excellent electric characteristics and fewer variations in electric characteristics among adjacent semiconductor elements, can be manufactured. In particular, when a thin film transistor is formed as a semiconductor element, by controlling the position of a semiconductor layer so that crystal grain boundaries and a moving direction of carries are parallel, the position of a crystal grain boundary crossing a channel can be controlled, and a thin film transistor having high electric characteristics such as high field effect mobility can be obtained.

BRIEF DESCRIPTION OF THE DRAWINGS

In the accompanying drawings:

FIGS. 4A to 4D are orientation map images of a crystalline silicon film of an embodiment, which is obtained by EBSP measurement;

FIGS. 5A to 5D are inverse pole figures of a crystalline silicon film of an embodiment, which is obtained by EBSP measurement;

FIGS. 10A to 10C are cross-sectional views explaining a method for manufacturing a semiconductor device of the present invention;

FIGS. 11A to 11C are cross-sectional views explaining a method for manufacturing a semiconductor device of the present invention;

DESCRIPTION OF THE INVENTION

Hereinafter, embodiment modes of the present invention will be described. Note that the present invention can be implemented in various modes, and it is easily understood by those skilled in the art that modes and details thereof can be modified in various ways without departing from the spirit and scope of the present invention. Therefore, the present invention should not be interpreted as being limited to the following description of the embodiment modes.

Embodiment Mode 1

In Embodiment Mode 1, first, a manufacturing process of a crystalline semiconductor film of the present invention will be briefly described with reference to FIGS. 1A to 1D, 2A to 2D, 7, and 8A and 8B. After that, basic matters related to a crystal structure and a crystal structure of the crystalline semiconductor film of the present invention will be specifically described with reference to FIGS. 4A to 4D, 5A to 5D, and 6A to 6C.

Figure 1A:
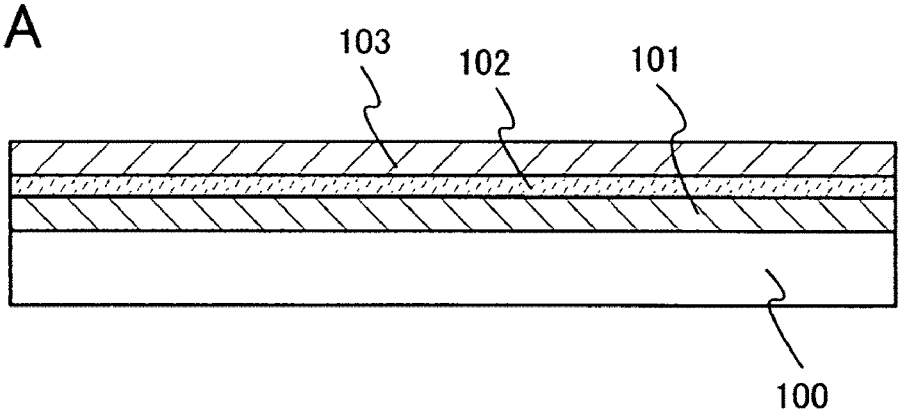
FIGS. 1A to 1D are cross-sectional views explaining a method for manufacturing a semiconductor device of the present invention.

First, for example, a glass substrate having a thickness of 0.7 mm is used as a substrate 100 having an insulating surface as shown in FIG. 1A. On one surface thereof, a silicon nitride film containing oxygen having a thickness of 50 nm to 150 nm and a silicon oxide film containing nitrogen having a thickness of 50 nm to 150 nm are formed as an insulating film 101 functioning as a base film. Further, as a semiconductor film 102, an amorphous semiconductor film is formed by a plasma CVD method over the insulating film 101 to have a thickness of greater than or equal to 20 nm and less than or equal to 200 nm, preferably greater than or equal to 20 nm and less than or equal to 100 nm, more preferably greater than or equal to 20 nm and less than or equal to 80 nm.

As the substrate 100, a glass substrate made of alumino borosilicate glass, barium borosilicate glass, quartz, or the like can be used. Besides, a plastic substrate made of PET (polyethylene terephthalate), PEN (polyethylene naphthalate), PES (polyethersulfone), or polypropylene, or a substrate made of a synthetic resin such as acrylic can be used.

The insulating film 101 functioning as a base film may be provided as needed. When the substrate 100 is a glass substrate, the insulating film 101 prevents an impurity from glass from diffusing into the semiconductor film 102, but when the substrate 100 is a quartz substrate, the insulating film 101 functioning as a base film does not need to be provided. Moreover, a separation layer may be provided between the insulating film 101 and the substrate 100 to separate a semiconductor element that will be formed later from the substrate 100 after the process.

As for the semiconductor film 102, amorphous silicon is used in this embodiment mode; however, polycrystalline silicon, silicon germanium ($Si_{1-x}Ge_x$ ($0<x<0.1$)), or silicon carbide (SiC) in which a single crystal has a diamond structure can also be used.

This embodiment mode shows an example in which the semiconductor film 102 is formed of amorphous silicon, but polycrystalline silicon may also be used. For example, polycrystalline silicon can be formed as follows: an amorphous silicon film is deposited, a slight amount of an element such as nickel, palladium, germanium, iron, cobalt, platinum, or gold is added to the amorphous silicon film, and heat treatment is performed on the amorphous silicon film at 550° C. for 4 hours.

In addition, after the semiconductor film 102 is formed, it may be heated in an electrical furnace at 500° C. for 1 hour. In this heat treatment, the amorphous silicon film is dehydrogenated. Note that the reason for dehydrogenation is to prevent a hydrogen gas from jetting out from the semiconductor film 102 when it is irradiated with a laser beam, and this heat treatment may be omitted if the amount of hydrogen contained in the semiconductor film 102 is small.

Next, a cap film 103 having a thickness of greater than or equal to 200 nm and less than or equal to 1000 nm is formed over the semiconductor film 102. The cap film 103 is preferably formed to have a thickness of greater than or equal to 200 nm and less than or equal to 1000 nm, because, if the cap film 103 is too thin, it will become difficult to control a crystal surface orientation of a crystalline semiconductor film that will be formed later. In addition, it is preferable that the cap film 103 have sufficient transmissivity with respect to a wavelength of a laser beam and thermal values such as a thermal expansion coefficient and a value such as ductility that are similar to those of the adjacent semiconductor film. Further, it is preferable that the cap film 103 be a hard and dense film like a gate insulating film of a thin film transistor that will be formed later. Such a hard and dense film can be formed by, for example, reducing the deposition rate. The deposition rate may be greater than or equal to 1 nm/min and less than or equal to 400 nm/min, preferably greater than or equal to 1 nm/min and less than or equal to 100 nm/min.

Note that when much hydrogen is contained in the cap film, heat treatment is performed for dehydrogenation in a similar manner to the semiconductor film 102.

The cap film 103 can be formed of a single layer structure of a silicon nitride film, a silicon oxide film containing nitrogen, a silicon nitride film containing oxygen, or the like. In addition, a cap film in which a silicon oxide film containing nitrogen and a silicon nitride film containing oxygen are sequentially stacked, or a cap film in which a silicon nitride film containing oxygen and a silicon oxide film containing nitrogen are sequentially stacked can be used. Further, a plurality of films may be stacked as a cap film, and an interference effect of light due to a thin film may be utilized, so that light-absorption efficiency of the semiconductor film 102 can be enhanced. With the use of the cap film having such a structure, the semiconductor film 102 can be crystallized with a laser beam with low energy; thus, the cost can be reduced.

Here, as the cap film 103, a silicon nitride film is formed, which has a thickness of greater than or equal to 200 nm and less than or equal to 1000 nm, contains oxygen at 0.1 atomic % to 10 atomic %, and has a composition ratio of nitrogen to silicon of greater than or equal to 1.3 and less than or equal to 1.5.

In this embodiment mode, as the cap film 103, a silicon nitride film containing oxygen having a thickness of 300 nm is formed by a plasma CVD method with monosilane, ammonium, and nitrous oxide as a reaction gas. Note that nitrous oxide is used as oxidizer, and instead of nitrous oxide, oxygen which has an oxidizing effect may also be used.

The following shows a relation between irradiation time of a laser beam and the width of a crystal grain that is formed when the semiconductor film is irradiated with a continuous wave laser beam or a pulsed laser beam with a repetition rate of greater than or equal to 10 MHz.

In the crystallization process of the semiconductor film, it is considered that an influence of convection due to a temperature gradient in the semiconductor film or convection generated by a pressure difference such as a surface tension is small, and melting time of the semiconductor film is more closely related to a crystal growth distance than the above factors. Note that the melting time of the semiconductor film is time from the start of melting of the semiconductor film to the completion of solidification thereof.

Figure 8A:
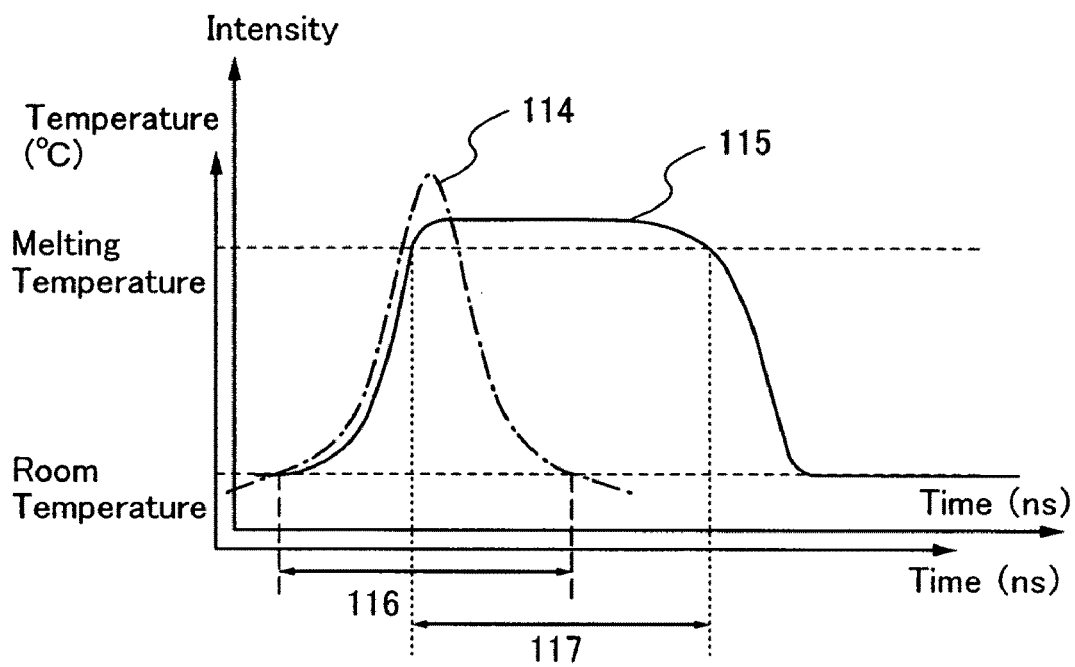
FIGS. 8A and 8B are diagrams explaining temperature of a semiconductor film irradiated with a conventional pulsed laser beam and temperature of a semiconductor film irradiated with a continuous wave laser beam.

In FIG. 8A, a dashed line 114 represents a change of an energy distribution of a pulsed laser beam over time, and a solid line 115 represents a change of temperature of a semiconductor film irradiated with a laser beam over time. As shown in FIG. 8A, when irradiation with a conventional pulsed laser beam is performed, almost all energy of the laser beam is absorbed by the surface of the semiconductor film, and thus, the semiconductor film is heated. Note that the pulse width of a conventional pulsed laser beam used for the crystallization process is as short as about 1 nanosecond to 100 nanoseconds; therefore, the energy of the laser beam with which the semiconductor film is irradiated is absorbed by the surface of the semiconductor film, and the energy becomes heat to heat the semiconductor film rapidly. After that, the heat is transmitted to the semiconductor film and the insulating film 101 functioning as a base film, and thus, the semiconductor film is cooled. Accordingly, the semiconductor film can be heated to greater than or equal to the melting point in a short time. In addition, the temperature of the semiconductor film (solid line 115) is kept at a constant temperature, and then gradually decreased to less than or equal to the melting point of the semiconductor film. In the crystallization using the conventional pulsed laser beam, although melting time 117 of the semiconductor film is longer than a pulse width 116, the melting time 117 of the semiconductor film can approximate to the pulse width 116. In the crystallization process of the semiconductor film using a conventional pulsed excimer laser beam, the pulse width 116 is several tens of nanoseconds to several hundreds of nanoseconds; therefore, the melting time 117 of the semiconductor film can also be several tens of nanoseconds to several hundreds of nanoseconds.

The width of a crystal grain of a crystalline semiconductor film that is formed when the semiconductor film is irradiated with a laser beam having the above pulse width is several tens of nanometers to a hundred and several tens of nanometers. The width of a crystal grain can be regarded as a crystal growth distance. According to an experiment, it is found that the crystal grain becomes larger with the longer pulse width. Given that the melting time of the semiconductor film is in proportion to the crystal growth distance, it can be said that the crystal grain grows by 1 nanometer per nanosecond of irradiation time of a laser beam.

The above proportional relation is applied to the case where the semiconductor film is irradiated with a continuous wave laser beam or a pulsed laser beam with a repetition rate of 10 MHz to form a crystalline semiconductor film.

Figure 8B:
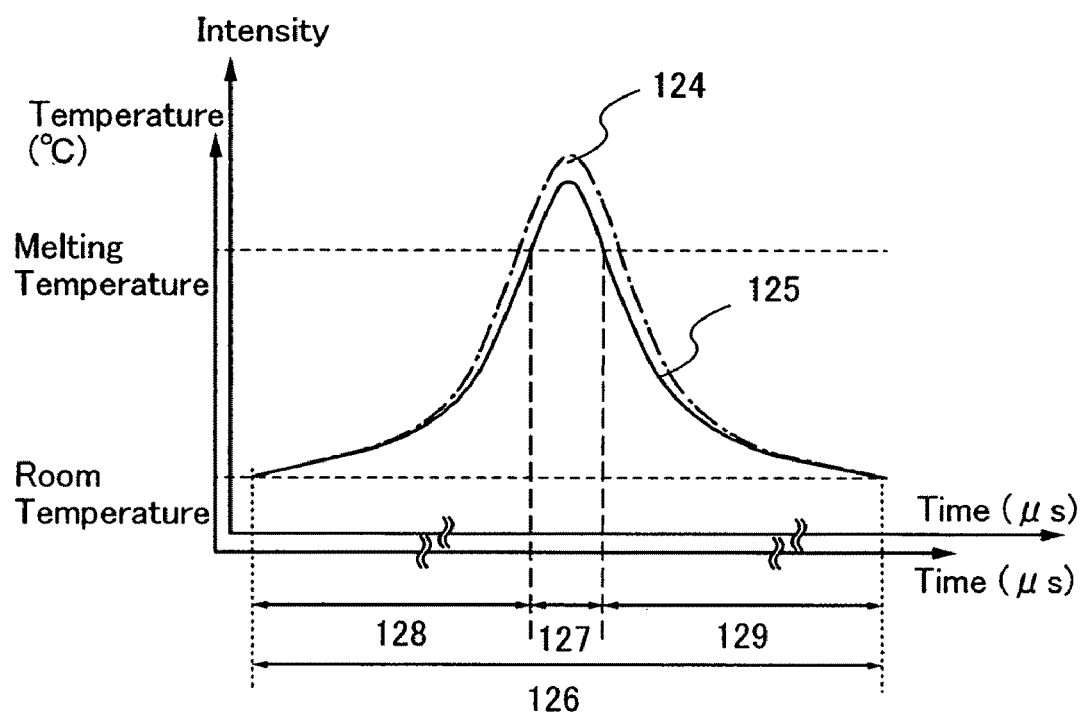

In FIG. 8B, a dashed line 124 represents a change of an energy distribution of a continuous wave laser beam over time, and a solid line 125 represents a change of temperature of a semiconductor film irradiated with a laser beam over time. As shown in FIG. 8B, time 126 during which a certain region of the semiconductor film is irradiated with a continuous wave laser beam is greater than or equal to 5 microseconds and less than or equal to 100 microseconds, preferably greater than or equal to 10 microseconds and less than or equal to 50 microseconds. This can be calculated using the width of a beam spot in a scanning direction of a continuous wave laser beam and the scanning speed. For example, here, the width of a beam spot is to be greater than or equal to 5 μm and less than or equal to 15 μm, and the scanning speed is to be greater than or equal to 300 mm/sec and less than or equal to 700 mm/sec.

Irradiation time of the continuous wave laser beam of the present invention is longer than the irradiation time of the conventional pulsed laser beam, for example, greater than or equal to 5 microseconds and less than or equal to 100 microseconds, preferably greater than or equal to 10 microseconds and less than or equal to 50 microseconds. Therefore, as shown in FIG. 8B, when the semiconductor film is irradiated with a laser beam, the energy of the laser beam becomes heat, and the heat is transmitted to the semiconductor film (the energy that is transmitted to the semiconductor film at this time is E1) and transmitted from the semiconductor film to the insulating film 101 functioning as a base film (the energy at this time is E2). In the case where E1 is larger than E2, the energy distribution (dashed line 124) of the laser beam is increased, and the semiconductor film is heated by the energy of the laser beam. As a result, as shown in FIG. 8B, the temperature (solid line 125) of the semiconductor film is not increased rapidly but increased gradually in a heating period 128.

Next, a period during which the temperature of the semiconductor film is greater than or equal to the melting point is a melting period 127. Then, after the melting period 127 in which the temperature becomes greater than or equal to the melting point of the semiconductor film, the temperature of the semiconductor film is gradually decreased in the case where E2 is larger than E1. This period is referred to as a cooling period 129. Accordingly, even when a certain region of the semiconductor film is irradiated with a laser beam continuously for a period of greater than or equal to 5 microseconds and less than or equal to 100 microseconds, preferably greater than or equal to 10 microsecond and less than or equal to 50 microseconds, the melting period 127 in which the semiconductor film is melted is considered to be substantially about a tenth of time for which a certain region of the semiconductor film is continuously irradiated. In addition, it takes some time until the semiconductor film is melted after laser beam irradiation. Therefore, it is considered that when the semiconductor film is irradiated with a continuous wave laser beam, the semiconductor film is melted continuously for a period of greater than or equal to 0.5 microseconds and less than or equal to 10 microseconds, preferably greater than or equal to 1 microsecond and less than or equal to 5 microseconds in a certain region of the semiconductor film.

A relation between a crystal growth distance and melting time of the semiconductor film at a time when the semiconductor film is irradiated with a conventional pulsed laser beam is applied to a crystal grain that is formed by irradiating the semiconductor film with a continuous wave laser beam. At that time, the crystal growth distance is greater than or equal to 0.5 μm and less than or equal to 10 μm, preferably greater than or equal to 1 μm and less than or equal to 5 μm. That is, in a crystalline semiconductor film in which crystal grains are adjacent, the width of the crystal grain is greater than or equal to 0.5 μm and less than or equal to 10 μm, preferably greater than or equal to 1 μm and less than or equal to 5 μm. It is considered that the crystal growth distance is determined in accordance with the melting time of the semiconductor film at this time; thus, a crystal grain boundary is included even between the adjacent crystal grains with the same surface orientations.

The following will describe the crystal surface orientation and the crystal grain boundaries of the semiconductor film, which is obtained through laser crystallization using the cap film 103.

By providing the cap film 103 over the semiconductor film 102, energy at an interface between the semiconductor film 102 and the cap film 103 is minimized. Accordingly, when the melted semiconductor film 102 is solidified, crystal surface orientations of the semiconductor film can be easily aligned in one direction. Since the crystal growth rate of the semiconductor film is influenced by the crystal surface orientations, the crystal growth rate of the crystals is almost the same when the crystal surface orientations are aligned in one direction. Therefore, the crystal growth time of the crystals is almost the same, and the crystal growth distance of the crystals are almost the same. According to the above, when the cap film is provided over the semiconductor film and laser crystallization is performed, a semiconductor film having a crystal grain with a width of greater than or equal to 0.5 μm and less than or equal to 10 µm, preferably greater than or equal to 1 µm and less than or equal to 5 µm can be formed. Further, a semiconductor film which has a crystal grain with a width of greater than or equal to 0.5 µm and less than or equal to 10 µm, preferably greater than or equal to 1 µm and less than or equal to 5 µm and in which crystal surface orientations are aligned in one direction or can be regarded as being substantially in one direction can be formed. In other words, a semiconductor film having characteristics similar to those of a single crystal can be formed.

Next, a laser oscillator and an optical system for forming a beam spot, which are used for the crystallization of the amorphous semiconductor film by laser beam irradiation, will be described.

Figure 7:
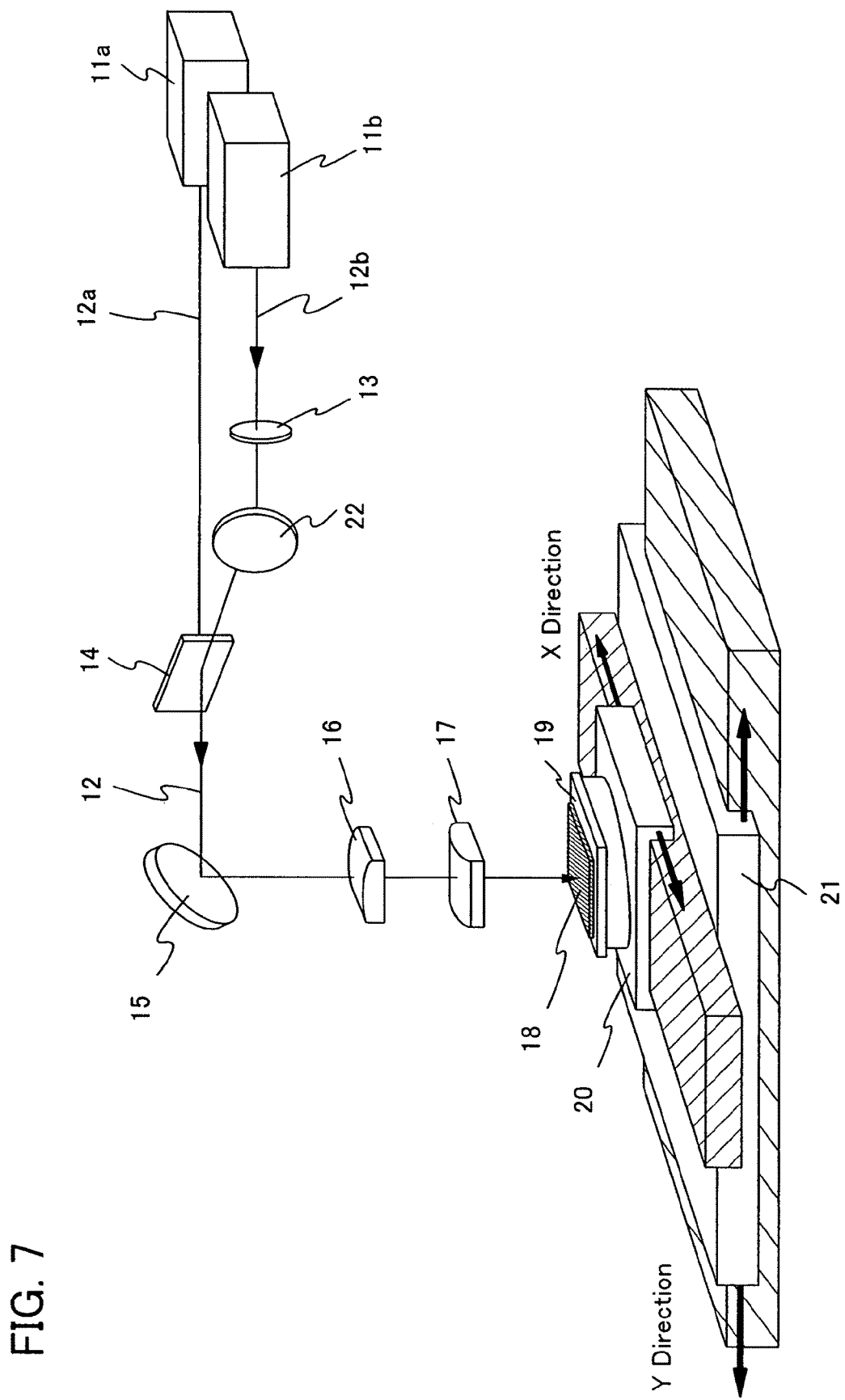
FIG. 7 is a view showing a laser irradiation apparatus which can be applied to the present invention.

As shown in FIG. 7, as each of laser oscillators 11a and 11b, a laser oscillator emitting a laser beam having a wavelength that is absorbed by the semiconductor film 102 by several tens of % or more is used. Typically, the second harmonic or the third harmonic can be used. Here, an LD (Laser Diode) excitation continuous wave laser ($Nd:YVO_4$, the second harmonic (wavelength: 532 nm)) with the maximum total output of 20 W is prepared. It is not necessary to particularly limit the wavelength of the laser beam to the second harmonic; however, the second harmonic is superior to other higher-order harmonics in terms of energy efficiency.

Laser power used in the present invention is within a range which can completely melt the semiconductor film and within a range which can form a crystalline semiconductor film having aligned crystal surface orientations. When laser power that is lower than this range is used, the semiconductor film cannot be completely melted, and a crystalline semiconductor film in which crystal grains are small and crystal surface orientations are not aligned in one direction is formed. On the other hand, when laser power higher than this range is used, many crystal nuclei are generated in the semiconductor film, and from the crystal nuclei, disordered crystal growth is generated, and thus, a crystalline semiconductor film with uneven position, size, and surface orientations of crystal grains is formed.

Figure 1B:
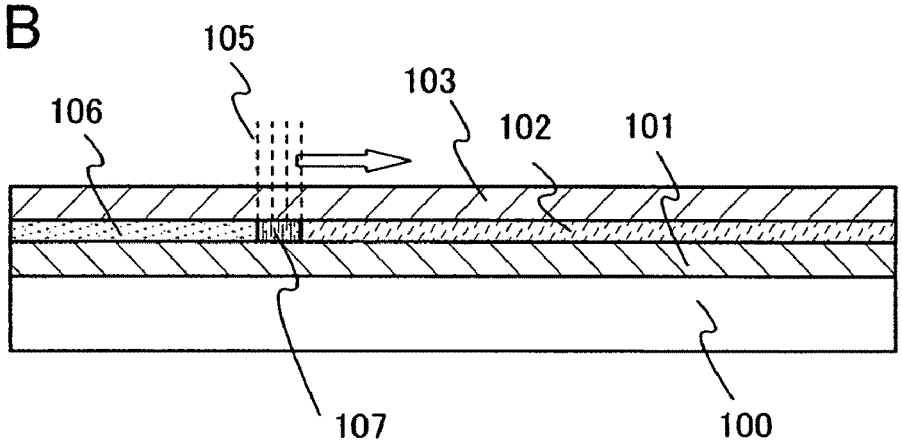
Figure 2A:
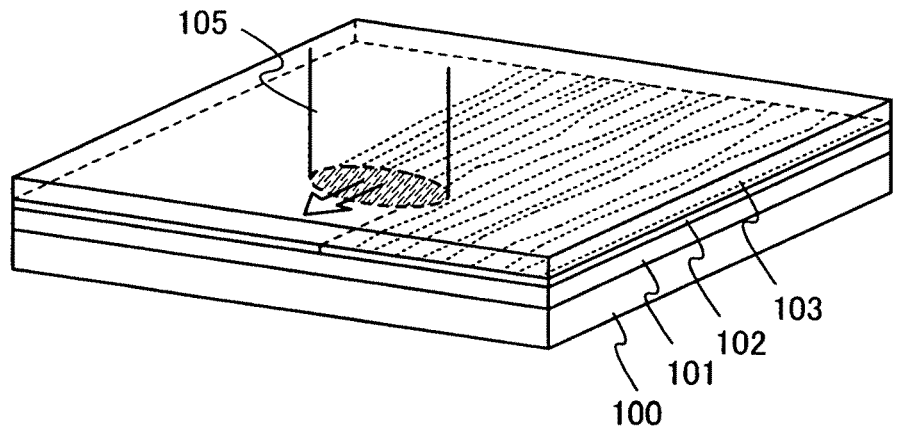
FIGS. 2A to 2D are a top view of a substrate at a time when a semiconductor film is irradiated with a laser beam and perspective views explaining an energy distribution of the laser beam and a semiconductor layer formed using a crystalline semiconductor film.
Figure 2B:
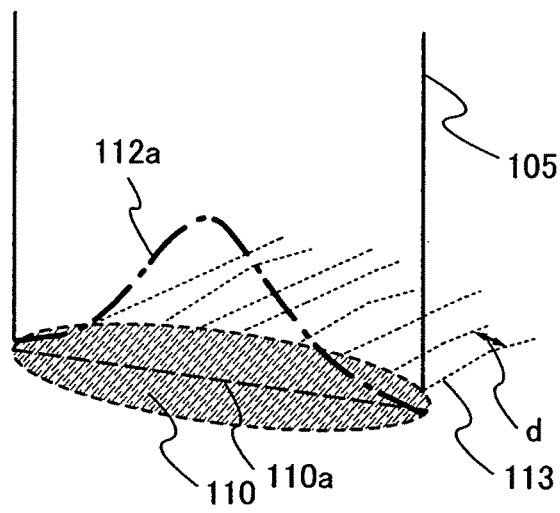
Figure 2C:
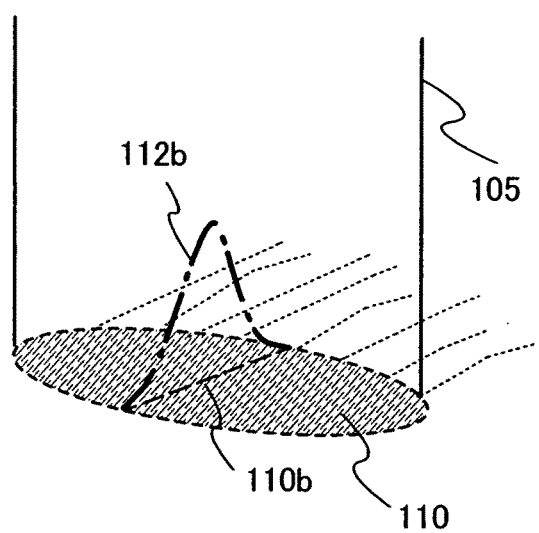

When the semiconductor film 102 is irradiated with the continuous wave laser beam, energy is continuously applied to the semiconductor film 102; therefore, when the semiconductor film is once brought to a melted state, the melted state can be kept. In FIG. 1B, a semiconductor film 107 being irradiated with a laser beam 105 is melted. Further, a solid-liquid interface of the semiconductor film is moved by scanning the semiconductor film with the continuous wave laser beam to grow a crystal grain laterally. In other words, a crystal grain, which is elongated in one direction along the moving direction and has a width of greater than or equal to 0.5 µm and less than or equal to 10 µm, preferably greater than or equal to 1 µm and less than or equal to 5 µm, can be formed. FIG. 2A is a perspective view of FIG. 1B. FIG. 2B is an enlarged view of a region irradiated with the laser beam 105 of FIG. 2A, which illustrate an energy distribution 112a in a length direction 110a of a beam spot 110 of the laser beam. FIG. 2C shows an energy distribution 112b in a width direction 110b of the beam spot 110 of the laser beam. In the semiconductor film which is scanned with a laser beam, a crystal grain 113 that is elongated from the beam spot 110 in the laser scanning direction is formed and its width is greater than or equal to 0.5 µm and less than or equal to 10 µm, preferably greater than or equal to 1 µm and less than or equal to 5 µm.

A solid laser is used at that time because, as compared to a gas laser or the like, its output has high stability and stable process is expected. Note that, without limitation to the continuous wave laser, it is possible to use a pulsed laser with a repetition rate of greater than or equal to 10 MHz.

When a pulsed laser with a high repetition rate is used, the semiconductor film can always be kept melting through the whole thickness, as long as a pulse interval of the laser beam is shorter than time from melting to solidification of the semiconductor film. Thus, a semiconductor film having a crystal grain that is elongated in one direction by the movement of the solid-liquid interface can be formed. In this case, the pulse width of the laser beam is significantly small compared to the melting time of the semiconductor film exceptionally, and laser characteristics are almost the same as those of a continuous wave laser; therefore, the pulsed laser can be treated similarly to the continuous wave laser. In the case of FIG. 7, two laser oscillators are prepared; however, when the output is sufficiently high, one oscillator may be used.

In this embodiment mode, a $Nd:YVO_4$ laser is used for the laser oscillators 11a and 11b; however, other continuous wave lasers and pulsed lasers having a repetition rate of greater than or equal to 10 MHz can also be used. For example, as a gas laser, there is an Ar laser, a Kr laser, a $CO_2$ laser, or the like. As a solid-state laser, there is a YAG laser, a YLF laser, a $YAlO_3$ laser, a $GdVO_4$ laser, a KGW laser, a KYW laser, an alexandrite laser, a Ti: sapphire laser, a $Y_2O_3$ laser, a $Nd:YVO_4$ laser, or the like. A YAG laser, a $Y_2O_3$ laser, a $GdVO_4$ laser, or a $Nd:YVO_4$ laser is also called a ceramic laser. As a metal vapor laser, there is a helium cadmium laser or the like.

In addition, as for the laser oscillators 11a and 11b, the laser beam can be emitted with oscillation of $TEM_{00}$ (a single transverse mode). In such a case, a light-condensing property in a linear beam spot that is obtained on the surface to be irradiated can be increased and an energy density can be increased, which is preferable.

Optical treatment to a laser beam emitted from these laser oscillators will be briefly described as follows. Laser beams 12a and 12b are emitted with the same energy from the laser oscillators 11a and 11b, respectively. A polarization direction of the laser beam 12b emitted from the laser oscillator 11b is changed through a wavelength plate 13 because the two laser beams having polarization directions different from each other are combined at a polarizer 14.

After the laser beam 12b passes through the wavelength plate 13, the laser beam 12b is reflected by a mirror 22 and made to enter the polarizer 14. Then, the laser beam 12a and the laser beam 12b are combined at the polarizer 14 to form a laser beam 12. The wavelength plate 13 and the polarizer 14 are adjusted so that the beam that has been transmitted through the wavelength plate 13 and the polarizer 14 has appropriate energy. Note that, in this embodiment mode, the polarizer 14 is used for combining the laser beams; however, other optical elements such as a polarization beam splitter may also be used.

The laser beam 12 that is synthesized by the polarizer 14 is reflected by a mirror 15, and a cross-section of the laser beam is formed into a linear shape on the surface to be irradiated 18 by a cylindrical lens 16 having a focal length of, for example, 150 mm, and a cylindrical lens 17 having a focal length of, for example, 20 mm. The mirror 15 may be provided depending on an arrangement condition of an optical system of a laser irradiation apparatus.

The cylindrical lens 16 acts in a length direction of the beam spot that is formed on the surface to be irradiated 18, whereas the cylindrical lens 17 acts in a width direction thereof. Accordingly, on the surface to be irradiated 18, a linear beam spot having a length of approximately 500 µm and a width of approximately 20 µm, for example, is formed.

Note that, in this embodiment mode, the cylindrical lenses are used to form the beam spot into a linear shape; however, the present invention is not limited thereto, and other optical elements such as a spherical lens, a cylindrical lens array, a diffractive optical element, and an optical waveguide may also be used. Moreover, the focal lengths of the cylindrical lenses are not limited to the above values and can be appropriately set.

In the present invention, as described above, a ceramic laser can be used. When the ceramic laser is used, a shape of a laser medium can be shaped relatively freely; therefore, the ceramic laser is suitable for forming such a laser beam. Note that the cross-sectional shape of the laser beam that is formed into a linear shape is preferably as narrow as possible in width, which increases an energy density of the laser beam in the semiconductor film; therefore, process time can be shortened.

Then, an irradiation method of the laser beam will be described. Since the surface to be irradiated 18, where the semiconductor film 102 covered with the cap film 103 is formed, is moved at a relatively high speed, the surface to be irradiated 18 is fixed to a suction stage 19. The suction stage 19 can be moved in X and Y directions in a plane parallel to the surface to be irradiated 18 by an X-axis one-axis robot 20 and a Y-axis one-axis robot 21. The one-axis robots are arranged so that the length direction of the linear beam spot corresponds to the Y axis.

Next, the surface to be irradiated 18 is made to move along the width direction of the beam spot, that is, along the X axis, and the surface to be irradiated 18 is irradiated with the laser beam. Here, a scanning speed of the X-axis one-axis robot 20 is 35 cm/sec, and the laser beam having an energy of 7.0 W is emitted from each of the two laser oscillators. The laser output after combining the laser beams is 14 W. Through a process for forming a region where the semiconductor film is completely melted by irradiation with the laser beam, and a process of a solidification, a crystalline semiconductor film of the present invention can be formed, which has a crystal grain with a width of greater than or equal to 0.5 µm and less than or equal to 10 µm, preferably greater than or equal to 1 µm and less than or equal to 5 µm, and in which a crystal is grown in one orientation.

An appropriate scanning speed for the X-axis one-axis robot 20 is approximately several cm/sec to several hundreds of cm/sec. The speed may be determined as appropriate by a worker in accordance with the output of the laser oscillators.

Note that, in this embodiment mode, a method is used, in which the substrate 100 provided with the surface to be irradiated 18 is moved using the X-axis one-axis robot 20 and the Y-axis one-axis robot 21, but the present invention is not limited thereto, and the surface to be irradiated is scanned with the laser beam using an irradiation system moving type, in which the surface to be irradiated 18 is fixed while an irradiation position of the laser beam is moved; a surface to be irradiated moving type, in which the irradiation position of the laser beam is fixed while the surface to be irradiated 18 is moved; or a method in which these two methods are combined.

Note that, as described above, the energy distribution of the beam spot in a length direction, which is formed by the above-described optical system, is a Gaussian distribution. Therefore, small grain crystals are formed at places where the energy density is low, at both ends of the beam spot. Thus, a part of the laser beam may be cut by providing a slit or the like before the surface to be irradiated 18, so that the surface to be irradiated 18 is irradiated only with energy sufficient to control the width of a crystal grain to be greater than or equal to 0.5 µm and less than or equal to 10 µm, preferably greater than or equal to 1 µm and less than or equal to 5 µm. In addition, as for the energy distribution of the beam spot in a length direction, irradiation with a laser beam is performed so that regions with energy distributions which can melt the semiconductor film overlap; thus, a small grain crystal can be prevented from being formed.

Figure 1C:
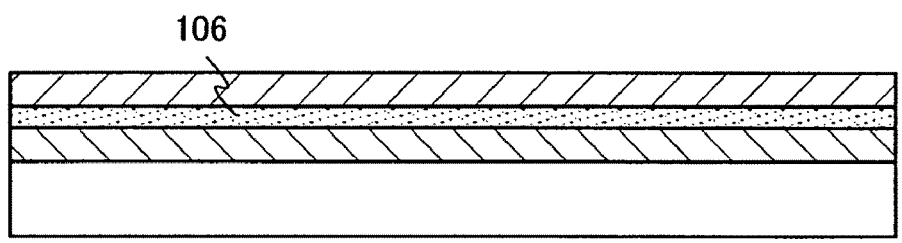

Further, in order to utilize the laser beam emitted from the laser oscillators 11a and 11b more efficiently, the energy in a length direction of the beam spot may be uniformly distributed by using a beam homogenizer such as a lens array or a diffractive optical element. Further, the Y-axis one-axis robot 21 is moved by a distance equal to the width of the crystalline semiconductor film that is formed, and the X-axis one-axis robot 20 is rescanned at a predetermined speed, which is 35 cm/sec here. By repeating a series of such operations, the entire surface of the semiconductor film can be efficiently crystallized (FIG. 1C).

Figure 1D:
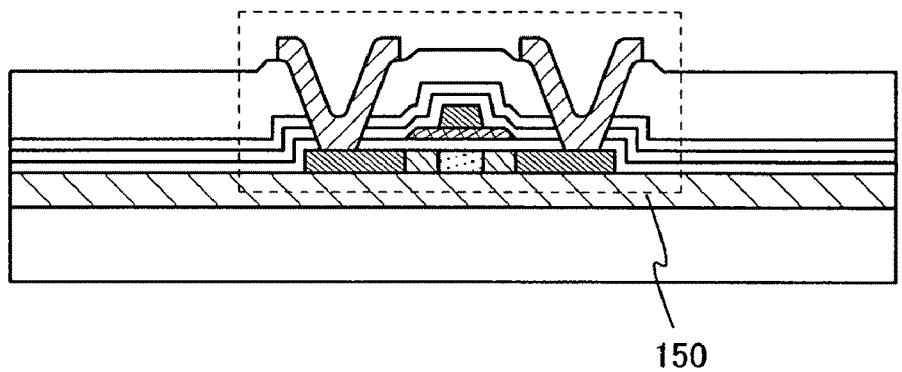
Figure 2D:
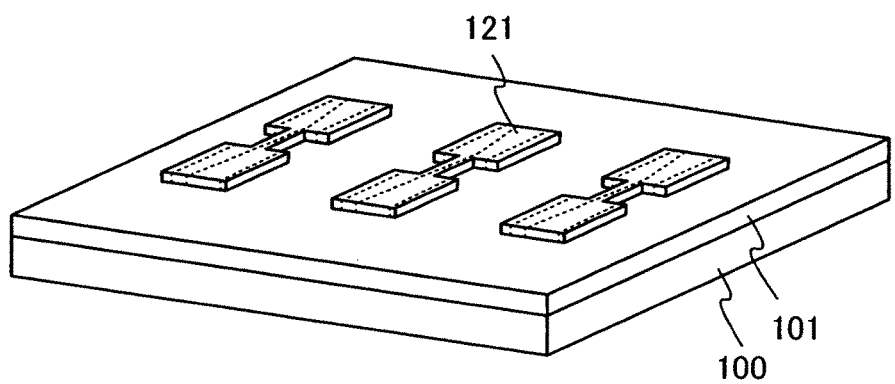

Next, the cap film 103 is removed by etching. Then, a resist is applied to the crystalline semiconductor film, exposed to light, and developed, whereby the resist is formed into a desired shape. Furthermore, etching is performed using the resist that is formed here as a mask, and the crystalline semiconductor film, which is exposed by the development, is removed. Through this process, an island-like semiconductor film 121 is formed over the insulating film 101 as shown in FIG. 2D. By using this island-like semiconductor film, a semiconductor device having a semiconductor element such as a thin film transistor, a diode, a resistor, a capacitor, or a CCD can be manufactured. Here, as shown in FIG. 1D, a thin film transistor 150 is formed as one mode.

Next, a crystal surface orientation of the crystalline semiconductor film manufactured in this embodiment mode will be described.

In this embodiment mode, in order to confirm the position, size, and a surface orientation of a crystal grain of the crystalline semiconductor film from which the cap film has been removed by etching, EBSP (Electron Back Scatter Diffraction Pattern) measurement is performed. First, a basic matter about EBSP will be described, and a result will be described while complementary explanation is being added.

EBSP refers to a method in which an EBSP detector is connected to a scanning electron microscope (SEM), an orientation of a diffraction image (an EBSP image) of each crystal, which is generated when a sample that is highly tilted in the scanning electron microscope is irradiated with a convergent electron beam, is analyzed, and a crystal surface orientation of a sample is measured according to orientation data and position information of a measurement point (x, y).

When an electron beam is incident to a crystalline semiconductor film, inelastic scatterings occur also at the back, and a linear pattern, which is peculiar to a crystal surface orientation by Bragg diffraction, can also be observed in the sample. Here, this linear pattern is generally referred to as a Kikuchi line. In an EBSP method, a crystal surface orientation of a crystalline semiconductor film is obtained by analyzing a Kikuchi line reflected in a detector.

In a sample having a polycrystalline structure, each crystal grain has a different surface orientation. Thus, every time the irradiated position of the crystalline semiconductor film is moved, the sample is irradiated with the electron beam and the crystal surface orientation in each irradiated position is analyzed. In such a manner, the crystal surface orientation or arrangement information of a crystalline semiconductor film having a flat surface can be obtained. As a measurement region is broader, the tendency of the crystal surface orientations of the entire crystalline semiconductor film can be obtained better; and as there are more measurement points, the more information on the crystal surface orientations in the measurement region can be obtained in detail.

However, a surface orientation within a crystal cannot be determined only by a surface orientation measured from one observation surface of the crystal. This is because, even when crystal surface orientations are aligned in one direction only at one observation surface, it cannot be said that the surface orientations are aligned within the crystals unless the surface orientations are aligned at other observation surfaces. Therefore, in order to determine the surface orientation within the crystal, the surface orientations observed from at least two surfaces are needed, and as more information is obtained from more surfaces, the precision gets higher.

Figure 3:
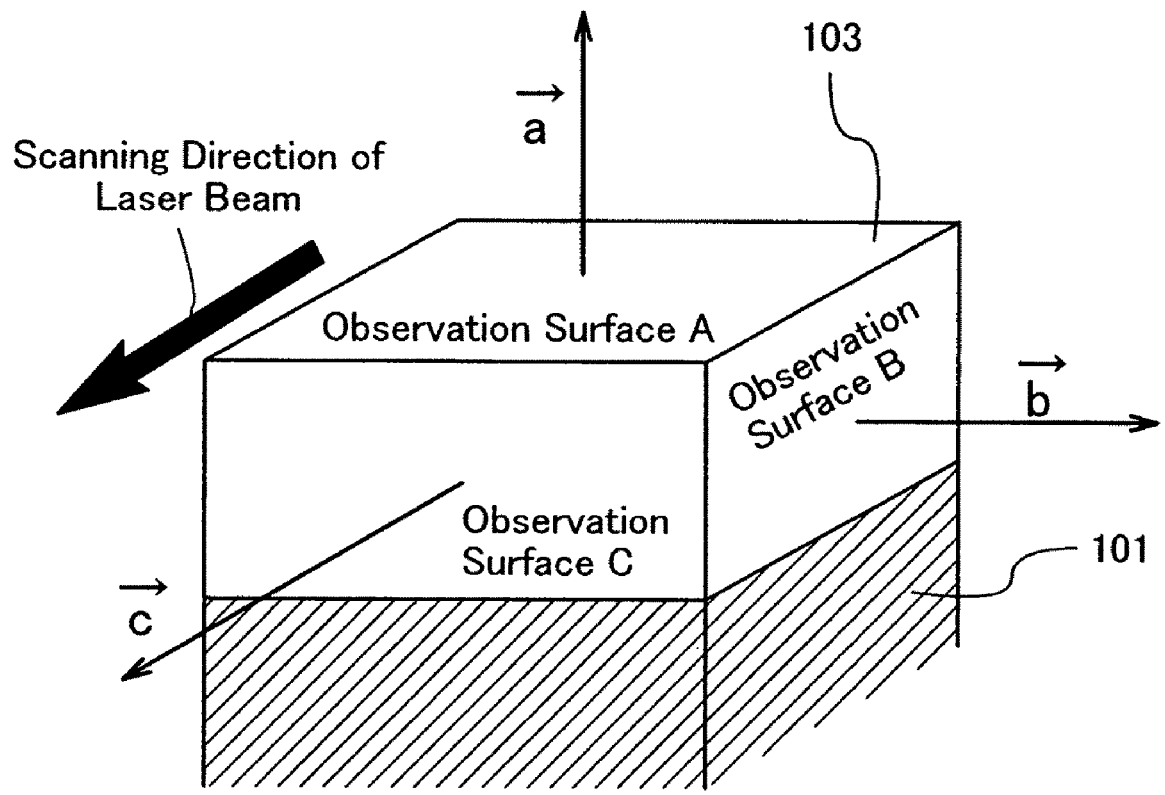
FIG. 3 is a perspective view explaining a crystal surface orientation of a crystalline semiconductor film of the present invention.

Therefore, when a proportion of a specific crystal surface orientation is relatively high and this orientation is the same at three surfaces in the measurement region, a crystal can be approximately regarded as a single crystal. Actually, as shown in FIG. 3, the surface orientation within the crystal can be specified with high precision by putting together pieces of information on three surfaces (an observation surface A, an observation surface B, and an observation surface C) where each of three vectors perpendicular to one another (a vector a, a vector b, and a vector c) is a normal vector.

In the crystalline semiconductor film that is formed in this embodiment mode, the vectors a to c are set as described below. The vector c is parallel to a scanning direction of the laser beam (i.e., a growth direction of a crystal grain) and the substrate surface; the vector a is perpendicular to the substrate surface and the vector c; and the vector b is parallel to the substrate surface, perpendicular to a crystal growth direction of a crystal grain, and perpendicular to the vectors a and c. According to the information from these three observation surfaces A to C, the crystal surface orientation of the crystalline semiconductor film can be specified with high precision.

First, FIGS. 4A to 4D, 5A to 5D, and 6A to 6C each show a result of analyzing the crystal surface orientation (a crystal axis orientation in a direction perpendicular to an observation surface) of the crystalline semiconductor film. The electron beam was incident to the surface of the crystalline semiconductor film formed in this embodiment mode with an incidence angle of 60°, and a crystal surface orientation was measured using the obtained EBSP image. The area of a measurement region is 50 μm×50 μm. In this region, the measurement was performed on lattice points provided in every 0.1 μm crossways. Since the sample surface is measured by an EBSP method, the crystalline semiconductor film was necessary to be the top layer. Therefore, the measurement was performed after the silicon nitride film containing oxygen which is the cap film was etched.

FIG. 4A shows a crystal surface orientation distribution at the observation surface A where the vector a is a normal vector. Similarly, FIG. 4B shows a crystal surface orientation distribution at the observation surface B where the vector b is a normal vector. FIG. 4C shows a crystal surface orientation distribution at the observation surface C where the vector c is a normal vector. FIGS. 4A to 4C are each an orientation map image showing that which crystal surface orientation is indicated at each measurement point. FIG. 4D is a diagram in which each crystal surface orientation is expressed in color-code, and the crystal surface orientations at the measurement points of FIGS. 4A to 4C are shown by the corresponding colors of FIG. 4D.

Note that since FIGS. 4A to 4C are monochrome and the image is only displayed by lightness, distinction is difficult; however, in color display, it is found that an orientation of <001> is dominant at the observation surface A, an orientation of <301> is dominant at the observation surface B, and an orientation of <301> is dominant at the observation surface C. In addition, since the surface orientations of each crystal grain are uniform, pieces of information on the shape, size, or the like of each crystal grain can be roughly obtained based on the color and shape. Moreover, surface orientations of <401>, <501>, and <601> are close to the orientation of <301>; therefore, the surface orientations of <401>, <501>, and <601> are approximately the same as the orientation of <301>.

Here, according to FIGS. 4A to 4C, it was found that the crystal grain of the crystalline semiconductor film formed in this embodiment mode includes a domain elongated to have a width of greater than or equal to 1 μm and less than or equal to 5 μm. According to FIGS. 4A to 4C, the length of the domain is 5 μm to 50 μm, and moreover, a domain with a length of greater than or equal to 50 μm was also observed. In addition, the area of a measurement region in FIGS. 4A to 4C is 50 μm×50 μm, but in a larger area, a domain with a length of 5 μm to 100 μm is also found. In addition, according to FIGS. 4A to 4C, it is found that, in the crystalline semiconductor film formed in this embodiment mode, the orientation of <001>, the orientation of <301>, and the orientation of <301> are dominant at the observation surfaces A, B, and C, respectively. When it is found that the crystal surface orientation is mostly controlled by a specific index, a degree of the orientation at the surface can be grasped by obtaining a fraction of crystal grains gathering around the index.

FIGS. 5A to 5C are inverse pole figures illustrating a distribution of fractions of crystal surface orientations at the observation surfaces A to C in FIGS. 4A to 4C, and FIG. 5D is a scale showing fractions of the crystal surface orientations. Although FIGS. 5A to 5C are monochrome and the image is only displayed by lightness, so that distinction is difficult, FIGS. 5A to 5C show that in a region close to black, a fraction of crystals having a specific surface orientation is high. According to the inverse pole figure in FIG. 5A, it was found that at the observation surface A, the orientation of <001> is the closest to black, and specifically, a proportion of the orientation of <001> is 14.0 times or more as high as that in the case where all orientations are provided with the same ratio.

In addition, according to the inverse pole figure in FIG. 5B, it was confirmed that at the observation surface B, the orientation of <301> is the closest to black, and specifically, a proportion of the orientation of <301> is 4.8 times or more as high as that in the case where all orientations are provided with the same ratio. Moreover, according to the inverse pole figure in FIG. 5C, it was found that at the observation surface C, the orientation of <301> is the closest to black, and specifically, a proportion of the orientation of <301> is 4.8 times or more as high as that in the case where all orientations are provided with the same ratio.

Figure 6A:
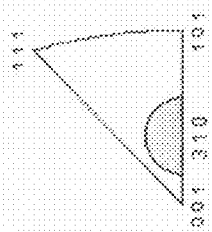
FIGS. 6A to 6C are diagrams each showing a fraction of a crystal surface orientation of a crystalline silicon film of an embodiment, which is obtained by the inverse pole figures.
Figure 6B:
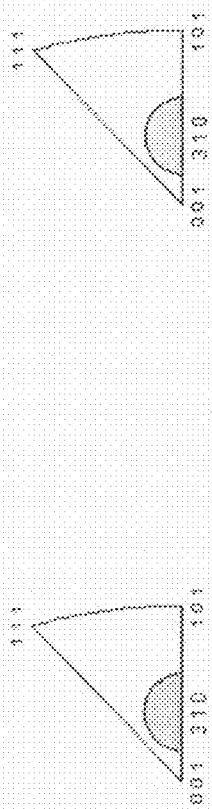
Figure 6C:
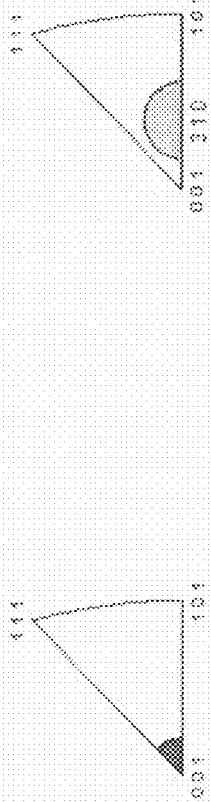

Fractions of crystal surface orientations with a high proportion in the inverse pole figures of FIGS. 5A to 5C were calculated, and the results are shown in FIGS. 6A to 6C. FIG. 6A shows a result obtained by calculating a fraction of the surface orientation at the observation surface A, and the fraction was obtained as follows: in the inverse pole figure in FIG. 5A, the angular deviation range of the orientation of <001> is set within ±10°, and a proportion of the number of the measurement points, where the angular deviation of the orientation <001> exists within ±10° with respect to all measurement points, was obtained. Note that a colored region in FIG. 6A shows a region which is a crystal with the orientation of <001> within the angular deviation range of ±10°.

In addition, a value of a proportion of the points having any orientation with respect to all measuring points is a value of Partition Fraction. Further, among the points having any orientation, a value of a proportion of the points having a specific orientation with respect to all measuring points is a value of Total Fraction. According to this result, at the observation surface A of the crystalline semiconductor film formed in this embodiment mode, the orientation of <001> occupies 71.2% within the angular deviation range of ±10°. Note that, as for the crystal surface orientation, groups with equivalent surface orientations like [100], [010], [001], and the crystal orientation in which 1 in [100], [010], and [001] is −1, are collectively referred to as <001>.

FIGS. 6B and 6C are results obtained by calculating a fraction of the surface orientation at the observation surfaces B and C according to FIGS. 5B and 5C in a similar manner to FIG. 6A. Note that the colored region in each of FIGS. 6B and 6C is a region showing a crystal where the angular deviation range of the orientation of <301> is within ±10°, and at the observation surface B of the crystalline semiconductor film formed in this embodiment mode, the orientation of <301> occupies 71.1% within the angular deviation range of ±10°.

At the observation surface C of the crystalline semiconductor film formed in this embodiment mode, the orientation of <301> occupies 73.9% within the angular deviation range of ±10°. Note that, as for the crystal surface orientation, groups with equivalent orientations like [310], [301], [013], and the crystal surface orientation in which one or both of 1 and 3 in [310], [301], and [013] are a negative value, are collectively referred to as <301>. In addition, at the observation surfaces B and C, a fraction of the orientation of <301> is shown; however, the fraction of the orientation <401>, <501>, or <601> close to the orientation <301> may also be shown.

As described above, the crystal surface orientations are aligned in one direction with a high proportion at each of the three observation surfaces. In other words, it is found that a crystal, where it can be regarded that the crystal surface orientations are aligned in one direction, is formed in a crystallized region. In such a manner, it was confirmed that a crystal, where a specific crystal surface orientation occupies an extremely high proportion in a region having one side of several tens of μm, is formed over a glass substrate.

Note that EBSP measurement can be performed in a channel region of a thin film transistor, for example. In other words, EBSP measurement can be performed in a semiconductor layer covered by a gate wiring and a gate insulating film.

According to the above results, when the crystal surface orientation of the crystalline semiconductor film manufactured in this embodiment mode is measured by EBSP, the following results are obtained. At the observation surface A, the orientation of <001> is greater than or equal to 60% and less than or equal to 90%, preferably greater than or equal to 70% and less than or equal to 80% within the angular deviation range of ±10°. At the observation surface B, the orientation of <301> is greater than or equal to 60% and less than or equal to 90%, preferably greater than or equal to 70% and less than or equal to 80% within the angular deviation range of ±10°. At the observation surface C, the orientation of <301> is greater than or equal to 60% and less than or equal to 90%, preferably greater than or equal to 70% and less than or equal to 80% within the angular deviation range of ±10°.

In the crystalline semiconductor film formed in this embodiment mode, the width of the crystal grain is greater than or equal to 0.5 μm and less than or equal to 10 μm, preferably greater than or equal to 1 μm and less than or equal to 5 μm. Further, the crystal surface orientations are aligned in one direction or in directions that can be substantially regarded as one direction. In other words, the crystalline semiconductor film has characteristics similar to those of a single crystal. By using such a semiconductor film, performance of a semiconductor device can be considerably improved. For example, when a TFT is formed using this crystalline semiconductor film, electric field-effect mobility equivalent to that of a semiconductor device using a single crystalline semiconductor can be obtained.

In addition, in such a TFT, it is possible to reduce variations in ON current value (a value of a drain current that flows when a TFT is in an ON state), OFF current value (a value of a drain current that flows when a TFT is in an OFF state), threshold voltage, subthreshold slope factor, and electric field-effect mobility. Since there is such an advantageous effect, electric characteristics of a TFT are improved, and operational characteristics and reliability of a semiconductor device using such a TFT are improved. Thus, a semiconductor device capable of high-speed operation with high current driving capability and fewer variations in performance among a plurality of elements can be manufactured.

Embodiment Mode 2

In this embodiment mode, a liquid crystal display device which is one example of a semiconductor device will be described with reference to FIGS. 9A to 9D, and 10A to 10C.

Figure 9A:
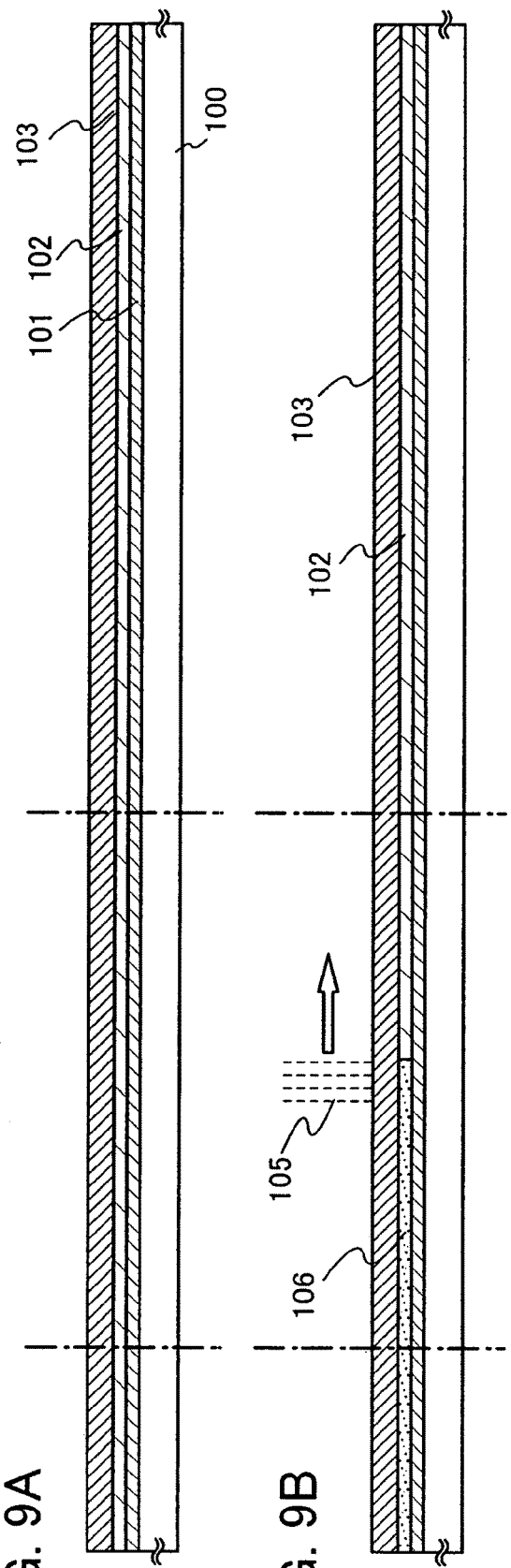
FIGS. 9A to 9D are cross-sectional views explaining a method for manufacturing a semiconductor device of the present invention.

As shown in FIG. 9A, in a similar manner to Embodiment Mode 1, an insulating film 101 functioning as a base film is formed over a substrate 100, a semiconductor film 102 is formed over the insulating film 101, and a cap film 103 is formed over the semiconductor film 102.

Here, as the substrate 100, a glass substrate is used. As the insulating film 101, a silicon nitride film containing oxygen having a thickness of 40 nm to 60 nm and a silicon oxide film containing nitrogen having a thickness of 80 nm to 120 nm are formed by a plasma CVD method. In addition, an amorphous semiconductor film which has a thickness of 20 nm to 80 nm is formed as the semiconductor film 102 by a plasma CVD method. Further, as the cap film 103, a silicon nitride film which has a thickness of greater than or equal to 200 nm and less than or equal to 1000 nm, contains oxygen at 0.1 atomic % to 10 atomic %, and has a composition ratio of nitrogen to silicon of greater than or equal to 1.3 and less than or equal to 1.5 is formed by a plasma CVD method.

Next, the substrate 100 is heated. Here, heating is performed so that hydrogen contained in the amorphous semiconductor film formed over the substrate 100 is removed. Here, the substrate 100 is heated at 500° C. for 1 hour and at 550° C. for 4 hours.

Figure 9B:
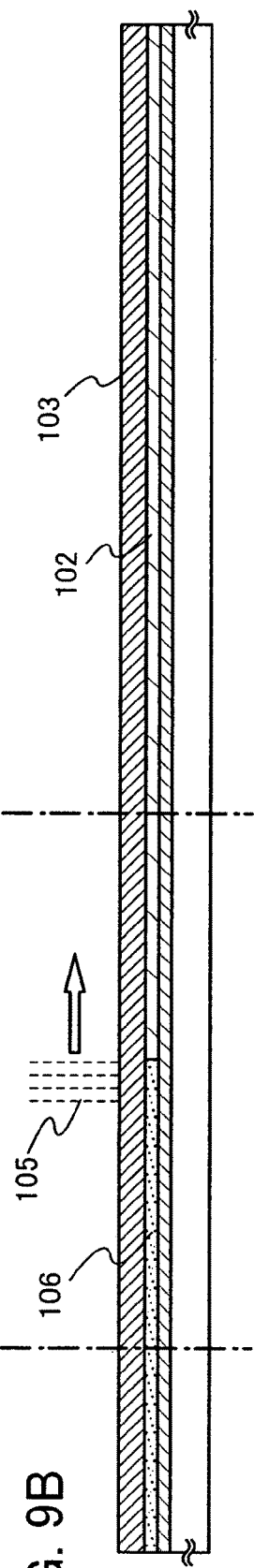

Next, as shown in FIG. 9B, the cap film 103 is irradiated with a laser beam 105, and then, the cap film 103 is removed. At this time, as for the laser beam 105, a laser beam having energy that can melt the semiconductor film 102 and a wavelength that can be absorbed by the semiconductor film 102 is selected. As a result, a crystalline semiconductor film 106 can be formed over the insulating film 101. Here, as the laser beam 105, the second harmonic of a Nd:YVO$_4$ laser is used, and then, the cap film 103 is removed. As a method for removing the cap film 103, dry etching, wet etching, polishing, or the like can be used. Here, the cap film 103 is removed by dry etching.

Figure 9C:
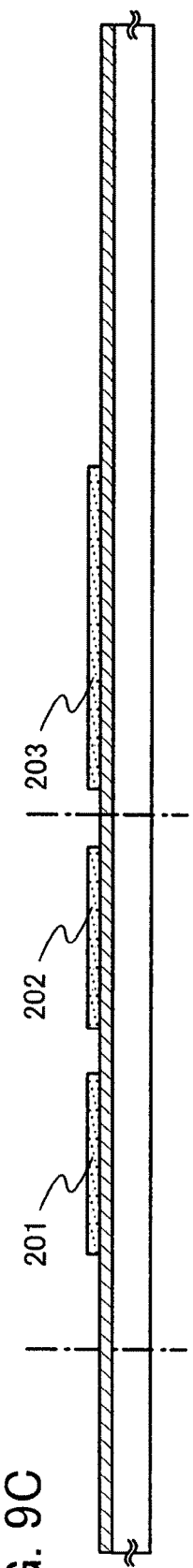

Next, as shown in FIG. 9C, the crystalline semiconductor film 106 is selectively etched to form semiconductor films 201 to 203. As a method for etching the crystalline semiconductor film 106, dry etching, wet etching, or the like can be used. Here, after a resist is applied to the crystalline semiconductor film 106, light-exposure and development are performed to form a resist mask. With the use of the resist mask, a dry etching method in which a flow ratio of $SF_6:O_2$ is set to be 4:15 is performed to selectively etch the crystalline semiconductor film 106, and then, the resist mask is removed.

Figure 9D:
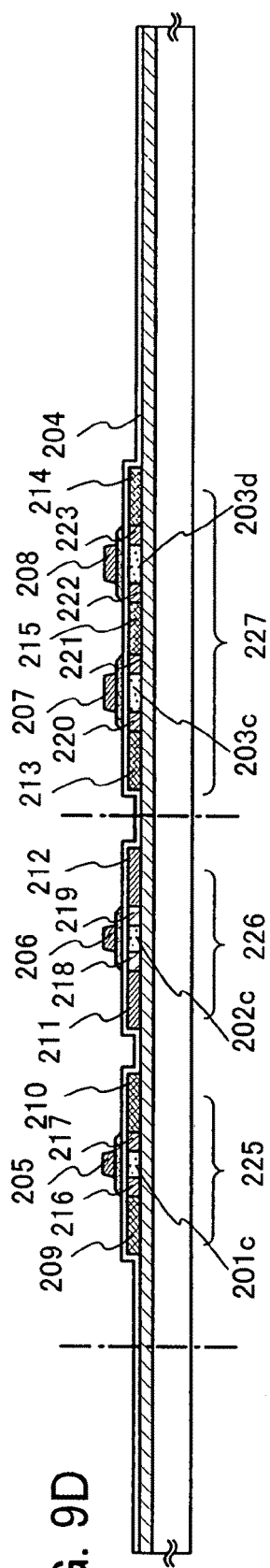

Next, as shown in FIG. 9D, a gate insulating film 204 is formed over the semiconductor films 201 to 203. The gate insulating film is formed using silicon nitride, silicon nitride containing oxygen, silicon oxide, silicon oxide containing nitrogen, or the like with a single layer structure or a stacked layer structure. Here, silicon oxide containing nitrogen having a thickness of 115 nm is formed by a plasma CVD method.

Then, gate electrodes 205 to 208 are formed. The gate electrodes 205 to 208 can be formed using a metal or a polycrystalline semiconductor doped with an impurity having one conductivity type. In the case of using a metal, tungsten, molybdenum, titanium, tantalum, aluminum, or the like can be used. Moreover, metal nitride obtained by nitriding the above metal can also be used. Alternatively, a structure in which a first layer including the metal nitride and a second layer including the metal are stacked may be used. Also, a paste including fine particles is discharged on the gate insulating film by a droplet discharging method, and the paste is dried and baked, whereby the gate electrode can be formed. Further, a paste including fine particles is formed over the gate insulating film by a printing method, and the paste is dried and baked, whereby the gate electrode can be formed. Typical examples of the fine particles are fine particles containing, as its main component, any of gold, silver, copper, an alloy of gold and silver, an alloy of gold and copper, an alloy of silver and copper, and an alloy of gold, silver, and copper. Here, after a tantalum nitride film having a thickness of 30 nm and a tungsten film having a thickness of 370 nm are formed over the gate insulating film 204 by a sputtering method, a resist mask formed by a photolithography step is used to etch the tantalum nitride film and the tungsten film selectively, and the gate electrodes 205 to 208 each having a shape, in which the width of the tantalum nitride film is larger than that of the tungsten film, are formed.

Next, with the gate electrodes 205 to 208 as masks, an impurity element which imparts n-type conductivity and an impurity element which imparts p-type conductivity are added to the semiconductor films 201 to 203, and source regions and drain regions 209 to 214 and a high-concentration impurity region 215 are formed. In addition, low-concentration impurity regions 216 to 223 overlapping with parts of the gate electrodes 205 to 208 are formed. Further, channel regions 201c to 203c and 203d overlapping with the gate electrodes 205 to 208 are formed. Here, the source regions and drain regions 209, 210, 213 and 214, the high concentration impurity region 215, and the low concentration impurity regions 216, 217, and 220 to 223 are doped with boron which is an impurity element imparting p-type conductivity. In addition, source regions and drain regions 211, 212, and the low concentration impurity regions 218 and 219 are doped with phosphorus which is an impurity element imparting n-type conductivity.

Then, in order to activate the impurity element that is added to the semiconductor film, heat treatment is performed. Here, heating in a nitrogen atmosphere at 550° C. for 4 hours is performed. Through the above steps, thin film transistors 225 to 227 are formed. In addition, as the thin film transistors 225 and 227, p-channel thin film transistors are formed, and as the thin film transistor 226, an n-channel thin film transistor is formed. In addition, a driver circuit is structured with the p-channel thin film transistor 225 and the n-channel thin film transistor 226, and the p-channel thin film transistor 227 functions as an element applying voltage to a pixel electrode.

Next, as shown in FIG. 10A, a first interlayer insulating film which insulates the gate electrodes and wirings of the thin film transistors 225 to 227 is formed. Here, as the first interlayer insulating film, a silicon oxide film 231, a silicon nitride film 232, and a silicon oxide film 233 are stacked. Then, wirings 234 to 239 connecting to source and drain regions of the thin film transistors 225 and 227 and a connecting terminal 240 are formed over the silicon oxide film 233 which is a part of the first interlayer insulating film. Here, after a Ti film having a thickness of 100 nm, an Al film having a thickness of 300 nm, and a Ti film having a thickness of 100 nm are consecutively formed by a sputtering method, with the use of a resist mask formed by a photolithography step, etching is selectively performed, and the wirings 234 to 239 and the connecting terminal 240 are formed. After that, the resist mask is removed.

Next, a second interlayer insulating film 241 is formed over the first interlayer insulating film, the wirings 234 to 239, and the connecting terminal 240. As the second interlayer insulating film 241, an inorganic insulating film such as a silicon oxide film, a silicon nitride film, or a silicon oxide film containing nitrogen can be used, and these insulating films are formed with a single layer structure or a stacked layer structure including two or more layers. In addition, as a method for forming the inorganic insulating film, a sputtering method, an LPCVD method, a plasma CVD method, or the like may be used. Here, after a plasma CVD method is used to form a silicon nitride film containing oxygen having a thickness of 100 nm to 150 nm, the silicon nitride film containing oxygen is selectively etched with the use of a resist mask formed by a photolithography step to form a contact hole reaching the wiring 239 of the thin film transistor 227 and the connecting terminal 240, and at the same time, the second interlayer insulating film 241 is formed. After that, the resist mask is removed.

As in this embodiment mode, by formation of the second interlayer insulating film 241, TFTs, wirings, and the like of a driver circuit portion can be prevented from being exposed, and the TFT's can be protected from contaminants.

Next, a first pixel electrode 242 connecting to the wiring 239 of the thin film transistor 227 and a conductive film 244 connecting to the connecting terminal 240 are formed. When a liquid crystal display device is a transmissive type liquid crystal display device, the first pixel electrode 242 is formed of a conductive film having a light-transmitting property. In addition, when a liquid crystal display device is a reflective type liquid crystal display device, the first pixel electrode 242 is formed of a conductive film having reflectivity. Here, the first pixel electrode 242 and the conductive film 244 are formed in such a way that after ITO containing silicon oxide having a thickness of 125 nm is formed by a sputtering method, etching is selectively performed with the use of a resist mask formed by a photolithography step.

Next, an insulating film 243 functioning as an alignment film is formed, and the insulating film 243 is formed in such a way that after a high molecular compound film such as a layer of polyimide, polyvinyl alcohol, or the like is formed by a roll coating method, a printing method, or the like, rubbing is performed. In addition, the insulating film 243 can be formed by deposition of SiO from an oblique angle to a substrate. Alternatively, the insulating film 243 can be formed by irradiation with polarized UV light to a photo-reactive type high molecular compound and polymerization of the photo-reactive type high molecular compound. Here, the insulating film 243 is formed by the steps of printing a high molecular compound film such as a layer of polyimide, polyvinyl alcohol, or the like, and baking and rubbing the film.

Next, as shown in FIG. 10B, a second pixel electrode 253 is formed on a counter substrate 251, and an insulating film 254 functioning as an alignment film is formed on the second pixel electrode. Note that a colored film 252 may be formed between the counter substrate 251 and the pixel electrode 253.

The counter substrate 251 can be formed by selecting a substrate similar to the substrate 100. In addition, the second pixel electrode 253 can be formed in a similar manner to the first pixel electrode 242, and the insulating film 254 functioning as an alignment film can be formed in a similar manner to the insulating film 243. Moreover, the colored film 252 is a film which is necessary when color display is performed, and in RGB mode, a colored film in which dye or pigment corresponding to each color of red, green, and blue is dispersed is formed corresponding to each pixel.

Next, the substrate 100 and the counter substrate 251 are bonded together using a sealant 257. Further, a liquid crystal layer 255 is formed between the substrate 100 and the counter substrate 251. Furthermore, the liquid crystal layer 255 can be formed by using a vacuum injection method which utilizes capillarity to inject a liquid crystal material into a region which is surrounded by the insulating films 243 and 254 which serve as alignment films and the sealant 257. Alternatively, the liquid crystal layer 255 can be formed by the steps of forming a sealant 157 over one surface of the counter substrate 251, dripping a liquid crystal material to a region enclosed by the sealant, and attaching the counter substrate 251 and the substrate 100 together by pressure bonding using the sealant, under reduced pressure.

As the sealant 257, a thermosetting epoxy resin, a UV-curable acrylic resin, a thermoplastic nylon, polyester, or the like can be formed using a dispenser method, a printing method, a thermocompression method, or the like. Note that by dispersing a filler in the sealant 257, the distance between the substrate 100 and the counter substrate 251 can be maintained. Here, a thermosetting epoxy resin is used for the sealant 257.

Further, in order to maintain the distance between the substrate 100 and the counter substrate 251, spacers 256 may be provided between the insulating films 243 and 254 which serve as alignment films. A spacer can be formed by applying an organic resin and etching the organic resin into a desired shape; representatively, a columnar shape or a cylindrical shape. Further, spacer beads may be used as the spacers. Here, spacer beads are used as the spacers 256.

Further, one or both of the substrate 100 and the counter substrate 251 are provided with a polarizing plate, although this is not shown in the drawings.

Next, as shown in FIG. 10C, in a terminal portion 263, a connection terminal which is connected to a gate wiring or a source wiring of a thin film transistor (in FIG. 10C, the connection terminal 240 which is connected to a source wiring or a drain wiring is shown) is provided. An FPC (flexible printed circuit) 262 which serves as an external input terminal is connected to the connection terminal 240 through the conductive film 244 and an anisotropic conductive film 261. The connection terminal 240 receives video signals and clock signals through the conductive film 244 and the anisotropic conductive film 261.

A circuit which drives a pixel, such as a source driver or a gate driver, is formed in a driver circuit portion 264. Here, the n-channel thin film transistor 226 and the p-channel thin film transistor 225 are disposed. Note that the n-channel thin film transistor 226 and the p-channel thin film transistor 225 form a CMOS circuit.

A plurality of pixels are formed in a pixel portion 265, and a liquid crystal element 258 is formed in each pixel. The liquid crystal element 258 is a portion in which the first pixel electrode 242, the second pixel electrode 253, and the liquid crystal layer 255, which fills the gap between the first pixel electrode 242 and the second pixel electrode 253, overlap with one another. The first pixel electrode 242 included in the liquid crystal element 258 is electrically connected to the thin film transistor 227.

A liquid crystal display device can be manufactured through the above-described process. In the liquid crystal display device shown in this embodiment mode, the width of the crystal grain can be made greater than or equal to 0.5 μm and less than or equal to 10 μm, preferably greater than or equal to 1 μm and less than or equal to 5 μm, and further, the crystal surface orientations can be aligned in one direction in the semiconductor layers of the thin film transistors formed in the driver circuit portion 264 and the pixel portion 265. Therefore, variation in electric characteristics of a plurality of thin film transistors can be suppressed, and consequently, a liquid crystal display device capable of displaying an image with less color irregularity, less defects, and high definition can be manufactured.

Embodiment Mode 3

In this embodiment mode, a manufacturing process of a light-emitting device having a light-emitting element which is an example of a semiconductor device will be described.

As shown in FIG. 11A, thin film transistors 225 to 227 are formed over a substrate 100 with an insulating film 101 therebetween using similar steps to those in Embodiment Mode 2. Further, a silicon oxide film 231, a silicon nitride film 232, and a silicon oxide film 233 are stacked as a first interlayer insulating film which insulates gate electrodes and wirings of the thin film transistors 225 to 227. Further, wirings 308 to 313 which are connected to semiconductor films of the thin film transistors 225 to 227, and a connecting terminal 314 are formed over the silicon oxide film 233, which is a part of the first interlayer insulating film.

Next, a second interlayer insulating film 315 is formed over the first interlayer insulating film, the wirings 308 to 313, and the connecting terminal 314. Then, a first electrode 316 which is connected to the wiring 313 of the thin film transistor 227 and a conductive film 320 which is connected to the connecting terminal 314 are formed. To form the first electrode 316 and the conductive film 320, ITO containing silicon oxide is formed by a sputtering method to a thickness of 125 nm, and then is selectively etched using a resist mask formed by a photolithography step.

By forming the second interlayer insulating film 315 as in this embodiment mode, exposure of the TFTs, wirings, and the like of a driver circuit portion can be prevented, and the TFTs can be protected from contaminants.

Next, an organic insulating film 317 which covers an end portion of the first electrode 316 is formed. Here, photosensitive polyimide is applied and baked. Then, exposure and development are performed to form the organic insulating film 317 such that a driver circuit, the first electrode 316 in a pixel region, and the second interlayer insulating film 315 on the periphery of the pixel region are exposed.

Next, a layer 318 containing a light-emitting substance is formed by an evaporation method over a part of the first electrode 316 and the organic insulating film 317. The layer 318 containing a light-emitting substance is formed of an organic or inorganic compound having a light-emitting property. Further, the layer 318 containing a light-emitting substance may be formed of both an organic compound having a light-emitting property and an inorganic compound having a light-emitting property. Moreover, a red-light-emitting pixel, a blue-light-emitting pixel, and a green-light-emitting pixel can be formed by using a red-light-emitting substance, a blue-light-emitting substance, and a green-light-emitting substance, respectively, for the layer 318 containing a light-emitting substance.

Here, the layer containing a red-light-emitting substance is formed by stacking DNTPD which is 50 nm thick, NPB which is 10 nm thick, NPB which is 30 nm thick to which bis[2,3-bis(4-fluorophenyl)quinoxalinato]iridium(acetylacetonate) (abbr.: Ir(Fdpq)$_2$(acac)) is added, Alq$_3$ which is 60 nm thick, and LiF which is 1 nm thick.

Further, the layer containing a green-light-emitting substance is formed by stacking DNTPD which is 50 nm thick, NPB which is 10 nm thick, Alq$_3$ which is 40 nm thick to which coumarin 545T (C545T) is added, Alq$_3$ which is 60 nm thick, and LiF which is 1 nm thick.

The layer containing a blue-light-emitting substance is formed by stacking DNTPD which is 50 nm thick, NPB which is 10 nm thick, 9-[4-(N-carbazolyl)]phenyl-10-phenylanthracene (abbr.: CzPA) which is 30 nm thick to which 2,5,8,11-tetra(tert-butyl)perylene (abbr.: TBP) is added, Alq$_3$ which is 60 nm thick, and LiF which is 1 nm thick.

Moreover, in addition to the red-light-emitting pixel, the blue-light-emitting pixel, and the green-light-emitting pixel, a white-light-emitting pixel may be formed, by forming the layer containing a light-emitting substance using a white light-emitting substance. By providing the white-light-emitting pixel, power consumption can be reduced.

Next, a second electrode 319 is formed over the layer 318 containing a light-emitting substance and the organic insulating film 317. Here, an Al film is formed to a thickness of 200 nm by an evaporation method. Accordingly, a light-emitting element 321 is formed using the first electrode 316, the layer 318 containing a light-emitting substance, and the second electrode 319.

A structure of the light-emitting element 321 will be described below.

When the layer 318 containing a light-emitting substance is formed using a layer which uses an organic compound and has a light-emitting function (hereinafter referred to as a light-emitting layer 343), the light-emitting element 321 functions as an organic EL element.

As an organic compound with a light-emitting property, for example, 9,10-di(2-naphthyl)anthracene (abbr.: DNA); 2-tert-butyl-9,10-di(2-naphthyl)anthracene (abbr.: t-BuDNA); 4,4'-bis(2,2-diphenylvinyl)biphenyl (abbr.: DPVBi); coumarin 30; coumarin 6; coumarin 545; coumarin 545T; perylene; rubrene; periflanthene; 2,5,8,11-tetra(tert-butyl)perylene (abbr.: TBP); 9,10-diphenylanthracene (abbr.: DPA); 5,12-diphenyltetracene; 4-(dicyanomethylene)-2-methyl-6-[p-(dimethylamino)styryl]-4H-pyran (abbr.: DCM1); 4-(dicyanomethylene)-2-[2-(julolidin-9-yl)ethenyl]-6-methyl-4H-pyran (abbr.: DCM2); 4-(dicyanomethylene)-2,6-bis[p-(dimethylamino)styryl]-4H-pyran (abbr.: BisDCM); or the like may be used. Further, the following compounds capable of emitting phosphoresce can also be used: bis[2-(4', 6'-difluorophenyl)pyridinato-N,C$^{2'}$](picolinato)iridium (abbr.: Flrpic); bis{2-[3',5'-bis(trifluoromethyl)phenyl]pyridinato-N,C$^{2'}$}(picolinato)iridium (abbr.: Ir(CF$_3$ ppy)$_2$ (pic)); tris(2-phenylpyridinato-N,C$^{2'}$)iridium (abbr.: Ir(ppy)$_3$); (acetylacetonato)bis(2-phenylpyridinato-N,C$^{2'}$) iridium (abbr.: Ir(ppy)$_2$(acac)); (acetylacetonato)bis[2-(2'-thienyl)pyridinato-N,C$^{3'}$]iridium (abbr.: Ir(thp)$_2$(acac)); (acetylacetonato)bis(2-phenylquinolinato-N,C$^{2'}$)iridium (abbr.: Ir(pq)$_2$(acac)); (acetylacetonato)bis[2-(2'-benzothienyl)pyridinato-N,C$^{3'}$]iridium (abbr.: Ir(btp)$_2$(acac)); and the like.

Figure 12A:
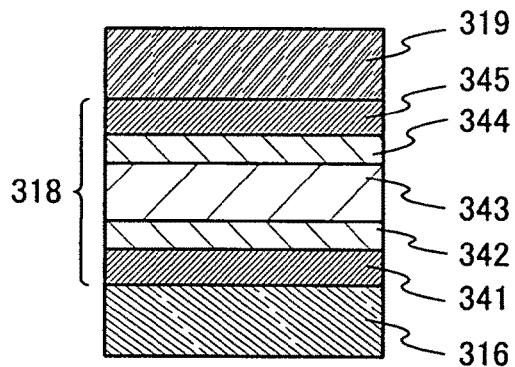
FIGS. 12A to 12E are cross-sectional views each explaining a structure of a light-emitting element which can be applied to the present invention.

Further, as shown in FIG. 12A, the light-emitting element 321 may include the first electrode 316, and also the layer 318 containing a light-emitting substance and the second electrode 319, which are formed over the first electrode 316. The layer 318 containing a light-emitting substance includes a hole-injecting layer 341 formed of a material with a hole-injecting property, a hole-transporting layer 342 formed of a material with a hole-transporting property, the light-emitting layer 343 formed of an organic compound with a light-emitting property, an electron-transporting layer 344 formed of a material with an electron-transporting property, and an electron-injecting layer 345 formed of a material with an electron-injecting property.

As the material with a hole-transporting property, phthalocyanine (abbr.: H$_2$Pc); copper phthalocyanine (abbr.: CuPc); vanadyl phthalocyanine (abbr.: VOPc); 4,4',4"-tris(N,N-diphenylamino)triphenylamine (abbr.: TDATA); 4,4',4"-tris [N-(3-methylphenyl)-N-phenylamino]triphenylamine (abbr.: MTDATA); 1,3,5-tris[N,N-di(m-tolyl)amino]benzene (abbr.: m-MTDAB); N,N'-diphenyl-N,N'-bis (3-methylphenyl)-1,1'-biphenyl-4,4'-diamine (abbr.: TPD); 4,4'-bis[N-(1-naphthyl)-N-phenylamino]biphenyl (abbr.: NPB); 4,4'-bis{N-[4-di(m-tolyl)amino]phenyl-N-phenylamino}biphenyl (abbr.: DNTPD); 4,4'-bis[N-(4-biphenylyl)-N-phenylamino]biphenyl (abbr.: BBPB); 4,4', 4"-tri(N-carbazolyl)triphenylamine (abbr.: TCTA); and the like may be used. Note that the present invention is not limited thereto. Among the above compounds, an aromatic amine compound typified by TDATA, MTDATA, m-MTDAB, TPD, NPB, DNTPD, BBPB, TCTA, or the like is preferable as the organic compound because it easily generates holes. The substances mentioned here generally have a hole mobility of $10^{-6}$ cm$^2$/Vs or more.

As a material with a hole-injecting property, the aforementioned materials with a hole-transporting property can be used. Further, a chemically-doped conductive high-molecular compound can also be used. For example, polyaniline (abbr.: PAni); polyethylene dioxythiophene (abbr.: PEDOT) doped with polystyrene sulfonate (abbr.: PSS); or the like can also be used. Further, a thin film of an inorganic semiconductor such as molybdenum oxide, vanadium oxide, or nickel oxide, or an ultrathin film of an inorganic insulator such as aluminum oxide is also effective.

Here, a material with an electron-transporting property may be a material including a metal complex with a quinoline skeleton or a benzoquinoline skeleton, or the like, such as tris(8-quinolinolato)aluminum (abbr.: Alq$_3$), tris(4-methyl-8-quinolinolato)aluminum (abbr.: Almq$_3$), bis(10-hydroxybenzo[h]-quinolinato)beryllium (abbr.: BeBq$_2$), or bis(2-methyl-8-quinolinolato)-4-phenylphenolato-aluminum (abbr.: BAlq). Further, a metal complex having an oxazole ligand or a thiazole ligand, or the like can also be used, such as bis[2-(2-hydroxyphenyl)benzoxazolato]zinc (abbr.: Zn(BOX)$_2$), or bis[2-(2-hydroxyphenyl)benzothiazolato]zinc (abbr.: Zn(BTZ)$_2$). As an alternative to a metal complex, 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used. The substances mentioned here generally have an electron mobility of $10^{-6}$ cm$^2$/Vs or more.

As a material with an electron-injecting property, the aforementioned materials with an electron-transporting property may be used. Further, an ultrathin film of an insulator such as the following is often used: an alkali metal halide such as lithium fluoride or cesium fluoride; an alkaline-earth metal halide such as calcium fluoride; or an alkali metal oxide such as lithium oxide. Further, an alkali metal complex such as lithium acetyl acetonate (abbr.: Li(acac)) or 8-quinolinolato-lithium (abbr.: Liq) is also effective. Furthermore, a material mixed by, for example, co-evaporating the aforementioned material with an electron-transporting property and a metal with a low work function such as Mg, Li, or Cs can also be used.

Figure 12B:
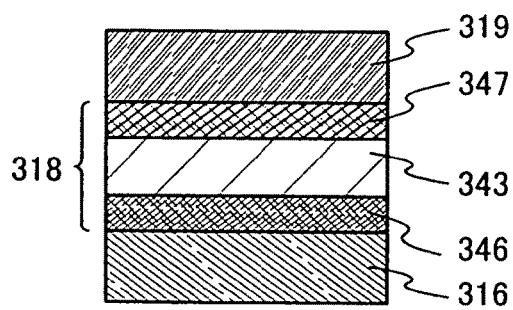

As shown in FIG. 12B, the light-emitting element 321 may be formed using the first electrode 316, the layer 318 containing a light-emitting substance, and the second electrode 319. The layer 318 containing a light-emitting substance includes a hole-transporting layer 346 formed of an organic compound with a light-emitting property and an inorganic compound having an electron-accepting property with respect to the organic compound with a light-emitting property, a light-emitting layer 343 formed of an organic compound with a light-emitting property, and an electron-transporting layer 347 formed of an organic compound with a light-emitting property and an inorganic compound having an electron-donating property with respect to the organic compound with a light-emitting property.

As the organic compound for the hole-transporting layer 346 formed of the organic compound with a light-emitting property and the inorganic compound having an electron-accepting property with respect to the organic compound with a light-emitting property, the aforementioned organic compound with a hole-transporting property may be used as appropriate. Further, the inorganic compound may be any kind of inorganic compound as long as it can easily accept electrons from the organic compound. As the inorganic compound, various metal oxides or metal nitrides can be used. In particular, an oxide of a transition metal belonging to any of Group 4 to Group 12 in the periodic table is preferable because it is likely to exhibit an electron-accepting property. Specifically, titanium oxide, zirconium oxide, vanadium oxide, molybdenum oxide, tungsten oxide, rhenium oxide, ruthenium oxide, zinc oxide, or the like can be used. Among these metal oxides, oxides of transition metals belonging to any of Group 4 to Group 8 in the periodic table are preferable because many of them easily accept electrons. In particular, vanadium oxide, molybdenum oxide, tungsten oxide, and rhenium oxide are preferable because they can be formed by vacuum evaporation and are easy to be handled.

As the organic compound for the electron-transporting layer 347 formed of the organic compound with a light-emitting property and the inorganic compound having an electron-donating property with respect to the organic compound with a light-emitting property, the aforementioned organic compound with an electron-transporting property may be used as appropriate. Further, the inorganic compound may be any kind of inorganic compound as long as it can easily donate electrons to the organic compound. As the inorganic compound, various metal oxides or metal nitrides can be used. In particular, an alkali metal oxide, an alkaline-earth metal oxide, a rare-earth metal oxide, an alkali metal nitride, an alkaline-earth metal nitride, and a rare-earth metal nitride are preferable because they are likely to exhibit an electron-donating property. Specifically, lithium oxide, strontium oxide, barium oxide, erbium oxide, lithium nitride, magnesium nitride, calcium nitride, yttrium nitride, lanthanum nitride, and the like are preferable. In particular, lithium oxide, barium oxide, lithium nitride, magnesium nitride, and calcium nitride are preferable because they can be formed by vacuum evaporation and are easy to be handled.

The electron-transporting layer 347 and the hole-transporting layer 346 which are each formed of an organic compound with a light-emitting property and an inorganic compound are superior in electron injecting/transporting properties. Therefore, various materials can be used for the first electrode 316 and the second electrode 319 without limiting their work functions very much. Moreover, the drive voltage can be reduced.

Further, the light-emitting element 321 functions as an inorganic EL element by having a layer which uses an inorganic compound and has a light-emitting function (hereinafter referred to as a light-emitting layer 349) as the layer 318 containing a light-emitting substance. Inorganic EL elements are classified as dispersion-type inorganic EL elements or thin-film inorganic EL elements, depending on their structures. They differ from one another in that the former include a layer containing a light-emitting substance in which particles of a light-emitting material are dispersed in a binder and the latter include a layer containing a light-emitting substance formed of a thin film of a light-emitting material. However, they share the fact that they both need electrons accelerated by a high electric field. Further, mechanisms for obtaining light-emission include donor-acceptor recombination light emission, which utilizes a donor level and an acceptor level, and localized light emission, which utilizes a core electron transition of a metal ion. In many cases, dispersion-type inorganic EL elements utilize donor-acceptor recombination light emission, while thin-film inorganic EL elements utilize localized light emission. A structure of an inorganic EL element is described below.

A light-emitting material that can be used in this embodiment mode includes a base material and an impurity element which serves as a light-emitting center. By varying the impurity element that is included, various colors of light emission can be obtained. Various methods can be used to manufacture the light-emitting material, such as a solid phase method or a liquid phase method (e.g., a coprecipitation method). Further, a liquid phase method, such as a spray pyrolysis method, a double decomposition method, a method which employs a pyrolytic reaction of a precursor, a reverse micelle method, a method in which one or more of the above methods is combined with high-temperature baking, a freeze-drying method, or the like can be used.

In the solid phase method, a base material and an impurity element or a compound containing an impurity element are weighed, mixed in a mortar, and reacted by being heated and baked in an electric furnace. Thereby, the impurity element is included in the base material. Baking temperature is preferably 700° C. to 1500° C. This is because if the temperature is too low, the solid phase reaction will not proceed, and if the temperature is too high, the base material will decompose. The materials may be baked in powdered form. However, it is preferable to bake the materials in pellet form. Baking at a relatively high temperature is necessary in the solid phase method. However, due to its simplicity, this method has high productivity and is suitable for mass production.

The liquid phase method (e.g., a coprecipitation method) is a method in which a base material or a compound containing a base material, and an impurity element or a compound containing an impurity element, are reacted in a solution, dried, and then baked. Particles of the light-emitting material are distributed uniformly, and the reaction can proceed even if the particles are small and the baking temperature is low.

As a base material for the light-emitting material of the inorganic EL element, a sulfide, an oxide, or a nitride can be used. As a sulfide, zinc sulfide, cadmium sulfide, calcium sulfide, yttrium sulfide, gallium sulfide, strontium sulfide, barium sulfide, or the like can be used, for example. Further, as an oxide, zinc oxide, yttrium oxide, or the like can be used, for example. Moreover, as a nitride, aluminum nitride, gallium nitride, indium nitride, or the like can be used, for example. Further, zinc selenide, zinc telluride, or the like can also be used. A ternary mixed crystal such as calcium gallium sulfide, strontium gallium sulfide, or barium gallium sulfide may also be used.

As a light-emitting center for localized light emission, manganese (Mn), copper (Cu), samarium (Sm), terbium (Tb), erbium (Er), thulium (Tm), europium (Eu), cerium (Ce), praseodymium (Pr), or the like can be used. Further, as charge compensation, a halogen element such as fluorine (F) or chlorine (Cl) may be added.

Meanwhile, as a light-emitting center for donor-acceptor recombination light emission, a light-emitting material that includes a first impurity element which forms a donor level and a second impurity element which forms an acceptor level can be used. As the first impurity element, fluorine (F), chlorine (Cl), aluminum (Al), or the like can be used, for example. As the second impurity element, copper (Cu), silver (Ag), or the like can be used, for example.

In the case of using a solid phase method to synthesize a light-emitting material for donor-acceptor recombination light-emission, a base material, a first impurity element or a compound containing the first impurity element, and a second impurity element or a compound containing the second impurity element are weighed, mixed in a mortar, then heated and baked in an electric furnace. Baking temperature is preferably 700° C. to 1500° C. This is because if the temperature is too low, the solid phase reaction will not proceed, and if the temperature is too high, the base material will decompose. The materials may be baked in powdered form. However, it is preferable to bake the materials in pellet form. As the base material, any of the above-mentioned base materials can be used. As the first impurity element or the compound containing the first impurity element, fluorine (F), chlorine (Cl), or aluminum sulfide or the like can be used, for example. As the second impurity element or the compound containing the second impurity element, copper, silver, copper sulfide, silver sulfide, or the like can be used, for example.

Further, in the case of employing a solid phase reaction, a compound including the first impurity element and the second impurity element may be used as an impurity element. In such a case, since the impurity elements diffuse readily and the solid phase reaction proceeds readily, a uniform light-emitting material can be obtained. Further, since an unnecessary impurity element does not enter the light-emitting material, a light-emitting material with high purity can be obtained. As a compound including the first impurity element and the second impurity element, for example, copper chloride, silver chloride, or the like can be used.

Note that the concentration of the impurity elements in the base material may be 0.01 atomic % to 10 atomic %, and is preferably in the range of 0.05 atomic % to 5 atomic %.

Figure 12C:
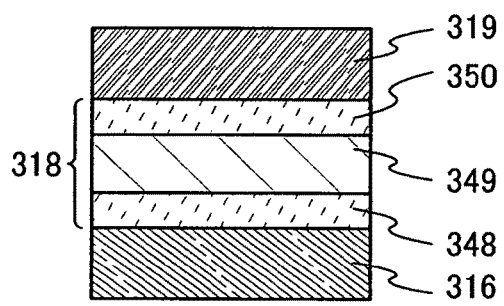

FIG. 12C shows a cross-section of an inorganic EL element in which the layer 318 containing a light-emitting substance is formed using a first insulating layer 348, a light-emitting layer 349, and a second insulating layer 350.

In the case of a thin film inorganic EL element, the light-emitting layer 349 includes the above-mentioned light-emitting material. As a method for forming the light-emitting layer 349, a resistive heating evaporation method, a vacuum evaporation method such as an electron-beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like can be used.

There is no particular limitation on the materials used for the first insulating layer 348 and the second insulating layer 350; however, preferably, they have a high insulating property and dense film quality. In addition, preferably, the materials of the insulating layers have a high dielectric constant. For example, silicon oxide, yttrium oxide, titanium oxide, aluminum oxide, hafnium oxide, tantalum oxide, barium titanate, strontium titanate, lead titanate, silicon nitride, zirconium oxide, or the like, or a mixed film or a stacked film containing two or more of these materials can be used. The first insulating layer 348 and the second insulating layer 350 can be formed by sputtering, an evaporation method, CVD, or the like. There is no particular limitation on the thickness of the first insulating layer 348 and the second insulating layer 350, but preferably it is in the range of 10 nm to 1000 nm. Note that a light-emitting element of this embodiment mode does not necessarily require hot electrons, and therefore has the advantages that a thin film can be formed and drive voltage can be reduced. Film thickness is preferably less than or equal to 500 nm, more preferably less than or equal to 100 nm.

Although not shown, a buffer layer may be provided between the light-emitting layer 349 and the insulating layers 348 and 350 or between the light-emitting layer 349 and the electrodes 316 and 319. The buffer layer facilitates carrier injection and suppresses mixture of the layers. There is no particular limitation on the material of the buffer layer. However, for example, zinc sulfide, selenium sulfide, cadmium sulfide, strontium sulfide, barium sulfide, copper sulfide, lithium fluoride, calcium fluoride, barium fluoride, magnesium fluoride, or the like can be used.

Figure 12D:
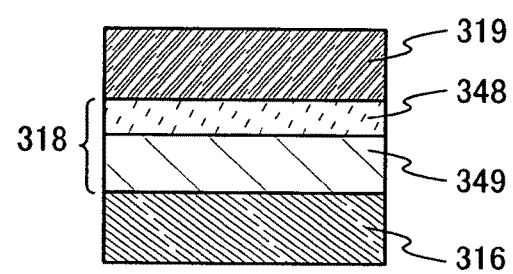

Moreover, as shown in FIG. 12D, the layer 318 containing a light-emitting substance may be formed using a light-emitting layer 349 and a first insulating layer 348. In this case, in FIG. 12D, the first insulating layer 348 is provided between the second electrode 319 and the light-emitting layer 349. Note that the first insulating layer 348 may also be provided between the first electrode 316 and the light-emitting layer 349.

Further, the layer 318 containing a light-emitting substance may be formed using only the light-emitting layer 349. In other words, the light-emitting element 321 may be formed using the first electrode 316, the layer 318 containing a light-emitting substance, and the second electrode 319.

In the case of a dispersion-type inorganic EL element, a layer containing a light-emitting substance which is the form of a film is formed by dispersing particles of a light-emitting material in a binder. When particles with a desired size cannot be satisfactorily obtained by a method for manufacturing the light-emitting material, the material may be processed into particles by being crushed in a mortar or the like. A binder refers to a substance for fixing the dispersed particles of a light-emitting material in place and maintaining the shape of the layer containing a light-emitting substance. The light-emitting material is dispersed evenly throughout the layer containing a light-emitting substance and fixed in place by the binder.

In the case of the dispersion-type inorganic EL element, the layer containing a light-emitting substance can be formed by a droplet discharging method that can selectively form the layer containing a light-emitting substance, a printing method (such as screen printing or offset printing), a coating method such as a spin coating method, a dipping method, a dispenser method, or the like. There is no particular limitation on the thickness of the layer. However, it is preferably in the range of 10 nm to 1000 nm. Further, the proportion of the light-emitting material in the layer containing a light-emitting substance, which includes the light-emitting material and the binder, is preferably greater than or equal to 50 wt % and less than or equal to 80 wt %.

Figure 12E:
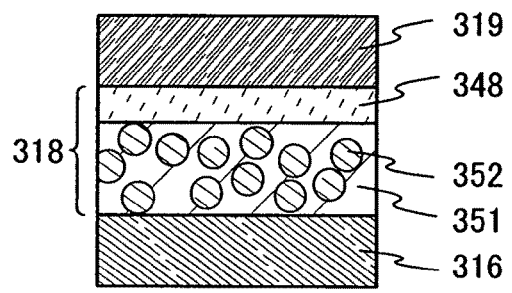

An element shown in FIG. 12E has a first electrode 316, a layer 318 containing a light-emitting substance, and a second electrode 319. The layer 318 containing a light-emitting substance is formed using an insulating layer 348 and a light-emitting layer in which a light-emitting material 352 is dispersed in a binder 351. FIG. 12E shows a structure in which the insulating layer 348 is in contact with the second electrode 319; however, a structure in which the insulating layer 348 is in contact with the first electrode 316 may also be used. Moreover, insulating layers may be formed in contact with each of the first electrode 316 and the second electrode 319 in the element. Further, the insulating layers in contact with the first electrode 316 and the second electrode 319 do not need to be provided in the element.

As a binder which can be used in this embodiment mode, an insulating material such as an organic material or an inorganic material can be used. A mixed material containing an organic material and an inorganic material may also be used. As an organic insulating material, a polymer with a relatively high dielectric constant, such as a cyanoethyl cellulose resin, or a resin such as polyethylene, polypropylene, a polystyrene based resin, a silicone resin, an epoxy resin, or vinylidene fluoride can be used. Further, a siloxane resin or a heat-resistant high molecular material such as aromatic polyamide or polybenzimidazole may also be used. A siloxane resin is a resin which includes a Si—O—Si bond. Siloxane is a material which has a skeleton structure formed of bonds of silicon (Si) and oxygen (O). As a substituent, an organic group containing at least hydrogen (for example, an alkyl group or aromatic hydrocarbon) can be used. Alternatively, a fluoro group may be used as a substituent. Further alternatively, both a fluoro group and an organic group containing at least hydrogen may be used as a substituent. Further, the following resin materials may also be used: a vinyl resin such as polyvinyl alcohol or polyvinylbutyral, a phenol resin, a novolac resin, an acrylic resin, a melamine resin, a urethane resin, an oxazole resin (e.g., polybenzoxazole), or the like. Further, a photocurable resin or the like can be used. Fine particles with a high dielectric constant, such as particles of barium titanate or strontium titanate, can be mixed with these resins as appropriate to adjust the dielectric constant.

Further, the inorganic material used for the binder can be formed using silicon oxide, silicon nitride, silicon containing oxygen and nitrogen, aluminum nitride, aluminum containing oxygen and nitrogen, aluminum oxide, titanium oxide, barium titanate, strontium titanate, lead titanate, potassium niobate, lead niobate, tantalum oxide, barium tantalate, lithium tantalate, yttrium oxide, zirconium oxide, zinc sulfide, or other substances containing an inorganic material. By including an inorganic material with a high dielectric constant in the organic material (by doping or the like), the dielectric constant of the layer containing a light-emitting substance, which includes the light-emitting material and the binder, can be further controlled, and the dielectric constant can be further increased.

In the manufacturing process, the light-emitting material is dispersed in a solution containing a binder. As a solvent for the solution containing a binder that can be used in this embodiment mode, a solvent in which the binder material dissolves and which can form a solution with a viscosity that is suitable for the method of forming the light-emitting layer (the various wet processes) and for a desired film thickness may be selected appropriately. An organic solvent or the like can be used. For example, when a siloxane resin is used as the binder, propylene glycolmonomethyl ether, propylene glycolmonomethyl ether acetate (also called PGMEA), 3-methoxy-3-methyl-1-butanol (also called MMB), or the like can be used as the solvent.

In the inorganic EL light-emitting element, light-emission is obtained when a voltage is applied between a pair of electrodes which sandwich the layer containing a light-emitting substance, and the element can be operated by either direct current drive or alternating current drive.

Next, as shown in FIG. 11B, a protective film 322 is formed over the second electrode 319. The protective film 322 is to prevent moisture, oxygen, and the like from penetrating the light-emitting element 321. The protective film 322 is preferably formed using silicon nitride, silicon oxide, silicon nitride containing oxygen, silicon oxide containing nitrogen, aluminum oxynitride, aluminum oxide, diamond-like carbon (DLC), carbon-containing nitrogen, or another insulating material, by a thin-film formation method such as a plasma CVD method or a sputtering method.

Further, when a sealing substrate 324 is attached to the second interlayer insulating film 315, which is formed over the substrate 100, by using a sealant 323, the light-emitting element 321 is provided in a space 325 which is surrounded by the substrate 100, the sealing substrate 324, and the sealant 323. The space 325 is filled with a filler, which may be an inert gas (such as nitrogen or argon) or the sealant 323.

An epoxy-based resin is preferably used for the sealant 323. Further, it is desirable that the material of the sealant 323 transmits as little moisture and oxygen as possible. As the sealing substrate 324, a glass substrate, a quartz substrate, or a plastic substrate formed of FRP (fiberglass reinforced plastic), PVF (polyvinyl fluoride), polyester, acrylic, or the like can be used.

Next, as shown in FIG. 11C, an FPC 327 is attached to the conductive film 320 which is in contact with the connection terminal 314 using an anisotropic conductive film 326, similarly to the above embodiment mode.

Through the above steps, a semiconductor device having an active matrix light-emitting element can be formed.

Figure 13:
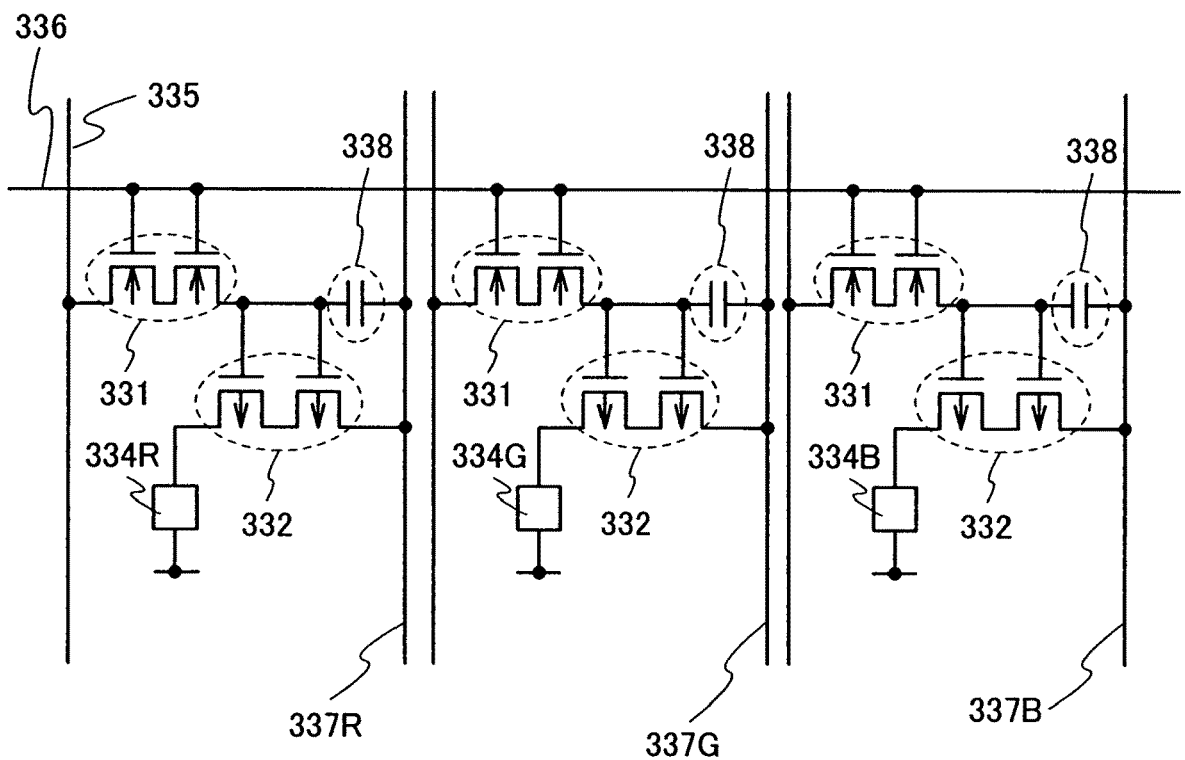
FIG. 13 is a diagram explaining an equivalent circuit of a light-emitting element which can be applied to the present invention.

Here, FIG. 13 shows an equivalent circuit diagram of a pixel in the case of full-color display in this embodiment mode. In FIG. 13, a thin film transistor 332 which is surrounded by a dashed line corresponds to the thin film transistor 227 which drives a light-emitting element. A thin film transistor 331 controls the thin film transistor 332 to be turned on or off. Note that an organic EL element (hereinafter referred to as an OLED), in which a layer containing a light-emitting substance is formed using a layer containing a light-emitting organic compound, is used as the light-emitting element.

In a pixel which displays red color, an OLED 334R which emits red light is connected to a drain region of the thin film transistor 332, and a red anode-side power supply line 337R is provided in a source region of the thin film transistor 332. Further, the thin film transistor 331 for switching is connected to a gate wiring 336, and a gate electrode of the thin film transistor 332 for driving is connected to a drain region of the thin film transistor 331 for switching. The drain region of the thin film transistor 331 for switching is connected to a capacitor 338 which is connected to the red anode-side power supply line 337R.

In a pixel which displays green color, an OLED 334G which emits green light is connected to a drain region of the thin film transistor 332 for driving, and a green anode-side power supply line 337G is provided in a source region of the thin film transistor 332 for driving. The thin film transistor 331 for switching is connected to the gate wiring 336, and the gate electrode of the thin film transistor 332 for driving is connected to the drain region of the thin film transistor 331 for switching. Note that the drain region of the thin film transistor 331 for switching is connected to the capacitor 338 which is connected to the green anode-side power supply line 337G.

In a pixel displaying blue color, an OLED 334B which emits blue light is connected to a drain region of the thin film transistor 332 for driving, and a blue anode-side power supply line 337B is provided in a source region of the thin film transistor 332 for driving. The thin film transistor 331 for switching is connected to the gate wiring 336, and the gate electrode of the thin film transistor 332 for driving is connected to the drain region of the thin film transistor 331 for switching. Note that the drain region of the thin film transistor 331 for switching is connected to the capacitor 338 which is connected to the blue anode-side power supply line 337B.

Different voltages are applied to each of the pixels having different colors, depending on the material of the layer containing a light-emitting substance.

Here, although a source wiring 335 and the anode-side power supply lines 337R, 337Q and 337B are formed in parallel, the present invention is not limited thereto. The gate wiring 336 and the anode-side power supply lines 337R, 337Q and 337B may be formed in parallel. Further, the thin film transistor 332 for driving may have a multi-gate electrode structure.

In the light-emitting device, there is no particular limitation on the driving method of the screen display. For example, a dot-sequential driving method, a line-sequential driving method, a plane-sequential driving method, or the like may be used. Typically, a line sequential driving method is used, and may be combined as appropriate with a time-division grayscale driving method or an area grayscale driving method. Further, a video signal which is input to a source line of the light-emitting device may be an analog signal or a digital signal. A driver circuit or the like may be designed as appropriate in accordance with the video signal.

Further, for a light-emitting device using a digital video signal, driving methods include one in which video signals input to a pixel are ones with a constant voltage (CV) and one in which video signals input to a pixel are ones with a constant current (CC). Further, concerning the driving method which employs video signals with a constant voltage (CV), there is a system in which voltage of a signal which is applied to a light-emitting element is constant (CVCV), and a system in which current of a signal which is applied to a light-emitting element is constant (CVCC). Further, concerning the driving method which employs video signals with a constant current (CC), there is a system in which voltage of a signal which is applied to a light-emitting element is constant (CCCV), and a system in which current of a signal which is applied to a light emitting element is constant (CCCC).

A protection circuit for preventing electrostatic breakdown (such as a protection diode) may be provided in the light-emitting device.

Through the above steps, a light-emitting device having an active matrix light-emitting element can be manufactured. In the light-emitting device shown in this embodiment mode, the width of the crystal grains can be greater than or equal to 0.5 μm and less than or equal to 10 μm, preferably greater than or equal to 1 μm and less than or equal to 5 μm, and further, the crystal surface orientations can be aligned in one direction in the semiconductor layer of the thin film transistor formed in the driver circuit and the pixel portion. Therefore, variation in electric characteristics of the thin film transistor which drives the light-emitting element can be suppressed, and consequently, variation in luminance of the light-emitting element can be reduced, and a light-emitting display device capable of displaying an image with less color irregularity, less defects, and high definition can be manufactured.

Embodiment Mode 4

In this embodiment mode, a manufacturing process of a semiconductor device which is capable of non-contact data transmission will be described with reference to FIGS. 14A to 14E, 15A to 15D, 16A to 16C, and 17A to 17D. In addition, a structure of the semiconductor device will be described with reference to FIG. 18. Further, applications of the semiconductor device shown in this embodiment mode will be described with reference to FIGS. 19A to 19F.

Figure 14A:
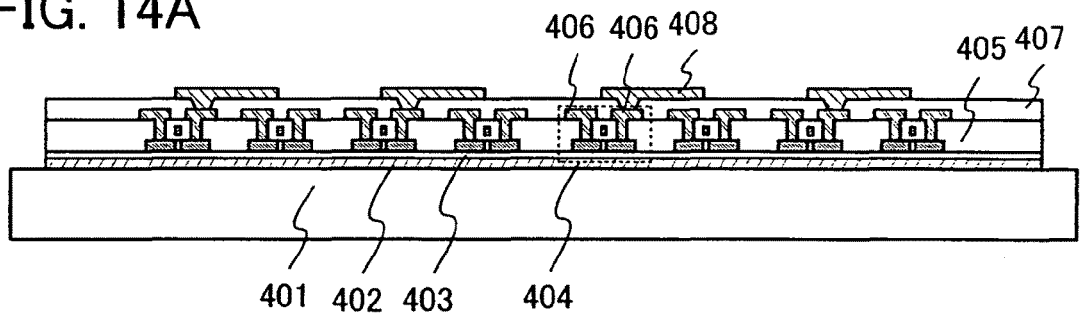
FIGS. 14A to 14E are cross-sectional views explaining a method for manufacturing a semiconductor device of the present invention.

As shown in FIG. 14A, a separation film 402 is formed over a substrate 401. Next, an insulating film 403 is formed over the separation film 402 as in Embodiment Modes 1 and 2, and a thin film transistor 404 is formed over the insulating film 403. Then, an interlayer insulating film 405 is formed to insulate a conductive film included in the thin film transistor 404, and source and drain electrodes 406 which are connected to the semiconductor film of the thin film transistor 404 are formed. After that, an insulating film 407 which covers the thin film transistor 404, the interlayer insulating film 405, and the source and drain electrodes 406 is formed. Then, a conductive film 408 which is connected to the source electrode or the drain electrode 406 with the insulating film 407 interposed therebetween is formed.

As the substrate 401, a substrate similar to the substrate 100 can be used. Further, a metal substrate or a stainless-steel substrate which has an insulating film formed on one surface, a plastic substrate which has heat resistance and can withstand the treatment temperature of this process, a ceramic substrate, or the like can be used. Here, a glass substrate is used as the substrate 401.

The separation film 402 is formed by a sputtering method, a plasma CVD method, a coating method, a printing method, or the like using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing the element as its main component; or a compound material containing the element as its main component, and has a single-layer or a stacked-layer structure. The crystal structure of a separation film including silicon that is the separation film 402 may be amorphous, microcrystalline, or polycrystalline.

When the separation film 402 has a single-layer structure, it is preferable to form a layer including tungsten or molybdenum, or a layer including a mixture of tungsten and molybdenum. Alternatively, a layer including an oxide of tungsten or an oxynitride of tungsten, a layer including an oxide of molybdenum or an oxynitride of molybdenum, or a layer including an oxide or an oxynitride of a mixture of tungsten and molybdenum is formed. The mixture of tungsten and molybdenum corresponds to, for example, an alloy of tungsten and molybdenum.

When the separation film 402 has a stacked layer structure, a layer including tungsten or molybdenum or a layer including a mixture of tungsten and molybdenum is preferably formed as a first layer, and a layer including an oxide, a nitride, an oxynitride, or a nitride oxide of tungsten, molybdenum, or a mixture of tungsten and molybdenum is preferably formed as a second layer.

When the separation film 402 is formed as a stacked layer structure including a layer which includes tungsten and a layer which includes an oxide of tungsten, the layer which includes tungsten may be formed and an insulating layer which includes an oxide may be formed thereover so that the layer which includes an oxide of tungsten is formed at the interface of the tungsten layer and the insulating layer. Further, the layer which includes an oxide of tungsten may be formed by processing a surface of the layer which includes tungsten using thermal oxidation treatment, oxygen plasma treatment, $N_2O$ plasma treatment, treatment using a solution with strong oxidizing power, such as ozone water, treatment using water to which hydrogen has been added, or the like. This also applies when forming a layer including a nitride of tungsten, a layer including an oxynitride of tungsten, or a layer including a nitride oxide of tungsten. After forming the layer which includes tungsten, a silicon nitride layer, a silicon oxynitride layer, or a silicon nitride oxide layer may be formed over the layer which includes tungsten.

An oxide of tungsten is represented by $WO_x$, where x satisfies $2 \leq x \leq 3$. The x may be 2 ($WO_2$), 2.5 ($W_2O_5$), 2.75 ($W_4O_{11}$), 3 ($WO_3$), or the like.

Here; the tungsten film is formed by a sputtering method to a thickness of 20 nm to 100 nm, preferably 40 nm to 80 nm.

Although the separation film 402 is formed such that it is in contact with the substrate 401 in the above process, the present invention is not limited to this process. An insulating film which serves as a base may be formed such that it is in contact with the substrate 401 and the separation film 402 may be provided such that it is in contact with the insulating film.

The insulating film 403 can be formed in a similar manner to the insulating film 101. Here, the insulating film is formed by generating plasma in the flow of a dinitrogen monoxide gas to form a tungsten oxide film on a surface of the separation film 402, and then forming a silicon oxide film containing nitrogen by a plasma CVD method.

The thin film transistor 404 can be formed in a similar manner to the thin film transistors 225 to 227 shown in Embodiment Mode 2. The source and drain electrodes 406 can be formed similarly to the wirings 234 to 239 shown in Embodiment Mode 2.

The interlayer insulating film 405 and the insulating film 407 can be formed by applying and baking polyimide, acrylic, or a siloxane polymer. Alternatively, they may be formed using an inorganic compound by a sputtering method, a plasma CVD method, a coating method, a printing method, or the like as a single layer or a stacked layer. Representative examples of the inorganic compound include silicon oxide, silicon nitride, and silicon oxynitride.

Figure 14B:
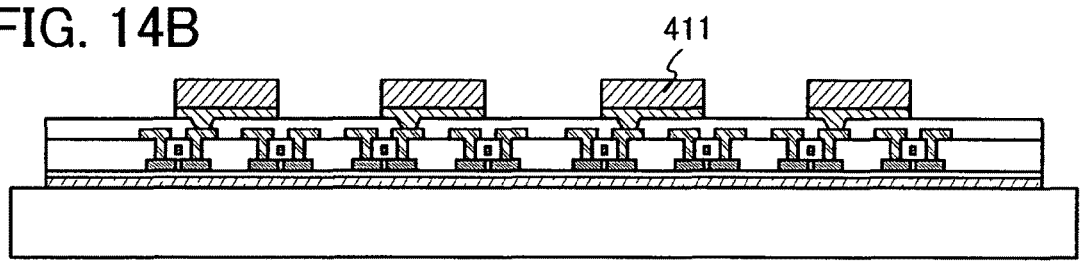

Next, as shown in FIG. 14B, a conductive film 411 is formed over the conductive film 408. Here, a composition including gold particles is printed by a printing method and heated at 200° C. for 30 minutes so that the composition is baked. Thus, the conductive film 411 is formed.

Figure 14C:
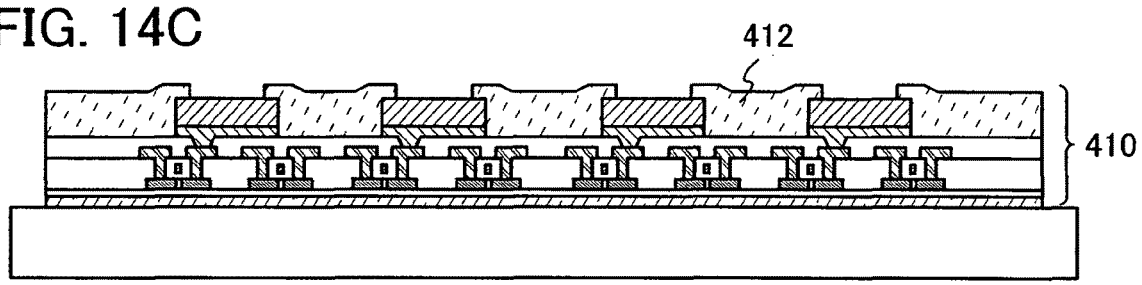

Next, as shown in FIG. 14C, an insulating film 412 which covers the insulating film 407 and end portions of the conductive film 411 is formed. Here, the insulating film 412 which covers the insulating film 407 and end portions of the conductive film 411 is formed using an epoxy resin. An epoxy resin composition is applied by a spin coating method and heated at 160° C. for 30 minutes. Then, a part of the insulating film which covers the conductive film 411 is removed to expose the conductive film 411. Thus, the insulating film 412 having a thickness of 1 μm to 20 μm, preferably 5 μm to 10 μm, is formed. Here, a stacked-layer body including from the insulating film 403 to the insulating film 412 is referred to as an element-forming layer 410.

Figure 14D:
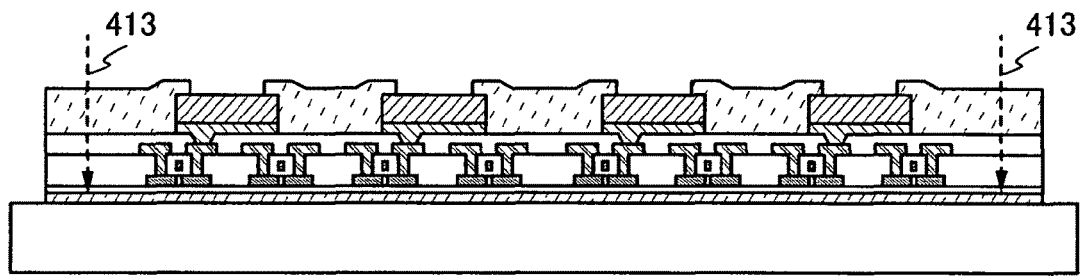
Figure 14E:
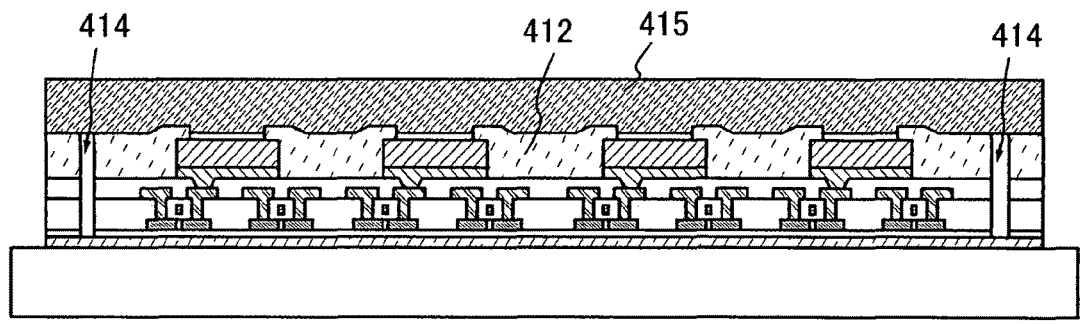

Next, as shown in FIG. 14D, the insulating films 403, 405, 407, and 412 are irradiated with a laser beam 413 to form opening portions 414 such as those shown in FIG. 14E, in order to facilitate a subsequent separation step. Next, an adhesive member 415 is attached to the insulating film 412. The laser beam used for irradiation to form the opening portions 414 is preferably a laser beam having a wavelength that is absorbed by the insulating films 403, 405, 407, and 412. Typically, a laser beam of an ultraviolet region, a visible region, or an infrared region is selected as appropriate and used for irradiation.

As a laser oscillator capable of emitting such a laser beam, an excimer laser such as an ArF excimer laser, a KrF excimer laser, or a XeCl excimer laser, or a laser oscillator similar to the laser oscillators 11a and 11b shown in Embodiment Mode 1 can be used as appropriate. Note that in the case of using a solid-state laser, preferably any one of the fundamental wave to the fifth harmonic is used, as appropriate. As a result of the laser irradiation, the insulating films 403, 405, 407, and 412 absorb the laser beam and melt, and thus, the opening portions are formed.

As a result of the laser irradiation, the insulating films 403, 405, 407, and 412 absorb the laser beam 413 and melt, and thus, the opening portions are formed. Note that when the process step of irradiating the insulating films 403, 405, 407, and 412 with the laser beam 413 is omitted, throughput can be improved.

Figure 15A:
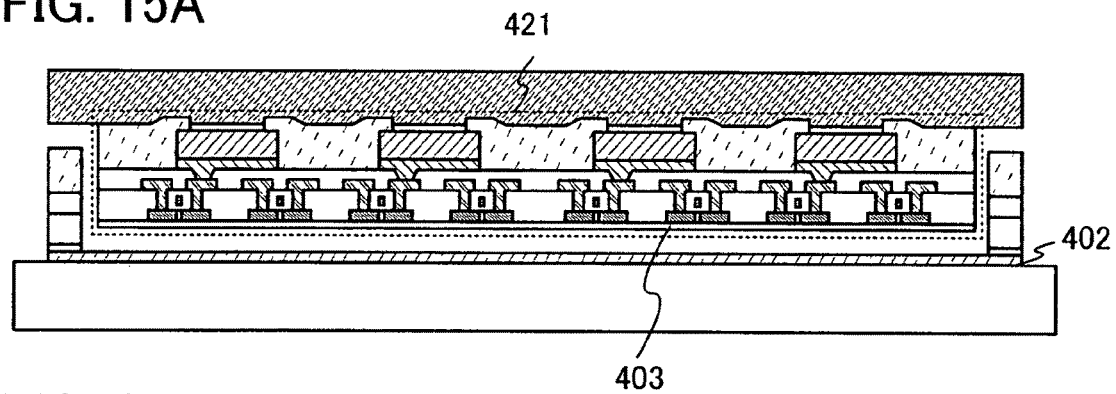
FIGS. 15A to 15D are cross-sectional views explaining a method for manufacturing a semiconductor device of the present invention.

Next, as shown in FIG. 15A, a part 421 of the element-forming layer is separated from the substrate 401 having the separation film by a physical means at a metal oxide film formed at the interface of the separation film 402 and the insulating film 403. A 'physical means' here refers to a dynamic means or a mechanical means which changes some kind of dynamic energy (or mechanical energy). A typical physical means refers to the application of mechanical power (for example, pulling by a human hand or a gripping tool, or separating while rolling a roller).

In this embodiment mode, a method is used, in which a metal oxide film is formed between a separation film and an insulating film and a physical means is used to separate the element-forming layer 410 at the metal oxide film. However, the present invention is not limited thereto. A method can be used, in which a light-transmitting substrate is used as the substrate and an amorphous silicon layer containing hydrogen is used as the separation film. In such a method, after the step in FIG. 14E, the amorphous silicon film is irradiated with a laser beam from the substrate side to vaporize hydrogen contained in the amorphous silicon film, and separation occurs between the substrate and the separation film.

Further, after the step in FIG. 14E, alternatively, a method of removing the substrate by mechanical polishing, or a method of removing the substrate by using a solution such as HF which dissolves the substrate can be employed. In such a case, it is not necessary to use a separation film.

Further, a method can be used, in which, before attaching the adhesive member 415 to the insulating film 412 in FIG. 14E, a fluoride gas such as $NF_3$, $BrF_3$, or $ClF_3$ is introduced into the opening portions 414 so that the separation film is etched away by the fluoride gas; then, the adhesive member 415 is attached to the insulating film 412; and then, the element-forming layer 410 is separated from the substrate.

Further, a method can be used, in which, before attaching the adhesive member 415 to the insulating film 412 in FIG. 14E, a fluoride gas such as $NF_3$, $BrF_3$, or $ClF_3$ is introduced into the opening portions 414 so that the separation film is partially etched away by the fluoride gas; then, the adhesive member 415 is attached to the insulating film 412; and then, the element-forming layer 410 is separated from the substrate by a physical means.

Figure 15B:
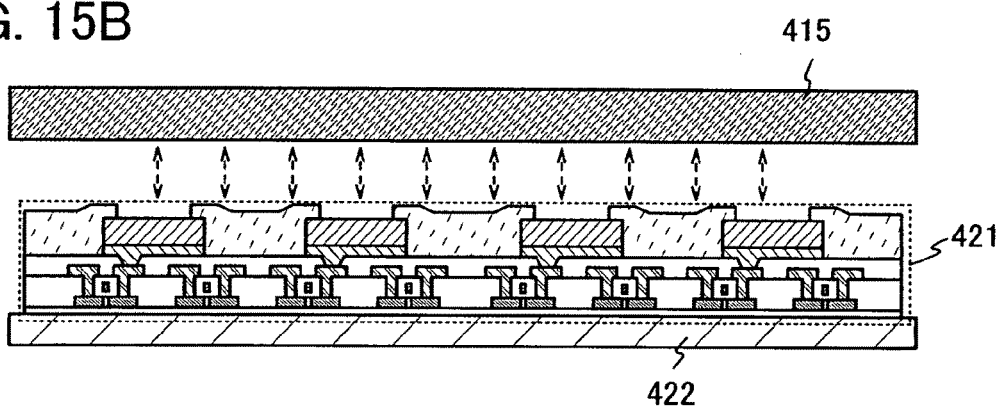

Next, as shown in FIG. 15B, a flexible substrate 422 is attached to the insulating film 403 in the part 421 of the element-forming layer. Then, the adhesive member 415 is separated from the part 421 of the element-forming layer. Here, a film formed of polyaniline by a cast method is used as the flexible substrate 422.

Figure 15C:
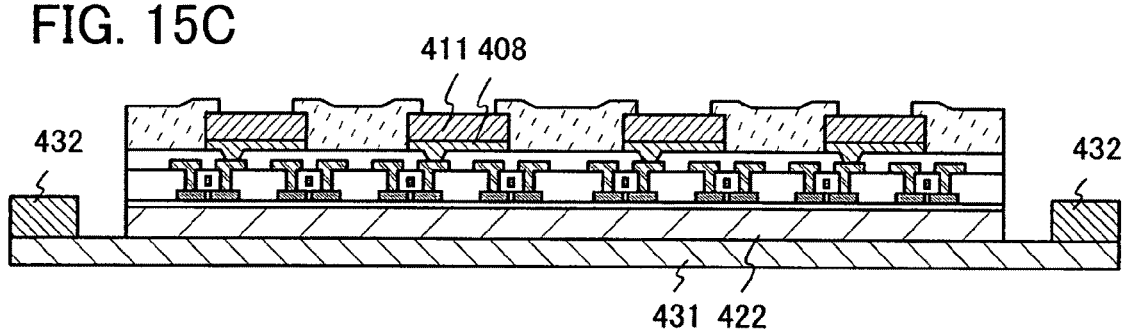

Then, the flexible substrate 422 is attached to a UV sheet 431 of a dicing frame 432, as shown in FIG. 15C. Since the UV sheet 431 is adhesive, the flexible substrate 422 is fixed on the UV sheet 431. Then, the conductive film 411 may be irradiated with a laser beam to increase adhesiveness between the conductive film 411 and the conductive film 408.

Figure 15D:
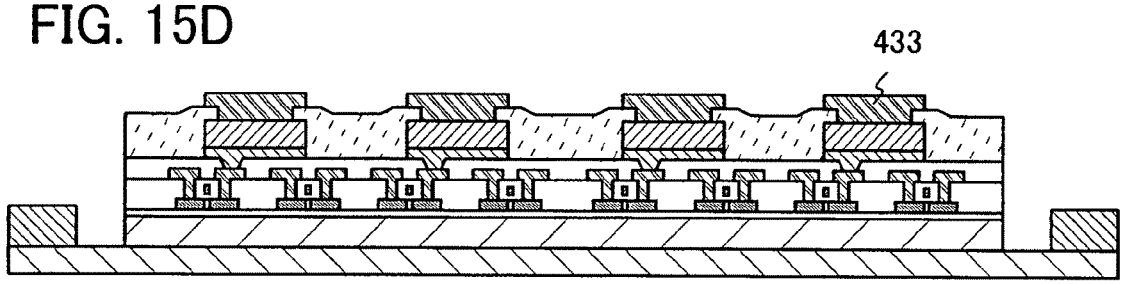

Next, a connection terminal 433 is formed over the conductive film 411, as shown in FIG. 15D. By forming the connection terminal 433, alignment and adhesion with a conductive film which subsequently functions as an antenna can be performed easily.

Figure 16A:
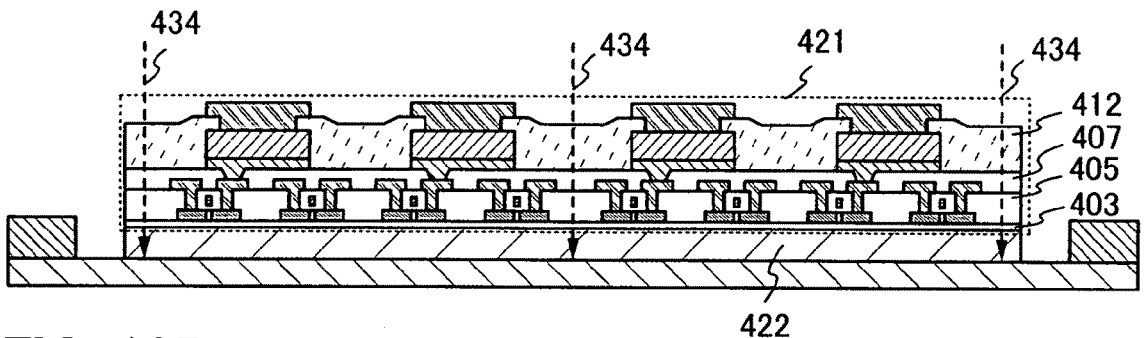
FIGS. 16A to 16C are cross-sectional views explaining a method for manufacturing a semiconductor device of the present invention.
Figure 16B:
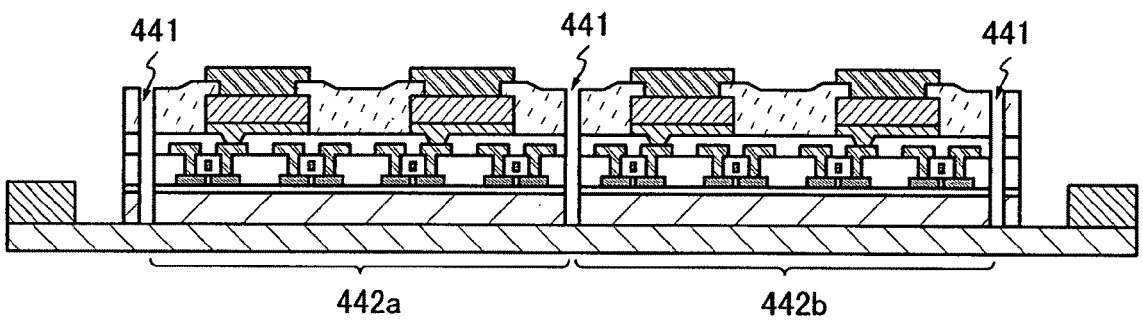

Next, as shown in FIG. 16A, the part 421 of the element-forming layer is divided into parts. Here, the part 421 of the element-forming layer is divided into plural parts as shown in FIG. 16B, by irradiating the part 421 of the element-forming layer and the flexible substrate 422 with a laser beam 434. As the laser beam 434, any of the laser beams described above which may be used for the laser beam 413 can be used as appropriate. Here, preferably, a laser beam which can be absorbed by the insulating films 403, 405, 407, and 412, and the flexible substrate 422 is selected. Note that although the part of the element-forming layer is divided into plural parts by a laser cutting method here, a dicing method, a scribing method, or the like can be used instead as appropriate. The element-forming layer which has been divided into parts is shown as thin film integrated circuits 442a and 442b.

Figure 16C:
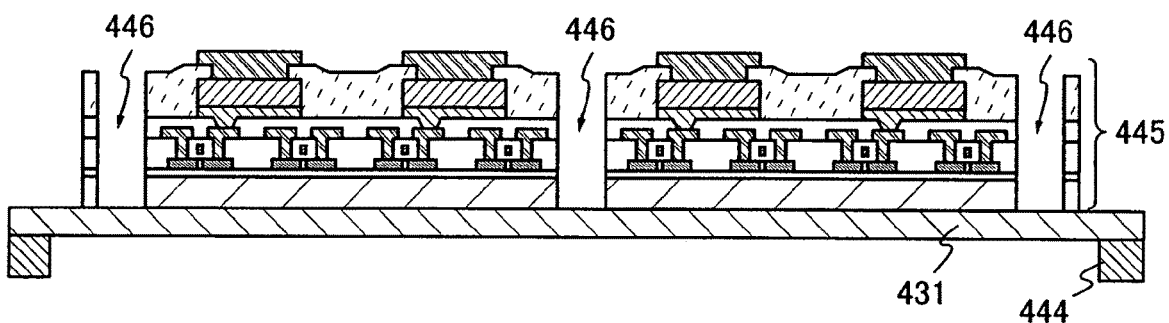

Next, as shown in FIG. 16C, the UV sheet of the dicing frame 432 is irradiated with UV light to decrease the adhesiveness of the UV sheet 431. Then, the UV sheet 431 is supported by an expander frame 444. At this time, by supporting the UV sheet 431 with the expander frame 444 while stretching the UV sheet 431, the width of a groove 441 which is formed between the thin film integrated circuits 442a and 442b can be increased. Note that preferably, with an expanded groove 446, the size of an antenna substrate which is subsequently attached to the thin film integrated circuits 442a and 442b can be obtained.

Figure 17A:
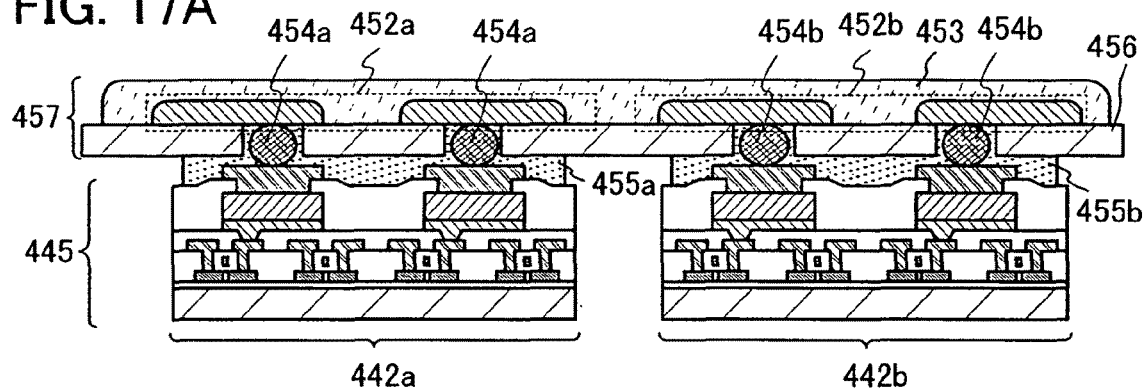
FIGS. 17A to 17D are cross-sectional views explaining a method for manufacturing a semiconductor device of the present invention.

Next, as shown in FIG. 17A, a flexible substrate 456 having conductive films 452a and 452b which function as antennas is attached to the thin film integrated circuits 442a and 442b using anisotropic conductive adhesives 455a and 455b. Note that the flexible substrate 456 having the conductive films 452a and 452b which function as antennas is provided with opening portions so as to partially expose the conductive films 452a and 452b. Accordingly, the flexible substrate 456 is attached to the thin film integrated circuits 442a and 442b while adjusting their positions such that the conductive films 452a and 452b which function as antennas are connected to connection terminals of the thin film integrated circuits 442a and 442b by conductive particles 454a and 454b which are included in the anisotropic conductive adhesives 455a and 455b.

Here, the conductive film 452a which functions as an antenna is connected to the thin film integrated circuit 442a by the conductive particles 454a within the anisotropic conductive adhesive 455a, while the conductive film 452b which functions as an antenna is connected to the thin film integrated circuit 442b by the conductive particles 454b within the anisotropic conductive adhesive 455b.

Figure 17B:
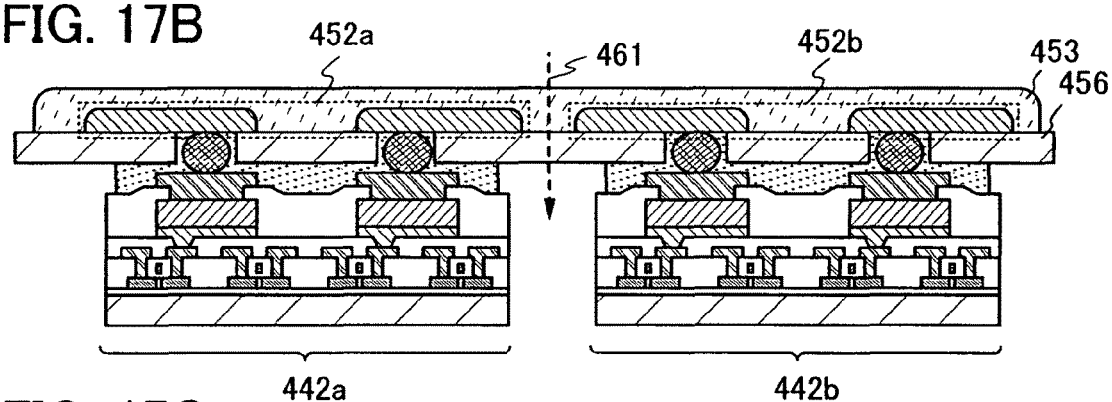

Then, as shown in FIG. 17B, the flexible substrate 456 and an insulating film 453 are divided into parts in a region where the conductive films 452a and 452b which function as antennas and the thin film integrated circuits 442a and 442b are not formed. Here, they are divided into parts by a laser cutting method in which the insulating film 453 and the flexible substrate 456 are irradiated with a laser beam 461.

Figure 17C:
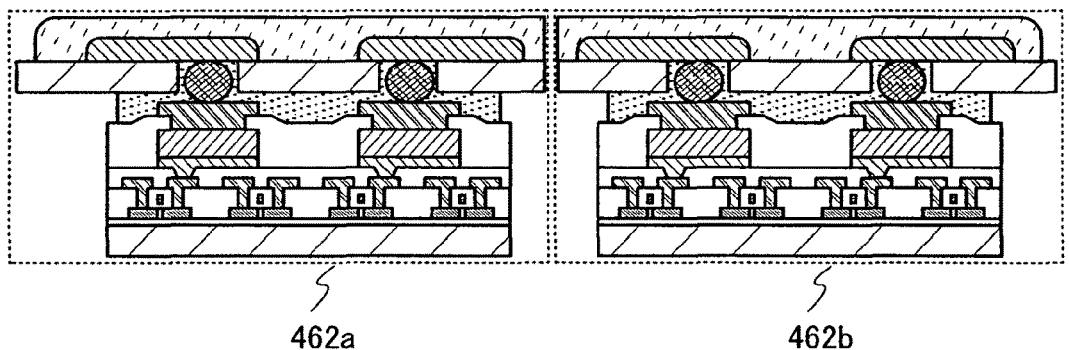

Through the above steps, semiconductor devices 462a and 462b which are capable of non-contact data transmission can be manufactured as shown in FIG. 17C.

Figure 17D:
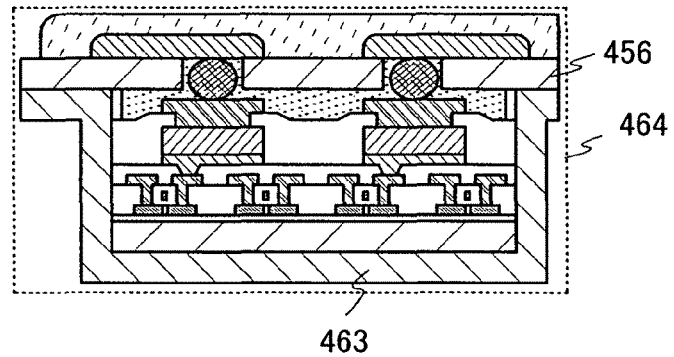

Note that a semiconductor device 464 such as the one shown in FIG. 17D may be manufactured in such a way that the flexible substrate 456 having the conductive films 452a and 452b which function as antennas is attached to the thin film integrated circuits 442a and 442b using the anisotropic conductive adhesives 455a and 455b in FIG. 17A; then, a flexible substrate 463 is provided so as to seal the flexible substrate 456 and the thin film integrated circuits 442a and 442b; and the region where the conductive films 452a and 452b which function as antennas and the thin film integrated circuits 442a and 442b are not formed is irradiated with the laser beam 461, as shown in FIG. 17B. In this case, the thin film integrated circuits are sealed by the flexible substrates 456 and 463 which have been divided into parts. Therefore, deterioration of the thin film integrated circuits can be suppressed.

Through the above steps, a thin and lightweight semiconductor device can be manufactured with a high yield. In the thin film transistor of the semiconductor device, the width of the crystal grain can be greater than or equal to 0.5 μm and less than or equal to 10 μm, preferably greater than or equal to 1 μm and less than or equal to 5 μm, and further, the crystal surface orientations can be aligned in one direction in the semiconductor layer. Therefore, variation in electric characteristics of the thin film transistor can be suppressed, and consequently, a highly reliable semiconductor device can be manufactured.

Figure 18:
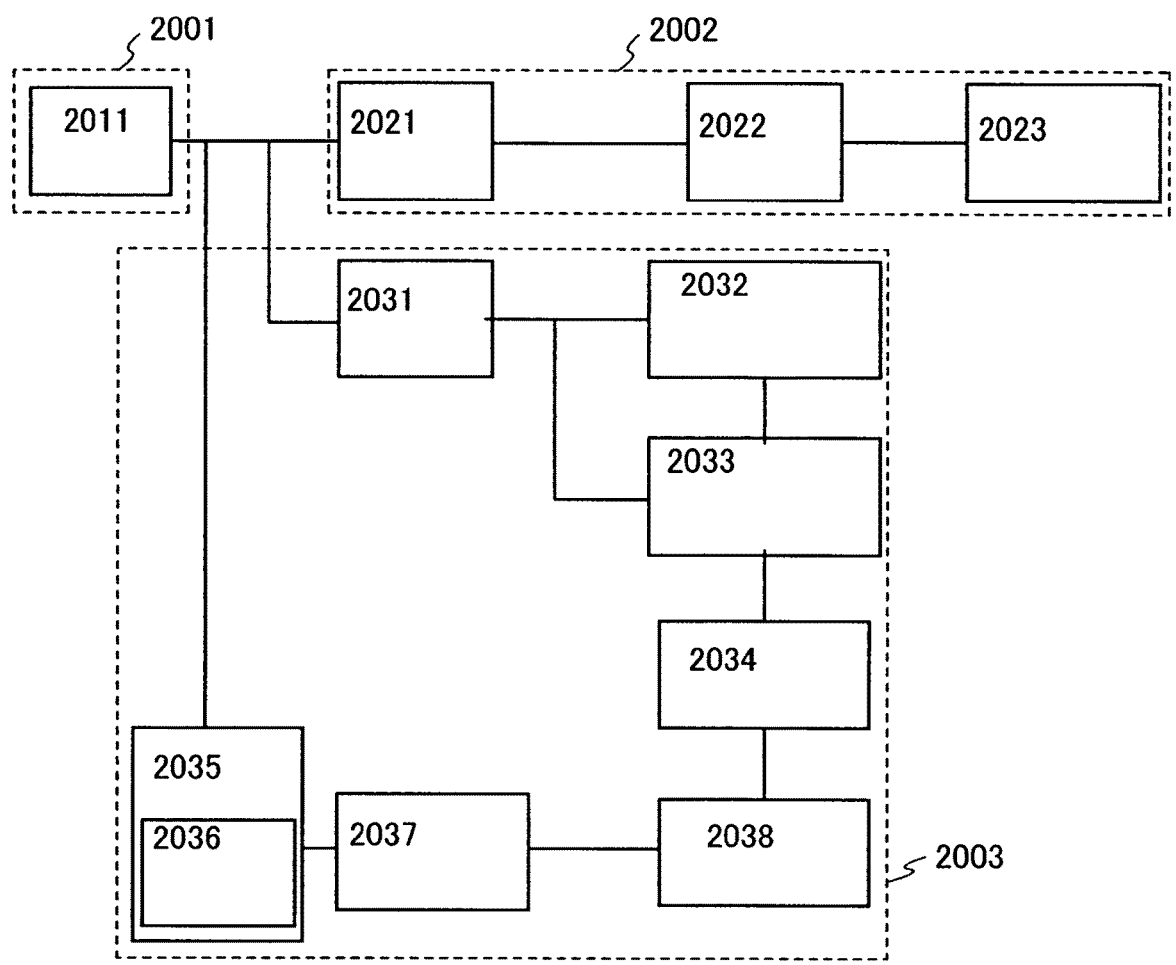
FIG. 18 is a diagram explaining a structure of a semiconductor device of the present invention.
Figure 19A:
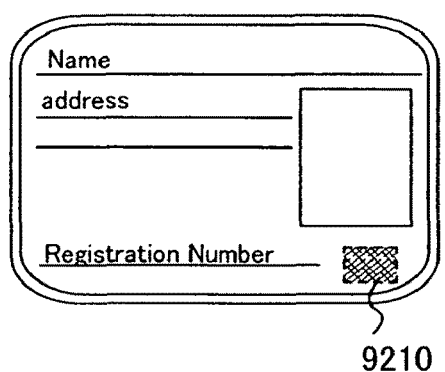
FIGS. 19A to 19F are views explaining applications of a semiconductor device of the present invention.
Figure 19B:
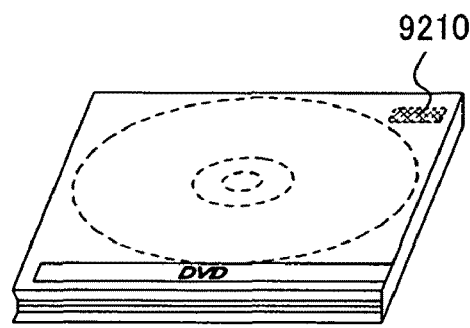
Figure 19C:
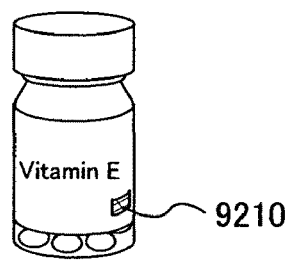
Figure 19D:
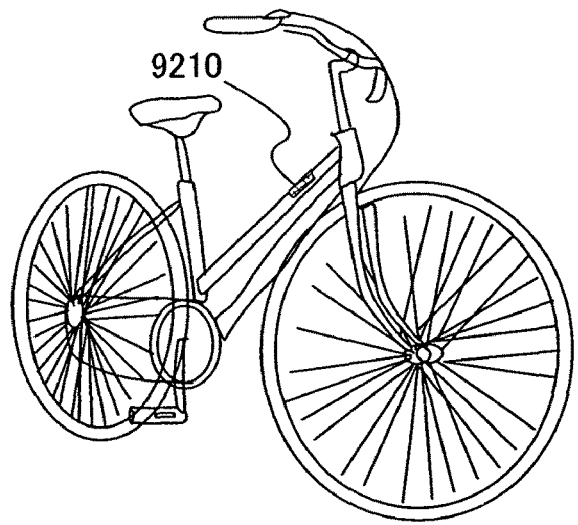
Figure 19E:
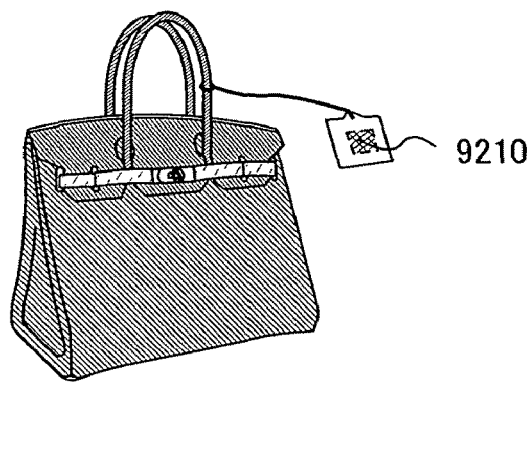
Figure 19F:
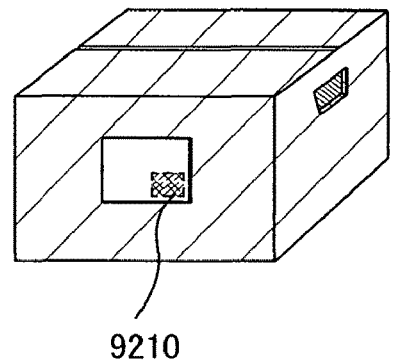

Next, a structure of the above-mentioned semiconductor device which is capable of non-contact data transmission will be described with reference to FIG. 18.

The semiconductor device of this embodiment mode includes an antenna portion 2001, a power supply portion 2002, and a logic portion 2003 as its main components.

The antenna portion 2001 includes an antenna 2011 which receives external signals and transmits data. The signal transmission method of the semiconductor device can be an electromagnetic coupling method, an electromagnetic induction method, a microwave method, or the like. The transmission method may be selected as appropriate taking an intended use of the device into account, and an antenna which is suitable for the transmission method may be provided.

The power supply portion 2002 includes a rectifier circuit 2021 which produces power based on a signal received from the outside through the antenna 2011, a storage capacitor 2022 for storing the produced power and a constant voltage circuit 2023 for generating a constant voltage to be supplied to each circuit.

The logic portion 2003 includes a demodulation circuit 2031 which demodulates a received signal, a clock generating/compensating circuit 2032 which generates a clock signal, a code recognition and determination circuit 2033, a memory controller 2034 which produces a signal for reading data from a memory based on a received signal, a modulation circuit 2035 for modulating an encoded signal to be transmitted, an encoder circuit 2037 which encodes the read data, and a mask ROM 2038 which stores data. Further, the modulation circuit 2035 has a resistor 2036 for modulation.

A code recognized and determined by the code recognition and determination circuit 2033 is a frame termination signal (EOF, End of Frame), a frame starting signal (SOF, Start of Frame), a flag, a command code, a mask length, a mask value, or the like. The code recognition and determination circuit 2033 also has a cyclic redundancy check (CRC) function for detecting transmission errors.

Next, applications of the above-described semiconductor device which is capable of non-contact data transmission will be described with reference to FIGS. 19A to 19F. The above-described semiconductor device which is capable of non-contact data transmission has a wide range of applications, such as bills, coins, securities, bearer bonds, documents (e.g., driver's licenses or resident's cards; refer to FIG. 19A), packaging containers (e.g., wrapping paper or bottles; refer to FIG. 19C), storage media (e.g., DVD software or video tapes; refer to FIG. 19B), means of transportation (e.g., bicycles; refer to FIG. 19D), personal belongings (e.g., shoes or glasses), food, plants, animals, human bodies, clothing, daily commodities, or tags on goods such as electronic appliances or on bags (refer to FIGS. 19E and 19F). An electronic appliance is, for example, a liquid crystal display device, an EL display device, a television device (also referred to as simply a television, or as a TV receiver or a television receiver), a portable telephone, or the like.

A semiconductor device 9210 of this embodiment mode may be fixed to an article by being mounted on a printed board, attached to a surface of the article, embedded in the article, and so on. For example, if the product is a book, the semiconductor device may be fixed to the book by embedding it inside paper of the book, and if the product is a package made of an organic resin, the semiconductor device may be fixed to the package by being embedded inside the organic resin. Since the semiconductor device 9210 of this embodiment mode can be compact, thin, and lightweight, the design quality of the article itself is not degraded even after the device is fixed to the article. Further, by providing bills, coins, securities, bearer bonds, documents, and the like with the semiconductor device 9210 of this embodiment mode, they can be provided with an identification function, and forgery can be prevented by making use of the identification function. Moreover, when the semiconductor device of this embodiment mode is provided in containers for packaging, recording media, personal belongings, food, clothes, daily commodities, electronic appliances, and the like, systems such as inspection systems can be made more efficient.

Embodiment Mode 5

Examples of electronic appliances having a semiconductor device described in the above embodiment modes include television devices (also referred to as simply televisions, or as television receivers), cameras such as digital cameras or digital video cameras, portable telephone devices (also referred to as simply portable telephones, or mobile phones), portable information terminals such as PDAs, portable game machines, monitors for computers, computers, sound reproducing devices such as car audio devices, image reproducing devices equipped with a recording medium, such as home-use game machines, or the like. Specific examples of these are described with reference to FIGS. 20A to 20F.

Figure 20A:
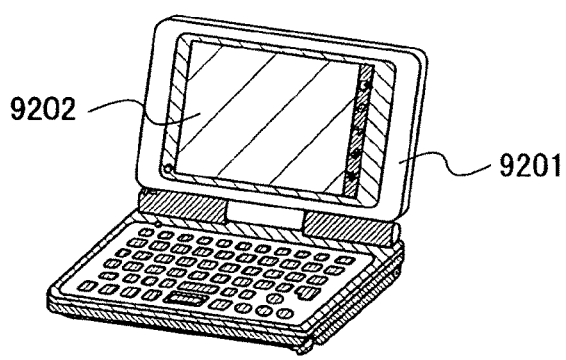
FIGS. 20A to 20F are views explaining electronic appliances using a semiconductor device of the present invention.

A portable information terminal shown in FIG. 20A includes a main body 9201, a display portion 9202, and the like. By employing the semiconductor device shown in the above embodiment modes in the display portion 9202, a portable information terminal capable of high-definition display can be provided at a low price.

Figure 20B:
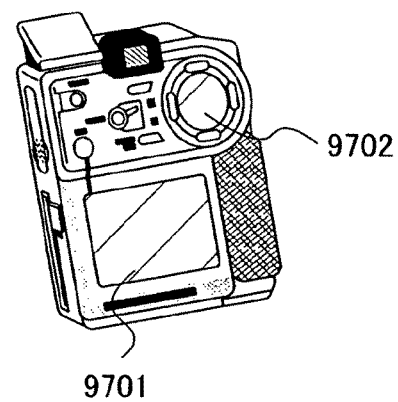

A digital video camera shown in FIG. 20B includes a display portion 9701, a display portion 9702, and the like. By employing the semiconductor device described in the above embodiment modes in the display portion 9701, a digital video camera capable of high-definition display can be provided at a low price.

Figure 20C:
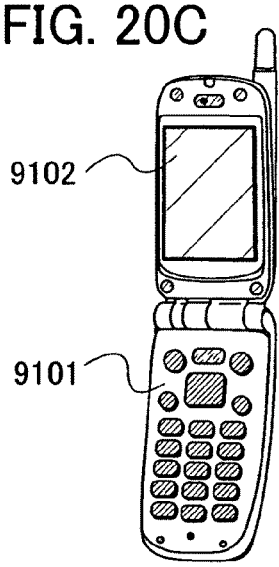

A portable terminal shown in FIG. 20C includes a main body 9101, a display portion 9102, and the like. By employing the semiconductor device shown in the above embodiment modes in the display portion 9102, a portable terminal with high reliability can be provided at a low price.

Figure 20D:
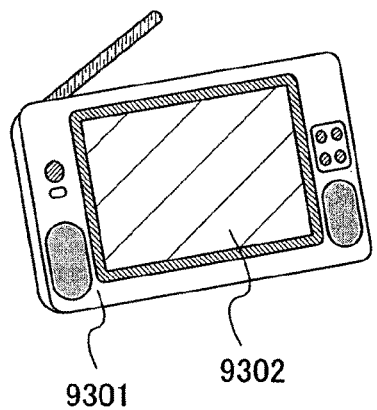

A portable television device shown in FIG. 20D includes a main body 9301, a display portion 9302, and the like. By employing the semiconductor device shown in the above embodiment modes in the display portion 9302, a portable television device capable of high-definition display can be provided at a low price. Such a television device can be applied to a wide range of television devices, from small-sized devices that are mounted on portable terminals such as portable phones to medium-sized devices that are portable and large-sized devices (for example, 40 inches or more).

Figure 20E:
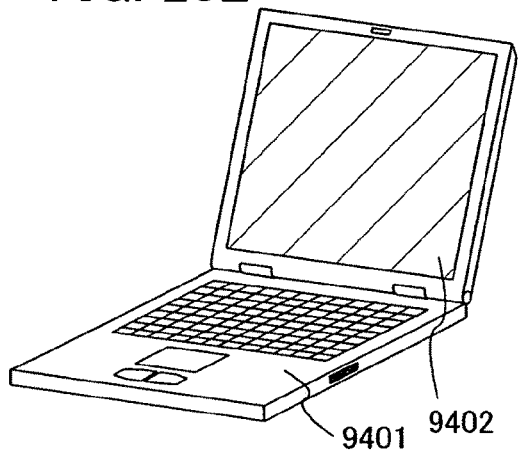

A portable computer shown in FIG. 20E includes a main body 9401, a display portion 9402, and the like. By employing the semiconductor device shown in the above embodiment modes in the display portion 9402, a portable computer capable of high-definition display can be provided at a low price.

Figure 20F:
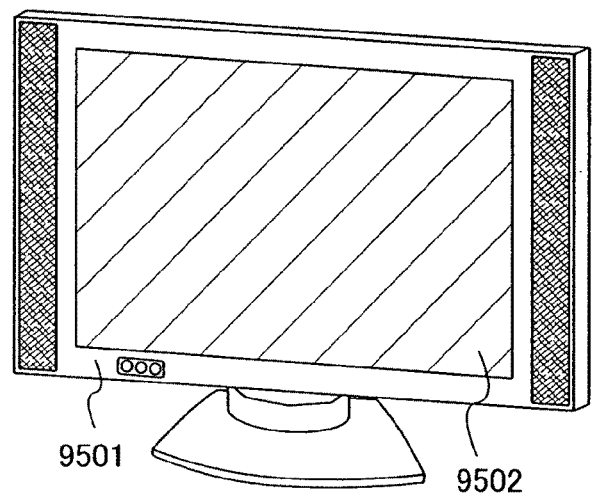

A television device shown in FIG. 20F includes a main body 9501, a display portion 9502, and the like. By employing the semiconductor device shown in the above embodiment modes in the display portion 9502, a television device capable of high-definition display can be provided at a low price.

A structure of the television device will now be described with reference to FIG. 21.

Figure 21:
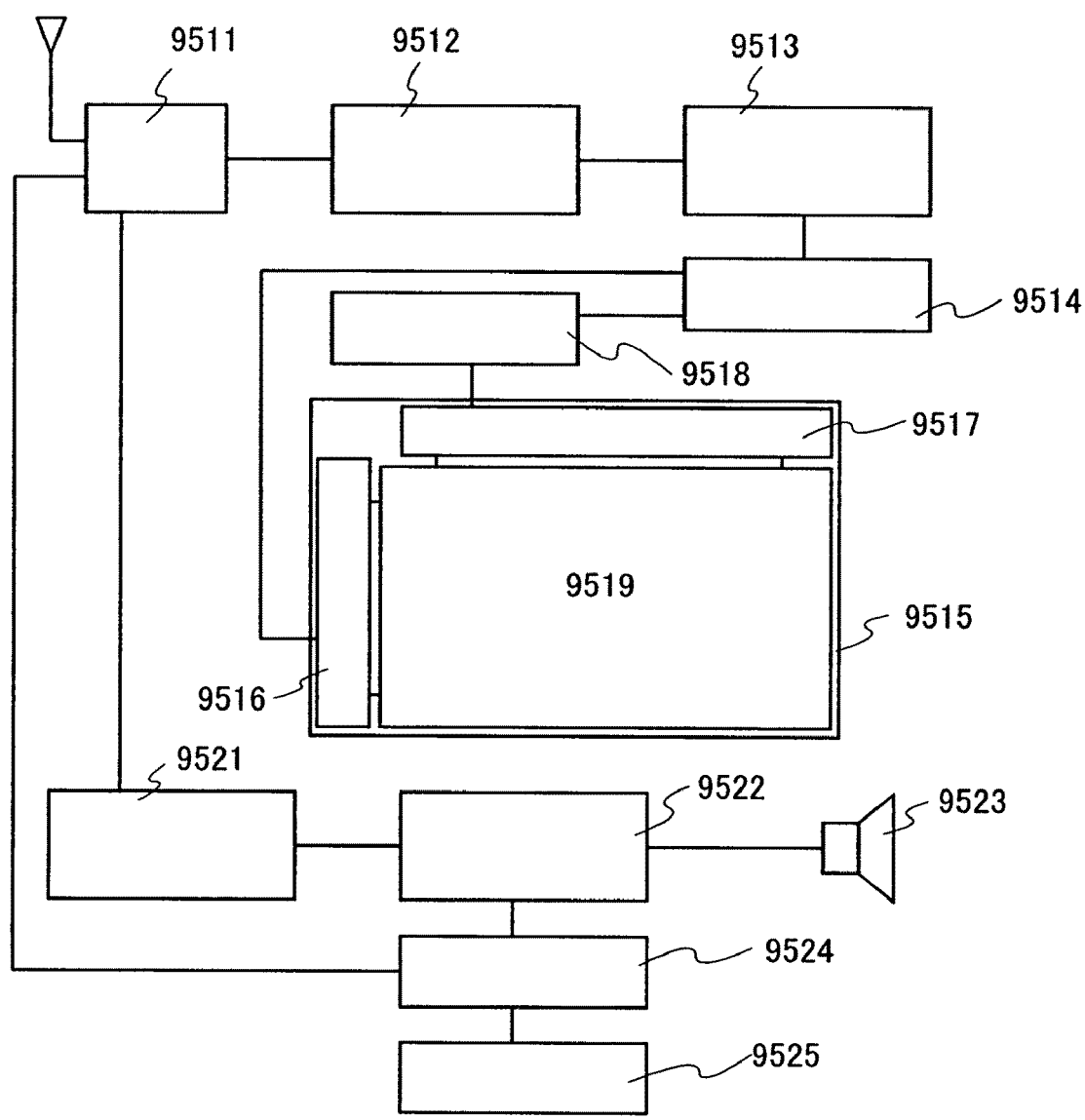
FIG. 21 is a diagram explaining a structure of an electronic appliance using a semiconductor device of the present invention.

FIG. 21 is a block diagram showing the main structure of the television device. A tuner 9511 receives a video signal and an audio signal. The video signal is processed through a video detection circuit 9512, a video signal processing circuit 9513 which converts the signal output from the video detection circuit 9512 into a color signal corresponding to red, green, or blue, and a control circuit 9514 for converting the video signal in accordance with input specifications of a driver IC. The control circuit 9514 outputs signals to a scanning line driver circuit 9516 and a signal line driver circuit 9517 of a display panel 9515. In the case where digital driving is used, a signal dividing circuit 9518 may be provided on a signal line side so that the input digital signal is divided into m number of signals to be supplied. The scanning line driver circuit 9516 and the signal line driver circuit 9517 are circuits for driving a pixel portion 9519.

Of the signals received by the tuner 9511, the audio signal is sent to an audio detection circuit 9521 and its output is supplied to a speaker 9523 through an audio signal processing circuit 9522. A control circuit 9524 receives control information on a receiving station (a receiving frequency), sound volume, and the like from an input portion 9525, and sends signals to the tuner 9511 and the audio signal processing circuit 9522.

By forming the television device so as to include the display panel 9515, the television device can have low power consumption. Further, a television device which can display high-definition images can be manufactured.

The present invention is not limited to television receivers, and can be applied to various uses, for example to display mediums, particularly ones with a large area, such as an information display board at a railway station, an airport, or the like, or an advertisement display board on the street, as well as to monitors of personal computers.

Figure 22:
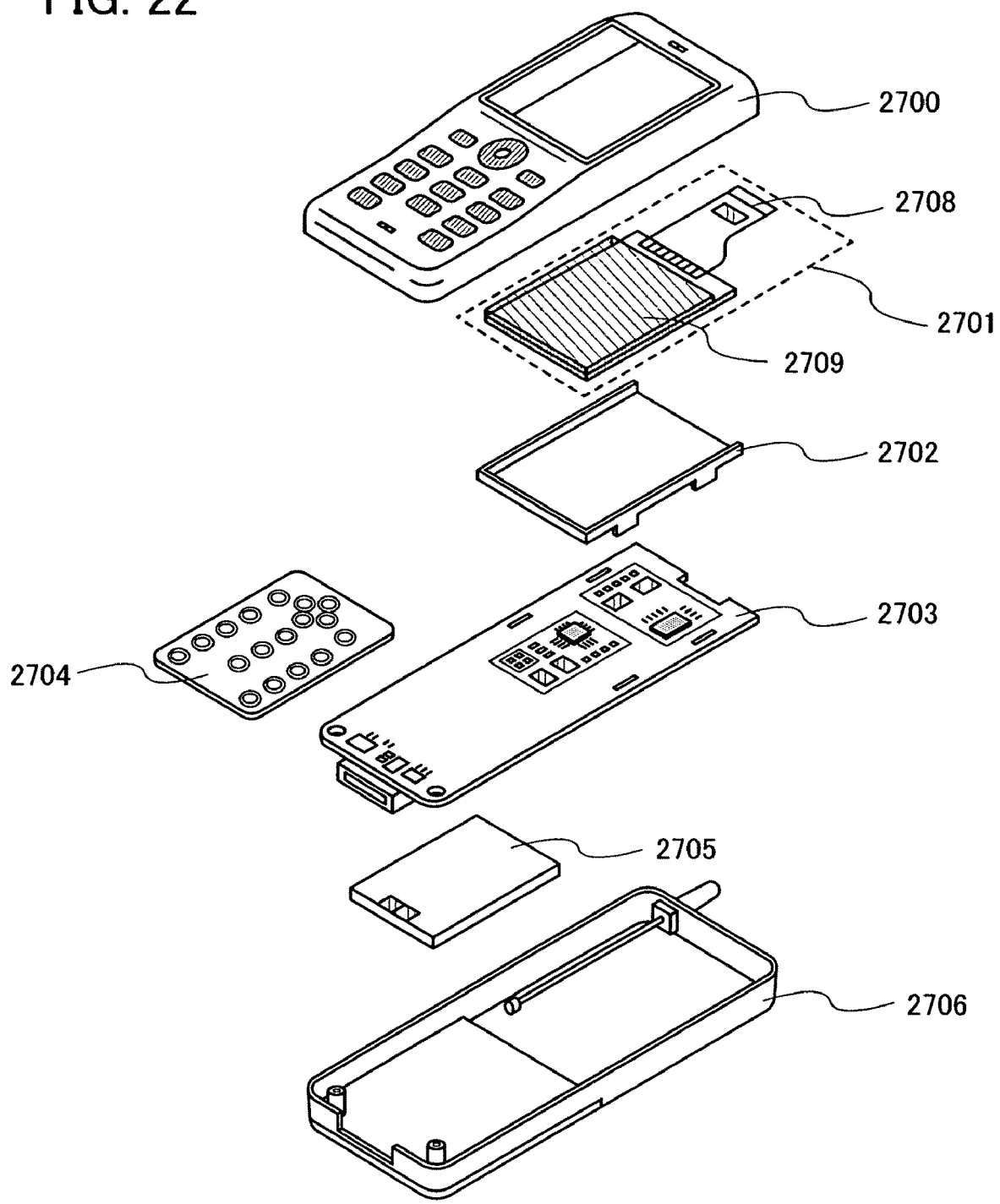
FIG. 22 is an exploded view of an electronic appliance using a semiconductor device of the present invention.

Next, a portable phone appliance is described as a mode of an electronic appliance to which the semiconductor device of the present invention is mounted, with reference to FIG. 22. The portable phone appliance includes cases 2700 and 2706, a display panel 2701, a housing 2702, a printed wiring board 2703, operation buttons 2704, and a battery 2705 (refer to FIG. 22). The display panel 2701 is detachably incorporated into the housing 2702, and the housing 2702 is fitted to the printed wiring board 2703. The shape and size of the housing 2702 are changed as appropriate in accordance with the electronic appliance into which the display panel 2701 is incorporated. A plurality of semiconductor devices that are packaged are mounted on the printed wiring board 2703. The semiconductor device of the present invention can be used as one of them. The plurality of semiconductor devices mounted on the printed wiring board 2703 have functions such as the function of a controller, a central processing unit (CPU), a memory, a power supply circuit, an audio processing circuit, a sending/receiving circuit, and the like.

The display panel 2701 is connected to the printed wiring board 2703 through a connection film 2708. The display panel 2701, the housing 2702, and the printed wiring board 2703 are housed in the cases 2700 and 2706, together with the operation buttons 2704 and the battery 2705. A pixel region 2709 in the display panel 2701 is disposed such that it can be observed through a window opening provided in the case 2700.

Figure 23A:
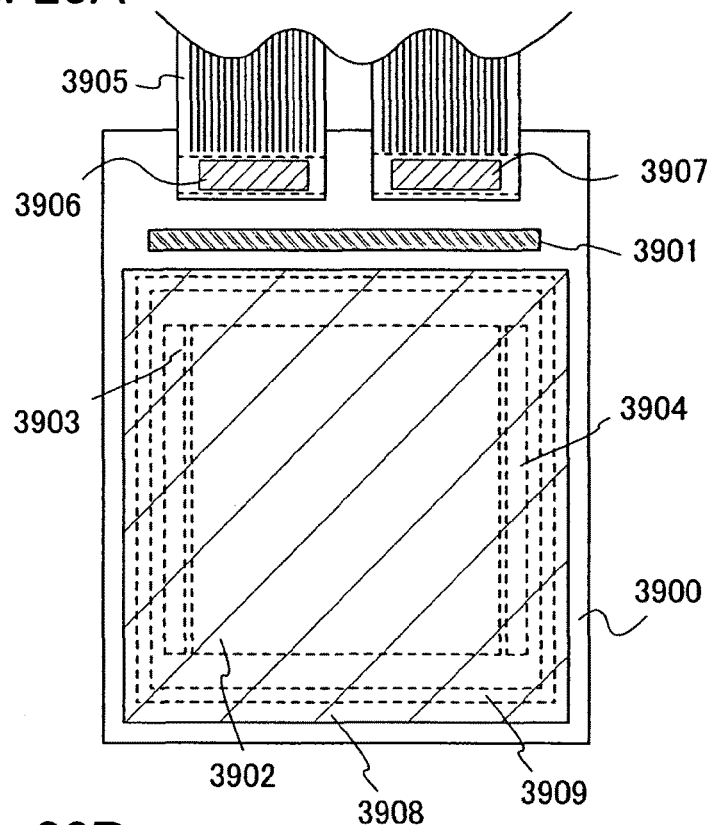
FIGS. 23A and 23B are top views explaining a semiconductor device of the present invention.

In the display panel 2701, a pixel portion and one or more peripheral driver circuits (in a plurality of driver circuits, the driver circuits which have a low operating frequency) may be formed over one substrate using TFTs, whereas some other peripheral driver circuits (in a plurality of driver circuits, the driver circuits which have a high operating frequency) may be formed over an IC chip. The IC chip may be mounted on the display panel 2709 using a COG (chip on glass) method, or the IC chip may be connected to a glass substrate by using a TAB (tape automated bonding) method or a printed board. Note that FIG. 23A shows an example of a structure of a display panel in which a pixel portion and one or more peripheral driver circuits are formed over one substrate and IC chips including some other peripheral driver circuits are mounted by a COG method or the like. The display panel shown in FIG. 23A includes a substrate 3900, a signal line driver circuit 3901, a pixel portion 3902, a scanning line driver circuit 3903, a scanning line driver circuit 3904, an FPC 3905, an IC chip 3906, an IC chip 3907, a sealing substrate 3908, and a sealant 3909. By employing such a structure, the power consumption of a display device can be reduced, and a portable phone appliance can be used for a longer period per charge. Further, the cost of a portable phone appliance can be reduced.

Figure 23B:
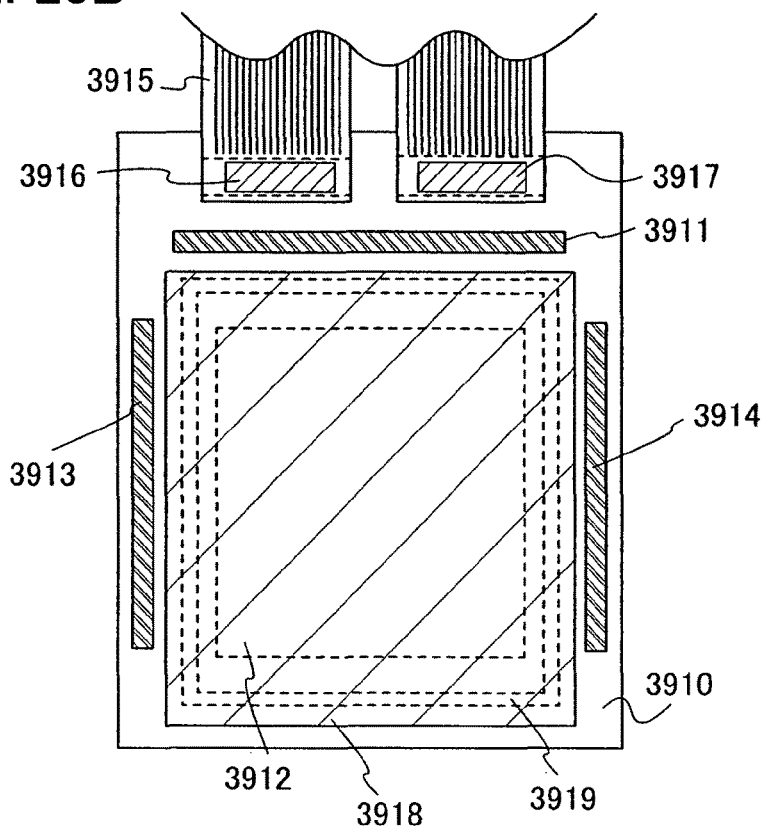

In order to further reduce power consumption, a pixel portion may be formed over a substrate using TFTs and all the peripheral driving circuits may be formed over an IC chip, and then the IC chip may be mounted on a display panel using a COG (chip on glass) method, or the like, as shown in FIG. 23B. A display panel shown in FIG. 23B includes a substrate 3910, a signal line driver circuit 3911, a pixel portion 3912, a scanning line driver circuit 3913, a scanning line driver circuit 3914, an FPC 3915, an IC chip 3916, an IC chip 3917, a sealing substrate 3918, and a sealant 3919.

As described above, the semiconductor device of the present invention is compact, thin, and lightweight. With these features, the limited space within the cases 2700 and 2706 of the electronic appliance can be used efficiently. Further, cost reduction is possible, and an electronic appliance having a semiconductor device with high reliability can be manufactured.

Embodiment 1

Hereinafter, the present invention will be described in more detail based on an embodiment, but the present invention is not limited to this embodiment and specified by the scope of claims.

A method for manufacturing a crystalline silicon film of Embodiment 1 will be described with reference to FIGS. 1A to 1C.

A base film (insulating film) 101, a semiconductor film 102, and a cap film 103 were formed over a substrate 100 as already described with reference to FIGS. 1A to 1D in Embodiment Mode 1. As shown in FIG. 1B, the semiconductor film 102 was irradiated with a laser beam 105 through the cap film 103 to crystallize the semiconductor film 102, whereby a crystalline semiconductor film 106 was formed.

As the substrate 100, a glass substrate having a thickness of 0.7 mm manufactured by Corning, Inc. was used. A stacked film of a silicon nitride film containing oxygen and a silicon oxide film containing nitrogen was formed as the insulating film 101 by using a parallel-plate plasma CVD apparatus.

The deposition conditions were as follows.

<Silicon Nitride Film Containing Oxygen>
  Thickness: 50 nm
  Type of gas (flow rate): $SiH_4$ (10 sccm), $NH_3$ (100 sccm), $N_2O$ (20 sccm), $H_2$ (400 sccm)
  Substrate temperature: 330° C.
  Pressure: 40 Pa
  RF frequency: 27 MHz
  RF power: 50 W
  Distance between electrodes: 30 mm
  Electrode area: 615.75 $cm^2$ <Silicon Oxide Film Containing Nitrogen>
  Thickness: 100 nm
  Type of gas (flow rate): $SiH_4$ (4 sccm), $N_2O$ (800 sccm)
  Substrate temperature: 400° C.
  Pressure: 40 Pa
  RF frequency: 27 MHz
  RF power: 50 W
  Distance between electrodes: 15 mm
  Electrode area: 615.75 $cm^2$ As the semiconductor film 102, an amorphous silicon film was formed by using a parallel-plate plasma CVD apparatus. The deposition conditions of the amorphous silicon film were as follows.

<Amorphous Silicon Film>
  Thickness: 66 nm
  Type of gas (flow rate): $SiH_4$ (25 sccm), $H_2$ (150 sccm)
  Substrate temperature: 250° C.
  Pressure: 66.7 Pa
  RF frequency: 27 MHz RF power: 50 W
Distance between electrodes: 25 mm
Electrode area: 615.75 cm$^2$ After the amorphous silicon film was formed under the above deposition conditions, the substrate was heated at 500° C. for 1 hour and at 550° C. for 4 hours in an electric furnace. In this heat treatment, the amorphous silicon film was dehydrogenated. Note that the reason for dehydrogenation is to prevent a hydrogen gas from jetting out from the amorphous silicon film when it is irradiated with a laser beam, and this heat treatment may be omitted if the amount of hydrogen contained in the amorphous silicon film is small.

After the heat treatment, a silicon nitride film containing oxygen was formed over the semiconductor film 102 as the cap film 103 by using a parallel-plate plasma CVD apparatus. The deposition conditions were as follows.

<Silicon Nitride Film Containing Oxygen>
Thickness: 300 nm
Type of gas (flow rate): SiH$_4$ (10 sccm), NH$_3$ (100 sccm), N$_2$O (20 sccm), H$_2$ (400 sccm)
Substrate temperature: 300° C.
Pressure: 40 Pa
RF frequency: 27 MHz
RF power: 50 W
Distance between electrodes: 30 mm
Electrode area: 615.75 cm$^2$ Table 1 shows compositions of the insulating film 101 and the cap film 103 that were obtained. The values of the compositions of the films in Table 1 are those in a state before heat treatment or laser irradiation. The composition ratios were measured using Rutherford backscattering spectrometry (RBS) and hydrogen forward scattering (HFS). The measurement sensitivity was approximately ±2%.

TABLE 1

| Material | | Composition ratio (%) | | | |
|---|---|---|---|---|---|
| | | Si | N | O | H |
| Silicon Nitride Film Containing Oxygen | Cap film in embodiment/Lower layer of base film | 32.2 | 45.5 | 5.2 | 17.2 |
| Silicon Oxide Film Containing Nitrogen | Upper layer of base film | 32.6 | 0.2 | 65.8 | 1.4 |

After the cap film 103 was formed, the substrate was heated at 500° C. for 1 hour in an electric furnace. In this heat treatment, the silicon nitride film containing oxygen that was a cap film was dehydrogenated. Note that the reason for dehydrogenation was to prevent a hydrogen gas from jetting out from the silicon nitride film containing oxygen when it is irradiated with a laser beam, and this heat treatment may be omitted if the amount of hydrogen contained in the cap film is small.

The amorphous silicon film was irradiated with a laser beam from a laser irradiation apparatus through the cap film 103 and was crystallized, thereby forming a crystalline silicon film. Although the laser irradiation apparatus used at that time has been already described in Embodiment Mode 1, the brief description thereof is repeated here with reference to FIG. 7.

As shown in FIG. 7, the laser irradiation apparatus includes two laser oscillators 11a and 11b and can perform irradiation with a laser beam 12 that is obtained by combining laser beams 12a and 12b emitted from the laser oscillators 11a and 11b, respectively.

The polarization direction of the laser beam 12b emitted from the laser oscillator 11b is changed through a wavelength plate 13. This is in order to combine two laser beams having different polarization directions by a polarizer 14. After the laser beam 12b passes through the wavelength plate 13, the laser beam 12b is reflected by a mirror 22 and made to enter the polarizer 14. Then, the laser beam 12a and the laser beam 12b are combined by the polarizer 14. The wavelength plate 13 and the polarizer 14 are adjusted so that the combined laser beam 12 has suitable energy.

The laser beam 12 that is combined by the polarizer 14 is reflected by the mirror 15, and is shaped so as to have a linear cross-sectional shape through a cylindrical lens 16 and a cylindrical lens 17. The cylindrical lens 16 acts in a length direction of a beam spot formed on an irradiated surface, and the cylindrical lens 17 acts in a width direction thereof.

The laser irradiation apparatus includes a suction stage 19 to which a substrate is fixed, and the suction stage 19 can be moved in X-Y directions by a X-axis one-axis robot 20 and a Y-axis one-axis robot 21. As discussed above, the substrate over which the insulating film 101, the semiconductor film 102, and the cap film 103 were formed was fixed to the suction stage 19, and was irradiated with a laser beam while the substrate was moved along a width direction of a beam spot, that is, the X axis with a length direction of a linear laser beam aligned with the Y axis.

In this embodiment, the movement speed of the substrate was set to be 35 cm/sec. An LD excitation ND:YVO$_4$ laser was used as each of the two laser oscillators, and its second harmonic (wavelength: 532 nm) was used for irradiation. The laser beam had an intensity of 14 W on the irradiated surface and had a linear shape on the irradiated surface with a length of approximately 500 μm and a width of approximately 20 μm.

<Measurement of Crystalline Silicon Film>

EBSP measurement was carried out to confirm the position, size, and the surface orientation of the crystal grain of the crystalline silicon film. In order to carry out EBSP measurement, the cap film 103 was removed by etching from the surface of the crystalline silicon film. In the EBSP measurement, the crystal surface orientation was measured from on an EBSP image which is obtained by making an electron beam incident to the surface of the crystalline silicon film with an incidence angle of 60°.

The area of the measurement region was 50 μm×50 μm and the measurement pitch was 0.1 μm. EBSP images of three observation surfaces A to C which are perpendicular to one another as shown in FIG. 3 were measured. Vectors a to c in FIG. 3 indicate normal vectors of the observation surfaces A to C, respectively. The observation surface A is parallel to the substrate surface, which corresponds to the upper surface of the crystalline silicon film. The observation surface C is a surface where the normal vector c is parallel to the scanning direction of the laser beam. In accordance with pieces of information obtained from these three observation surfaces A to C, the crystal surface orientation of the crystalline silicon film can be specified with high precision.

FIGS. 4A to 4D, 5A to 5D, and 6A to 6C show analysis results of the crystal surface orientations (crystal axis orientations perpendicular to observation surfaces) of the crystalline silicon film. FIGS. 4A to 4C are orientation map images each showing distribution of the crystal surface orientations in the measurement area of 50 μm×50 μm, and a length of one side in each map image is 50 μm. FIG. 4D is an inverse pole figure of single crystal silicon, in which each color indicates an orientation.

Since FIGS. 4A to 4D are monochrome and the image is only displayed by lightness, distinction is difficult. However, in color display, it was found that an orientation of <001> is dominant at the observation surface A, an orientation of <301> is dominant at the observation surface B, and an orientation of <301> is dominant at the observation surface C. Further, it was found according to the shape and color of patterns of FIGS. 4A to 4C that the crystalline silicon film of this embodiment includes a domain which has a width of greater than or equal to 0.5 μm and less than or equal to 10 μm, preferably greater than or equal to 1 μm and less than or equal to 5 μm and is elongated long in a length direction. In FIGS. 4A to 4C, the length of each domain was 5 μm to 50 μm, and further, a domain having a length of 50 μm or more was also observed.

FIGS. 5A to 5C are inverse pole figures illustrating a distribution of fractions of crystal surface orientations at the observation surfaces A to C, and FIG. 5D is a scale showing fractions of the crystal surface orientations. Although FIGS. 5A to 5D are monochrome and the image is only displayed by lightness, so that distinction is difficult, according to the inverse pole figure in FIG. 5A, it was found that at the observation surface A, a proportion of the orientation of <001> is 14.0 times or more as high as that in the case where all orientations are provided with the same ratio. In addition, according to the inverse pole figure in FIG. 5B, it was confirmed that at the observation surface B, the orientation of <301> is the closest to black, and specifically, a proportion of the orientation of <301> is 4.8 times or more as high as that in the case where all orientations are provided with the same ratio. Moreover, according to the inverse pole figure in FIG. 5C, it was found that at the observation surface C, the orientation of <301> is the closest to black, and specifically, a proportion of the orientation of <301> is 4.8 times or more as high as that in the case where all orientations are provided with the same ratio.

Fractions of orientations with a high proportion in the inverse pole figures of FIGS. 5A to 5C were calculated, and the results are shown in FIGS. 6A to 6C. FIG. 6A shows a result obtained by calculating a fraction of the surface orientation at the observation surface A according to FIG. 5A. In the inverse pole figure in FIG. 5A, the angular deviation range of the orientation of <001> is set within ±10°, and a proportion of the number of the measurement points, where the angular deviation of the orientation <001> exists within ±10° with respect to all measurement points, was obtained.

A value of a proportion of the points having any orientation with respect to all measuring points is a value of Partition Fraction. Further, among the points having any orientation, a value of a proportion of the points having a specific orientation with respect to all measuring points is a value of Total Fraction. According to this result, at the observation surface A of the present invention, the orientation of <001> occupies 71.2% within the angular deviation range of +10°.

Similarly, FIGS. 6B and 6C are results obtained by calculating a fraction of the surface orientation at the observation surfaces B and C according to the inverse pole figures of FIGS. 5B and 5C, respectively. The angular deviation range of the orientation of <301> is set within ±10°, and a fraction of the surface orientation is obtained. It was found that the orientation of <301> occupies 71.1% and 73.9% at the observation surfaces B and C, respectively. Note that at the observation surfaces B and C, a fraction of the orientation of <301> is shown; however, the fraction of the orientation <401>, <501>, or <601> close to the orientation <301> may also be shown.

This application is based on Japanese Patent Application serial no. 2006-236078 filed in Japan Patent Office on Aug. 31, 2006, the entire contents of which are hereby incorporated by reference.

What is claimed is:

1. A method for manufacturing a semiconductor device, comprising the steps of:
    forming a first insulating film over a substrate;
    forming a semiconductor film over the insulating film;
    forming a second insulating film over the semiconductor film;
    after forming the second insulating film, irradiating the semiconductor film with a continuous wave laser beam through the second insulating film;
    melting and crystallizing the semiconductor film to form a crystalline semiconductor film having a crystal grain with a width of greater than or equal to 0.5 μm and less than or equal to 10 μm; and
    removing the second insulating film;
    patterning the crystallized semiconductor film to form at least one semiconductor island;
    forming a third insulating film over the semiconductor island; and
    forming a gate electrode over the semiconductor island with the third insulating film interposed therebetween,
    wherein an energy distribution of the laser beam is a Gaussian distribution; and
    wherein the semiconductor film is irradiated with the laser beam for a period of greater than or equal to 5 microseconds and less than or equal to 100 microseconds per region.

2. The method for manufacturing a semiconductor device according to claim 1, wherein a part of energy of the laser beam is greater than or equal to energy that can melt the semiconductor film.

3. The method for manufacturing a semiconductor device according to claim 1, wherein the thickness of the semiconductor film is greater than or equal to 20 nm and less than or equal to 200 nm.

4. The method for manufacturing a semiconductor device according to claim 1, wherein the second insulating film is a silicon nitride film having a thickness of greater than or equal to 200 nm and less than or equal to 1000 nm, containing oxygen at 0.1 atomic % to 10 atomic %, and having a composition ratio of nitrogen to silicon of greater than or equal to 1.3 and less than or equal to 1.5.

5. The method for manufacturing a semiconductor device according to claim 1, wherein the semiconductor film is an amorphous silicon film.

6. A method for manufacturing a semiconductor device, comprising the steps of:
    forming a first insulating film over a substrate;
    forming a semiconductor film over the insulating film;
    forming a second insulating film over the semiconductor film;
    after forming the second insulating film, irradiating the semiconductor film with a laser beam with a repetition rate of greater than or equal to 10 MHz through the second insulating film;
    melting and crystallizing the semiconductor film to form a crystalline semiconductor film having a crystal grain with a width of greater than or equal to 0.5 μm and less than or equal to 10 μm; and
    removing the second insulating film;
    patterning the crystallized semiconductor film to form at least one semiconductor island;

forming a third insulating film over the semiconductor island; and forming a gate electrode over the semiconductor island with the third insulating film interposed therebetween, wherein an energy distribution of the laser beam is a Gaussian distribution; and wherein the semiconductor film is irradiated with the laser beam for a period of greater than or equal to 5 microseconds and less than or equal to 100 microseconds per region.

7. The method for manufacturing a semiconductor device according to claim 6, wherein a part of energy of the laser beam is greater than or equal to energy that can melt the semiconductor film.

8. The method for manufacturing a semiconductor device according to claim 6, wherein the thickness of the semiconductor film is greater than or equal to 20 nm and less than or equal to 200 nm.

9. The method for manufacturing a semiconductor device according to claim 6, wherein the second insulating film is a silicon nitride film having a thickness of greater than or equal to 200 nm and less than or equal to 1000 nm, containing oxygen at 0.1 atomic % to 10 atomic %, and having a composition ratio of nitrogen to silicon of greater than or equal to 1.3 and less than or equal to 1.5.

10. The method for manufacturing a semiconductor device according to claim 6, wherein the semiconductor film is an amorphous silicon film.

* * * * *

UNITED STATES PATENT AND TRADEMARK OFFICE
CERTIFICATE OF CORRECTION

PATENT NO. : 7,935,584 B2
APPLICATION NO. : 11/892939
DATED : May 3, 2011
INVENTOR(S) : Tomoaki Moriwaka et al.

It is certified that error appears in the above-identified patent and that said Letters Patent is hereby corrected as shown below:

column 18, line 42, "TFT's" should read "TFTs"

column 21, line 64, "Flrpic" should read "FIrpic"

column 29, line 30 "337Q" should read "337G"

column 29, line 33, "337Q" should read "337G"

column 41, line 55, "+10°" should read "±10°"

Signed and Sealed this
Twenty-third Day of August, 2011

David J. Kappos
*Director of the United States Patent and Trademark Office*